(12) United States Patent
Ikeda et al.

(10) Patent No.: US 10,345,670 B2
(45) Date of Patent: Jul. 9, 2019

(54) DISPLAY DEVICE INCLUDING LIGHT-EMITTING ELEMENT AND LIGHT-CONDENSING MEANS

(71) Applicant: Semiconductor Energy Laboratory Co., Ltd., Atsugi-shi, Kanagawa-ken (JP)

(72) Inventors: Hisao Ikeda, Kanagawa (JP); Fumito Isaka, Kanagawa (JP); Shunpei Yamazaki, Tokyo (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 0 days.

(21) Appl. No.: 15/666,701

(22) Filed: Aug. 2, 2017

(65) Prior Publication Data
US 2018/0039117 A1 Feb. 8, 2018

(30) Foreign Application Priority Data
Aug. 5, 2016 (JP) ................. 2016-154189

(51) Int. Cl.
*G02F 1/1368* (2006.01)
*H01L 51/52* (2006.01)
(Continued)

(52) U.S. Cl.
CPC .......... *G02F 1/1368* (2013.01); *G02F 1/1333* (2013.01); *G02F 1/133345* (2013.01);
(Continued)

(58) Field of Classification Search
CPC ............ G02F 1/1368; G02F 1/133345; G02F 2201/44; G02F 2227/323; H01L 27/3267;
(Continued)

(56) References Cited

U.S. PATENT DOCUMENTS 6,858,983 B2 2/2005 Mochizuki et al.
7,061,555 B2 6/2006 Wu et al.
(Continued)

FOREIGN PATENT DOCUMENTS

JP 2007-096055 A 4/2007
JP 2007-123861 A 5/2007

*Primary Examiner* — Tracie Y Green
(74) *Attorney, Agent, or Firm* — Fish & Richardson P.C.

(57) ABSTRACT

To display a high-quality video regardless of a usage environment. To provide a display device which is lightweight and less likely to be broken. To reduce power consumption of the display device. The display device includes a first display element, a first transistor connected to the first display element, a second display element, and a second transistor connected to the second display element. The first display element is a reflective display element. The first display element and the first transistor are bonded to the second display element and the second transistor with an adhesive layer. Light from the second display element is extracted to the display surface on the first display element side. The light is condensed or guided by a light-condensing means or a light-guiding means provided in a path of the light from the second display element to the display surface.

9 Claims, 25 Drawing Sheets

(51) Int. Cl.

| | |
|---|---|
| *H01L 27/32* | (2006.01) |
| *G02F 1/1333* | (2006.01) |
| *H01L 29/786* | (2006.01) |
| *G02F 1/1335* | (2006.01) |
| *H01L 27/12* | (2006.01) |
| *H01L 29/66* | (2006.01) |

(52) U.S. Cl.
CPC ...... *G02F 1/133526* (2013.01); *H01L 27/322* (2013.01); *H01L 27/3232* (2013.01); *H01L 27/3248* (2013.01); *H01L 27/3251* (2013.01); *H01L 27/3262* (2013.01); *H01L 27/3267* (2013.01); *H01L 29/7869* (2013.01); *H01L 51/5271* (2013.01); *H01L 51/5275* (2013.01); *G02F 1/133305* (2013.01); *G02F 1/133528* (2013.01); *G02F 2001/133541* (2013.01); *G02F 2001/133567* (2013.01); *G02F 2001/133616* (2013.01); *G02F 2001/133618* (2013.01); *G02F 2201/44* (2013.01); *G02F 2202/28* (2013.01); *G02F 2203/02* (2013.01); *H01L 27/1225* (2013.01); *H01L 29/66969* (2013.01); *H01L 2227/323* (2013.01); *H01L 2227/326* (2013.01); *H01L 2251/301* (2013.01); *H01L 2251/303* (2013.01)

(58) Field of Classification Search
CPC ............. H01L 51/5271; H01L 27/3262; H01L 51/5275; H01L 29/7869; H01L 27/3251; H01L 27/3248; H01L 27/3232; H01L 27/322; H01L 2227/323
See application file for complete search history.

(56) References Cited

U.S. PATENT DOCUMENTS

| | | | |
|---|---|---|---|
| 7,956,363 | B2 | 6/2011 | Hoshino et al. |
| 2001/0020991 | A1 | 9/2001 | Kubo et al. |
| 2002/0027627 | A1 | 3/2002 | Yamada et al. |
| 2007/0072439 | A1 | 3/2007 | Akimoto et al. |
| 2008/0094554 | A1 | 4/2008 | Sato et al. |
| 2011/0157252 | A1 | 6/2011 | Yamazaki et al. |
| 2011/0210332 | A1 | 9/2011 | Jintyou et al. |
| 2015/0194474 | A1* | 7/2015 | Choi ................... H01L 27/3232 349/69 |
| 2015/0316818 | A1 | 11/2015 | Jintyou et al. |
| 2015/0346550 | A1* | 12/2015 | Wang ................ G02F 1/133528 349/57 |

\* cited by examiner 213a 212 211 210 213b 221a

FIG. 17A
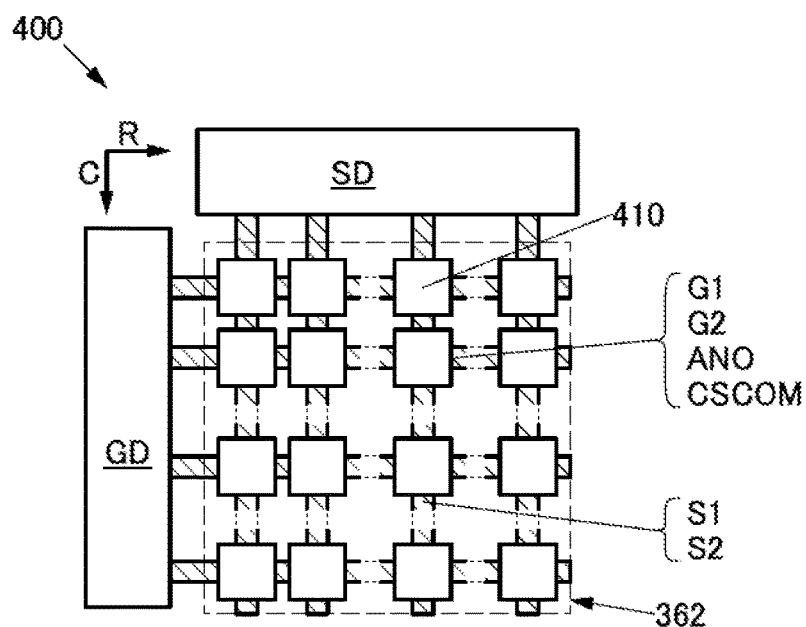
FIG. 17B1
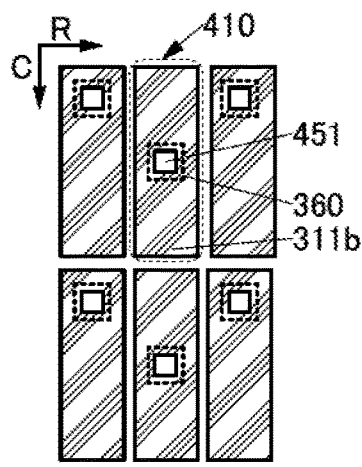
FIG. 17B2
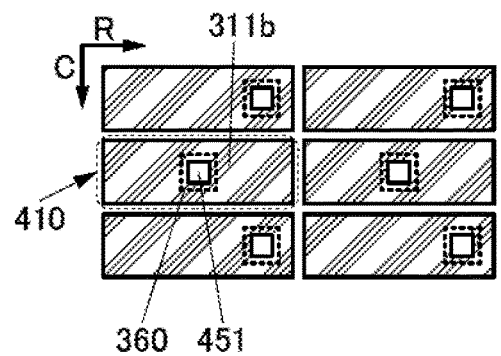

DISPLAY DEVICE INCLUDING LIGHT-EMITTING ELEMENT AND LIGHT-CONDENSING MEANS

BACKGROUND OF THE INVENTION

1. Field of the Invention

One embodiment of the present invention relates to a display device.

Note that one embodiment of the present invention is not limited to the above technical field. Examples of the technical field of one embodiment of the present invention disclosed in this specification and the like include a semiconductor device, a display device, a light-emitting device, a power storage device, a memory device, an electronic device, a lighting device, an input device, an input/output device, a method for driving any of them, and a method for manufacturing any of them.

Note that in this specification and the like, a semiconductor device generally means a device that can function by utilizing semiconductor characteristics. A transistor, a semiconductor circuit, an arithmetic device, a memory device, and the like are each an embodiment of the semiconductor device. In addition, an imaging device, an electro-optical device, a power generation device (e.g., a thin film solar cell and an organic thin film solar cell), and an electronic device may each include a semiconductor device.

2. Description of the Related Art

An example of a display device is a liquid crystal display device provided with a liquid crystal element. For example, an active matrix liquid crystal display device, in which pixel electrodes are arranged in a matrix and transistors are used as switching elements connected to respective pixel electrodes, has attracted attention.

For example, an active matrix liquid crystal display device including transistors, in which metal oxide is used for a channel formation region, as switching elements connected to respective pixel electrodes is already known (Patent Documents 1 and 2).

It is known that an active matrix liquid crystal display device is classified into two major types: transmissive type and reflective type.

In a transmissive liquid crystal display device, a backlight such as a cold cathode fluorescent lamp or a light-emitting diode (LED) is used, and optical modulation action of liquid crystal is utilized to select one of the two states in each pixel: a state where light from the backlight passes through liquid crystal to be output to the outside of the liquid crystal display device and a state where light is not output to the outside of the liquid crystal display device, whereby a bright or dark image is displayed. Furthermore, those images are combined to display an image.

In a reflective liquid crystal display device, a state in which external light, that is, incident light is reflected at a pixel electrode and output to the outside of the liquid crystal display device or a state in which incident light is not output to the outside of the liquid crystal display device is selected, in each pixel, using optical modulation action of liquid crystal, whereby bright and dark images are displayed. Furthermore, those images are combined to display an image. Compared to the transmissive liquid crystal display device, the reflective liquid crystal display device has the advantage of low power consumption since the backlight is not used.

REFERENCES

Patent Documents

[Patent Document 1] Japanese Published Patent Application No. 2007-123861
[Patent Document 2] Japanese Published Patent Application No. 2007-096055

SUMMARY OF THE INVENTION

Electronic devices that include a display device need to reduce the power consumption. In particular, a display device in electronic devices that use a battery as a power source, such as mobile phones, smartphones, tablet terminals, smart watches, or laptop personal computers, accounts for a large percentage of power consumption; thus, the display device is required to reduce the power consumption.

Portable electronic devices are required to have high visibility both in an environment where external light illuminance is high and in an environment where external light illuminance is low.

When a portable electronic device is dropped or put in a trouser pocket or the like, its display device might be cracked in some cases. For this reason, there is a demand for lightweight, non-breakable display devices for use in electronic devices.

An object of one embodiment of the present invention is to reduce power consumption of a display device and to increase display quality of the display device. Another object of one embodiment of the present invention is to reduce power consumption of a display device and display a high-quality video regardless of a usage environment. Another object of one embodiment of the present invention is to provide a lightweight and non-breakable display device. Another object of one embodiment of the present invention is to provide a flexible display device.

An object of one embodiment of the present invention is to provide a method for manufacturing a display device with high productivity.

One embodiment of the present invention is a display device including a first display element, a first transistor electrically connected to the first display element, a second display element, a second transistor electrically connected to the second display element, and a light-condensing means or a light-guiding means. The first display element is a reflective display element. The first display element and the first transistor are bonded to the second display element and the second transistor with an adhesive layer. The first transistor is positioned between the first display element and the adhesive layer, and the second display element is positioned between the second transistor and the adhesive layer. A display surface is positioned on the side of the first display element opposite to the side on which the first transistor is positioned. The second display element emits light to the display surface side through the adhesive layer and the first display element, and the first display element reflects light to the display surface side. The light from the second display element is condensed or guided between the adhesive layer and the first display element by the light-condensing means or the light-guiding means.

The light-condensing means or the light-guiding means includes a first insulating layer including a low refractive index material and a second insulating layer including a high refractive index material. Light from the light-emitting element is condensed by utilizing total reflection at a boundary between the first insulating layer and the second insulating layer.

According to another embodiment of the present invention, the light-condensing means or the light-guiding means includes a first insulating layer and a metal film. Light from the light-emitting element is condensed or guided by utilizing reflection on a metal film surface.

The first transistor and the second transistor each preferably include an oxide semiconductor in a channel.

According to one embodiment of the present invention, power consumption of a display device can be reduced and display quality of the display device can be improved owing to displaying a bright image. A display device that displays a high-quality video regardless of a usage environment can be provided. A lightweight and non-breakable display device can be provided. A flexible display device can be provided. A method for manufacturing a display element with high productivity can be provided.

BRIEF DESCRIPTION OF THE DRAWINGS

FIGS. 17A, 17B1, and 17B2 illustrate structure examples of a display device of Embodiment.

DETAILED DESCRIPTION OF THE INVENTION

Figure 1A:
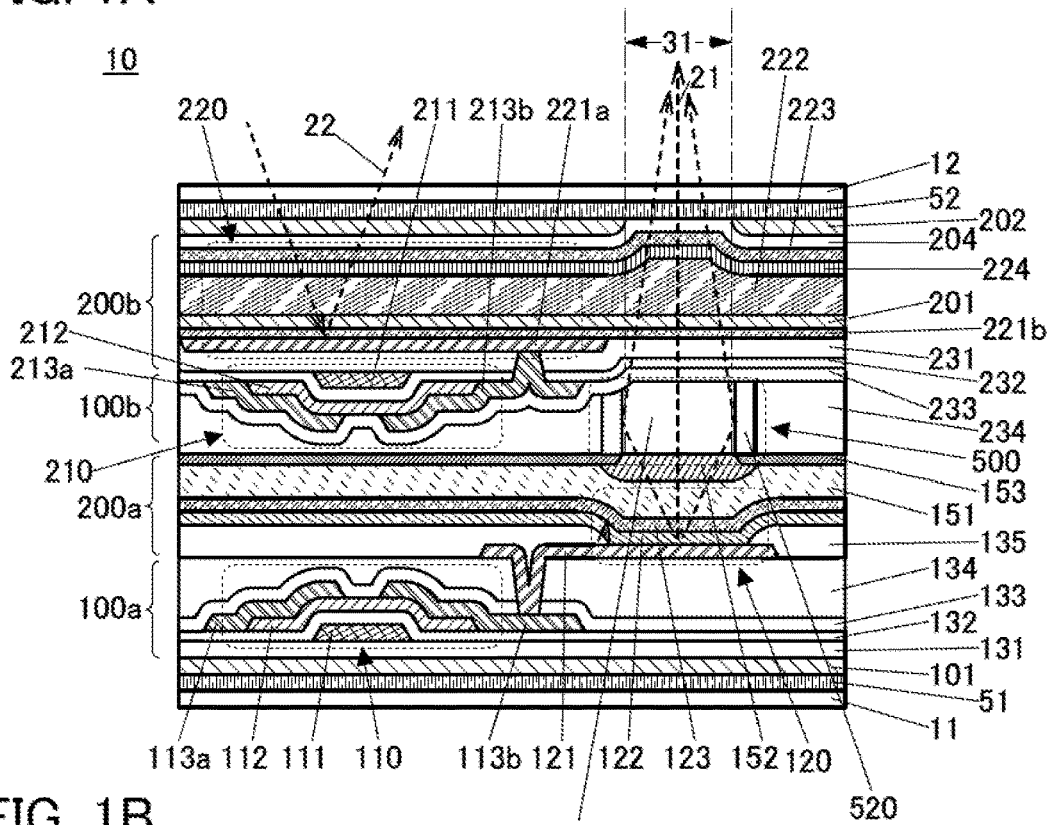
FIGS. 1A and 1B illustrate structural examples of a display device of Embodiment.

Embodiments will be described in detail with reference to the drawings. Note that the present invention is not limited to the following description, and it will be easily understood by those skilled in the art that various changes and modifications can be made without departing from the spirit and scope of the present invention. Therefore, the present invention should not be construed as being limited to the description in the following embodiments.

Note that in the structures of the invention described below, the same portions or portions having similar functions are denoted by the same reference numerals in different drawings, and description of such portions is not repeated. Furthermore, the same hatch pattern is used for portions having similar functions, and the portions are not especially denoted by reference numerals in some cases.

Note that in each drawing described in this specification, the size, the layer thickness, or the region of each component is exaggerated for clarity in some cases. Therefore, embodiments of the present invention are not limited to such a scale.

Note that ordinal numbers such as "first" and "second" in this specification and the like are used in order to avoid confusion among components, and the terms do not limit the components numerically.

A transistor is a kind of semiconductor elements and can achieve amplification of current or voltage, switching operation for controlling conduction or non-conduction, or the like. A transistor in this specification includes, in its category, an insulated-gate field-effect transistor (IGFET) and a thin film transistor (TFT).

Embodiment 1

In this embodiment, a display device of one embodiment of the present invention and a manufacturing method thereof will be described.

A display device of one embodiment of the present invention has a structure where light-emitting elements and reflective liquid crystal elements are stacked. The reflective liquid crystal elements can produce gray levels by controlling the amount of reflected light. The light-emitting elements can produce gray levels by controlling the amount of light emission.

A microelectromechanical systems (MEMS) shutter element, an optical interference type MEMS element, a display element to which a microcapsule method, an electrophoretic method, an electrowetting method, an Electronic Liquid Powder (registered trademark) method, or the like is applied, or the like can be used as a reflective display element other than a liquid crystal element. As a light-emitting display element, a self-luminous light-emitting element such as an organic light-emitting diode (OLED), a light-emitting diode (LED), or a quantum-dot light-emitting diode (QLED) can be used.

The display device can perform display by using only reflected light, display by using only light emitted from the light-emitting elements, and display by using both reflected light and light emitted from the light-emitting elements, for example.

In the display device, the reflective liquid crystal element is provided on the viewing side (display surface side) and the light-emitting element is provided on the side opposite to the viewing side. The light-emitting element can emit light to the viewing side through a region not overlapping with a reflective electrode in the liquid crystal element (e.g., an opening in the reflective electrode).

As the display device, an active-matrix display device in which a light-emitting element and a reflective liquid crystal element are each electrically connected to a transistor can be used.

The display device includes a first element layer including a first transistor electrically connected to the light-emitting element; a second element layer including the light-emitting element; a third element layer including a second transistor electrically connected to the liquid crystal element; and a fourth element layer including the liquid crystal element. In the display device, the first element layer, the second element layer, the third element layer, and the fourth element layer are stacked in this order from the side opposite to the viewing side.

Here, resin layers (a first resin layer and a second resin layer) are preferably provided on the viewing side of the fourth element layer and the side opposite to the viewing side of the first element layer, respectively. Thus, the display device can be extremely lightweight and less likely to be broken.

The first resin layer and the second resin layer (hereinafter also collectively referred to as a resin layer) have a feature of being extremely thin. Specifically, it is preferable that each of the resin layers have a thickness of 0.1 µm or more and 3 µm or less. Thus, even a structure where two display panels are stacked can have a small thickness. Furthermore, light absorption due to the resin layer positioned in the path of light emitted from the light-emitting element can be reduced, so that light can be extracted with higher efficiency and the power consumption can be reduced.

The resin layer can be formed in the following manner, for example. A thermosetting resin material with a low viscosity is applied to a support substrate and cured by heat treatment to form the resin layer. Then, the element layers are formed over the resin layer. Then, the resin layer and the support substrate are separated from each other, whereby one surface of the resin layer is exposed.

As a method of reducing adhesion between the support substrate and the resin layer to separate the support substrate and the resin layer from each other, laser light irradiation is given. For example, it is preferable to perform the irradiation by scanning using linear laser light. By the method, the process time of the case of using a large support substrate can be shortened. As the laser light, excimer laser light with a wavelength of 308 nm can be suitably used.

A thermosetting polyimide is a typical example of a material that can be used for the resin layer. It is particularly preferable to use a photosensitive polyimide. A photosensitive polyimide is a material that is suitably used for formation of a planarization film or the like of the display panel, and therefore, the formation apparatus and the material can be shared. Thus, there is no need to prepare another apparatus and another material to obtain the structure of one embodiment of the present invention.

Furthermore, the resin layer that is formed using a photosensitive resin material can be processed by light exposure and development treatment. For example, an opening can be formed and an unnecessary portion can be removed. Moreover, by optimizing a light exposure method or light exposure conditions, an uneven shape can be formed in a surface of the resin layer. For example, an exposure technique using a half-tone mask or a gray-tone mask or a multiple exposure technique may be used.

Note that a non-photosensitive resin material may be used. In that case, a method of forming an opening or an uneven shape using a resist mask or a hard mask that is formed over the resin layer can be used.

In this case, part of the resin layer that is positioned in the path of light emitted from the light-emitting element is preferably removed. That is, an opening overlapping with the light-emitting element is provided in the first resin layer. Thus, a reduction in color reproducibility and light extraction efficiency that is caused by absorption of part of light emitted from the light-emitting element by the resin layer can be inhibited.

A light-condensing means or a light-guiding means is provided between the light-emitting element in the second element layer and the liquid crystal element in the fourth element layer and in the path of light from the light-emitting element. By the light-condensing means or the light-guiding means, light from the light-emitting element can be efficiently condensed or guided, so that a large amount of light can be extracted from a finite light-transmitting region in the display device.

Figure 1B:
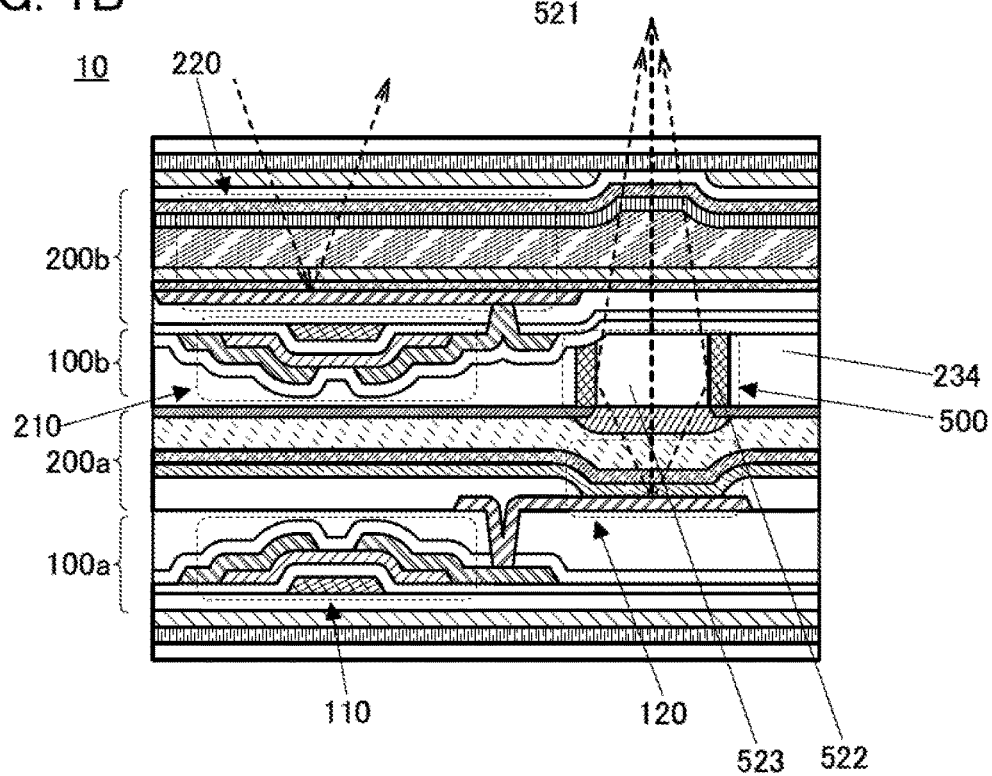

As in the display devices illustrated in FIGS. 1A and 1B in the present invention, when a surface (display surface) of the display device through which light from the light-emitting element 120 is extracted is apart from the light-emitting element 120 that is a light-emitting source, the light from the light-emitting element 120 might be trapped and absorbed by layers therebetween. Specifically, the light from the light-emitting element 120 is trapped between a light-emitting element in a second element layer 200a and a liquid crystal element in a fourth element layer 200b. Thus, the amount of the light from the light-emitting element 120 which is extracted through the display surface of the display device is reduced. However, light which is conventionally trapped and absorbed can be collected by the light-condensing means 500 (also referred to as a light-guiding means 500), and the light from the light-emitting element 120 can be guided to and extracted from the finite light-transmitting region in the display device.

The resin layer may be provided with a depressed portion so that a portion of the resin layer that is positioned in the path of light emitted from the light-emitting element is thinner than the other portion. That is, the resin layer may have a structure where two portions with different thicknesses are included and the portion with a smaller thickness overlaps with the light-emitting element. Even with such a structure, absorption of light from the light-emitting element by the resin layer can also be reduced.

In particular, an opening overlapping with the light-emitting element is preferably provided in the resin layer on the viewing side of the fourth element layer. Thus, color reproducibility and light extraction efficiency can be further increased. Furthermore, it is preferable that part of the resin layer in the path of light from the reflective liquid crystal element be removed and an opening overlapping with the reflective liquid crystal element be provided. This can increase the reflectivity of the reflective liquid crystal element. Coloring light reflected by the reflective liquid crystal element owing to passing through the resin layer can be prevented.

As a method for forming an opening in the resin layer, the following method can be used, for example. That is, a thin part is formed in a portion where the opening of the resin layer is to be formed, and the support substrate and the resin layer are separated from each other by the above-described method. Then, plasma treatment or the like is performed on a separated surface of the resin layer to reduce the thickness of the resin layer, whereby the opening can be formed in the thin part of the resin layer.

As another example, the following method can be used. That is, a light absorption layer is formed over the support substrate, the resin layer having the opening is formed over the light absorption layer, and a light-transmitting layer covering the opening is formed. The light absorption layer is a layer that emits a gas such as hydrogen or oxygen by absorbing light and being heated. By performing light irradiation from the support substrate side to make the light absorption layer emit a gas, adhesion at the interface between the light absorption layer and the support substrate or between the light absorption layer and the light-transmitting layer can be reduced to cause separation, or the light absorption layer itself can be broken to cause separation.

It is preferable that the first transistor and the second transistor each include an oxide semiconductor as a semiconductor where a channel is formed. An oxide semiconductor can achieve high on-state current and high reliability even when the highest temperature in the manufacturing process of the transistor is reduced (e.g., 400° C. or lower, preferably 350° C. or lower). Furthermore, in the case of using an oxide semiconductor, high heat resistance is not required for a material of the resin layer positioned on the surface side on which the transistor is formed; thus, the material of the resin layer can be selected from a wider range of alternatives. For example, the material can be the same as a resin material of the planarization film.

In the case of using an oxide semiconductor, a special material having high heat resistance is not required for the resin layer, and the resin layer is not necessarily formed thick. Thus, the proportion of the cost of the resin layer in the cost of the whole display panel can be reduced.

An oxide semiconductor has a wide band gap (e.g., 2.5 eV or more, or 3.0 eV or more) and transmits light. Thus, even when an oxide semiconductor is irradiated with laser light in a step of separating the support substrate and the resin layer, the laser light is hardly absorbed, so that the electrical characteristics can be less affected. Therefore, the resin layer can be thin as described above.

In one embodiment of the present invention, a display device excellent in productivity can be obtained by using both a resin layer that is formed thin using a photosensitive resin material with a low viscosity typified by a photosensitive polyimide and an oxide semiconductor with which a transistor having excellent electrical characteristics can be obtained even at a low temperature.

Needless to say, as the semiconductors where the channels of the first and second transistors are formed, a semiconductor such as polysilicon, amorphous silicon, single crystal silicon, or an organic semiconductor may be used other than an oxide semiconductor.

Oxide semiconductors (also simply referred to as OS) are classified as a metal oxide in this specification and the like. A metal oxide refers to an oxide of metal in a broad sense. Metal oxides are classified into an oxide insulator, an oxide conductor (including a transparent oxide conductor), an oxide semiconductor, and the like. That is to say, a metal oxide that has at least one of an amplifying function, a rectifying function, and a switching function can be called a metal oxide semiconductor, or OS for short. In addition, an OS FET is a transistor including a metal oxide or an oxide semiconductor.

An oxide semiconductor may have a c-axis aligned crystal (CAAC) structure. A CAAC-OS film is subjected to structural analysis with an X-ray diffraction (XRD) apparatus. For example, when the CAAC-OS film including an InGaZnO$_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film.

In the CAAC-OS film having c-axis alignment, while the directions of a-axes and b-axes are irregularly oriented between crystal parts, the c-axes are aligned in a direction parallel to a normal vector of a formation surface or a normal vector of a top surface. Thus, in a cross-sectional TEM image of the CAAC-OS film, each metal atom layer arranged in a layered manner corresponds to a plane parallel to the a-b plane of the crystal.

The oxide semiconductor may have a function or material composition of a cloud-aligned composite (CAC). A CAC-OS or a CAC metal oxide has a conducting function in a part of the material and has an insulating function in another part of the material; as a whole, the CAC-OS or the CAC metal oxide has a function of a semiconductor. In the case where the CAC-OS or the CAC metal oxide is used in a semiconductor layer of a transistor, the conducting function is to allow electrons (or holes) serving as carriers to flow, and the insulating function is to not allow electrons serving as carriers to flow. By the complementary action of the conducting function and the insulating function, the CAC-OS or the CAC metal oxide can have a switching function (on/off function). In the CAC-OS or the CAC metal oxide, separation of the functions can maximize each function.

In this specification and the like, the CAC-OS or the CAC metal oxide includes conductive regions having the above conducting function and insulating regions having the above insulating function. In the CAC-OS or the CAC metal oxide, the conductive regions and the insulating regions each have a size greater than or equal to 0.5 nm and less than or equal to 10 nm, preferably greater than or equal to 0.5 nm and less than or equal to 3 nm and are dispersed in the oxide semiconductor material, in some cases. In some cases, the conductive regions and the insulating regions in the material are separated at the nanoparticle level. In some cases, the conductive regions and the insulating regions are unevenly distributed in the material. The conductive regions are observed to be coupled in a cloud-like manner with their boundaries blurred, in some cases.

In other words, the CAC-OS or the CAC metal oxide can be called a matrix composite or a metal matrix composite.

Next, a pixel structure is described. The display device can include first pixels each including a light-emitting element and a first transistor and second pixels each including a liquid crystal element and a second transistor. The first pixels and the second pixels are arranged in a matrix to form a display portion. In addition, the display device preferably includes a first driver portion for driving the first pixels and a second driver portion for driving the second pixels.

The first pixels and the second pixels are preferably arranged in a display region with the same pitch. Furthermore, the first pixels and the second pixels are preferably mixed in the display region of the display device. Accordingly, as described later, an image displayed by a plurality of first pixels, an image displayed by a plurality of second pixels, and an image displayed by both the plurality of first pixels and the plurality of second pixels can be displayed in the same display region.

The first pixel is preferably formed of one pixel that emits white (W) light, for example. The second pixel preferably includes subpixels that emit light of three colors of red (R), green (G), and blue (B), for example. In addition, a subpixel that emits white (W) light or yellow (Y) light may be included. By arranging such first pixels and second pixels with the same pitch, the area of the first pixels can be increased and the aperture ratio of the first pixels can be increased.

Note that the first pixel may include subpixels that emit light of three colors of red (R), green (G), and blue (B), and may further include a subpixel that emits white (W) light or yellow (Y) light.

In one embodiment of the present invention, switching between a first mode in which an image is displayed by the first pixels, a second mode in which an image is displayed by the second pixels, and a third mode in which an image is displayed by the first pixels and the second pixels can be performed.

Since display can be performed using only reflected light in the first mode, a light source is unnecessary. Thus, the first mode is a driving mode with extremely low power consumption. The first mode is effective in the case where, for example, external light has sufficiently high illuminance and is white light or light near white light. The first mode is a display mode suitable for displaying text information of a book or a document, for example.

Since display can be performed using light from the light source in the second mode, an extremely vivid image with extremely high color reproducibility can be displayed regardless of the illuminance and chromaticity of external light. For example, the second mode is effective in the case where the illuminance of external light is extremely low, such as during the nighttime or in a dark room. When a bright image is displayed under weak external light, a user may feel that the image is too bright. To prevent this, an image with reduced luminance is preferably displayed in the second mode. In that case, not only a reduction in brightness but also low power consumption can be achieved. The second mode is a mode suitable for displaying a vivid image and a smooth moving image, for example.

In the third mode, display can be performed using both light from the light source and reflected light. Specifically, the display device is driven so that light from the first pixel and light from the second pixel adjacent to the first pixel are mixed to express one color. A vivider image with higher color reproducibility than that in the first mode can be displayed and power consumption can be lower than that in the second mode. For example, the third mode is effective when the illuminance of external light is relatively low, such as under indoor illumination or in the morning or evening, or when the external light does not represent a white chromaticity.

Next, transistors that can be used in the display device are described. The first transistor and the second transistor have either the same structure or different structures.

As a structure of the transistor, a bottom-gate structure is given, for example. A transistor having a bottom-gate structure includes a gate electrode below a semiconductor layer (on the formation surface side). A source electrode and a drain electrode are provided in contact with a top surface and a side end portion of the semiconductor layer, for example.

As another structure of the transistor, a top-gate structure is given, for example. A transistor having a top-gate structure includes a gate electrode above a semiconductor layer (on the side opposite to the formation surface side). A first source electrode and a first drain electrode are provided over an insulating layer covering part of a top surface and a side end portion of the semiconductor layer and are electrically connected to the semiconductor layer through openings provided in the insulating layer, for example.

The transistor preferably includes a first gate electrode and a second gate electrode that face each other with the semiconductor layer provided therebetween.

Here, the reflective electrode in the reflective liquid crystal element also functions as a pixel electrode and is electrically connected to the second transistor. The reflective electrode has a uniformly flat surface on the viewing side. Furthermore, the reflective electrode is electrically connected to one of a source and a drain of the second transistor on a rear surface side (the side opposite to the viewing side) of the flat portion of the reflective electrode. Thus, a depressed portion is not formed on a surface on the viewing side of the reflective electrode, so that the aperture ratio of the display portion can be increased.

An insulating layer is provided to cover the reflective electrode, and the second transistor is provided on a surface of the insulating layer opposite to a surface over which the reflective electrode is formed. That is, the reflective electrode is provided on the rear surface side (formation surface side) of the second transistor with the insulating layer located therebetween. The one of the source and the drain of the second transistor is electrically connected to the reflective electrode through an opening in the insulating layer.

A third resin layer is preferably provided on the viewing side of the reflective electrode. Such a structure can be formed in such a manner that the reflective electrode and the second transistor are formed over the third resin layer that is formed over the support substrate and separation is caused at an interface between the support substrate and the third resin layer. In that case, since the third resin layer is located between the reflective electrode and the liquid crystal, the third resin layer is preferably used as an alignment film.

As the light-emitting element, a top-emission light-emitting element which emits light to the side opposite to the formation surface side can be suitably used. The first transistor and the light-emitting element are stacked in this order from the side opposite to the viewing side.

The display device of one embodiment of the present invention has a structure in which the first transistor and the second transistor are provided to face each other in the vertical direction. In other words, it can be expressed that the direction in which a plurality of films included in the first transistor are stacked and the direction in which a plurality of films included in the second transistor are stacked are opposite.

A more specific example of the display device of one embodiment of the present invention is described below with reference to drawings.

Note that the expressions indicating directions such as "over" and "under" are basically used to correspond to the directions of drawings. However, in some cases, the direction indicating "over" or "under" in the specification does not correspond to the direction in the drawings for the purpose of simplicity or the like. For example, when a stacked order (formation order) of a stacked body or the like is described, even in the case where a surface on which the stacked body is provided (e.g., a formation surface, a support surface, an attachment surface, or a planarization surface) is positioned above the stacked body in the drawings, the direction and the opposite direction are referred to as "under" and "over", respectively, in some cases.

Structure Example 1

FIG. 1A is a schematic cross-sectional view of a display device 10. The display device 10 includes an element layer 100a, the element layer 200a, an element layer 100b, and the element layer 200b which are stacked in this order. The display device 10 includes a substrate 11 on the rear side (the side opposite to the viewing side) and a substrate 12 on the front side (the viewing side). A resin layer 101 is provided between the substrate 11 and the element layer 100a, and a resin layer 202 is provided between the substrate 12 and the element layer 200b. The resin layer 101 and the substrate 11 are bonded to each other with an adhesive layer 51. The resin layer 202 and the substrate 12 are bonded to each other with an adhesive layer 52.

The element layer 100a includes a transistor 110 over the resin layer 101. The element layer 200a includes the light-emitting element 120 electrically connected to the transistor 110. The element layer 100b includes a transistor 210. The element layer 200b includes a liquid crystal element 220 electrically connected to the transistor 210.

An opening is provided in the resin layer 202. A region 31 in FIG. 1A is a region overlapping with the light-emitting element 120 and is also a region overlapping with the opening in the resin layer 202. In addition, the region 31 is a region overlapping with an opening in a light-blocking layer 153.

The element layer 100b includes the light-condensing means 500. With the light-condensing means 500, light from the light-emitting element 120 can be efficiently extracted through a display surface. The light-condensing means 500 in FIG. 1A utilizes total reflection at a boundary surface between a low refractive index material and a high refractive index material. Specifically, the light-condensing means 500 includes an insulating layer 521 using a high refractive index material having a light-transmitting property and an insulating layer 520 using a low refractive index material having a light-transmitting property. In the case where incident light enters at an angle larger than or equal to the critical angle at the boundary surface between the insulating layer 521 and the insulating layer 520, total reflection occurs at the boundary surface. Therefore, light absorbed and trapped by the insulating layer 234 in a structure without a light-condensing means can be condensed and guided to the display surface by providing the light-condensing means 500.

For the insulating layer 521 using a high refractive index material having a light-transmitting property, SiC, $TiO_2$, ZnS, $CeO_2$, indium tin oxide, polycarbonate, or a polyester resin can be used, for example. For the insulating layer 520 using a low refractive index material having a light-transmitting property, silicon oxide, $CaF_2$, $MgF_2$, acrylic, or a fluorine resin can be used, for example.

Reflection of light by a metal film 522 may be used as another mode of the light-condensing means 500, which is illustrated in FIG. 1B. Specifically, the light-condensing means 500 is formed in the following manner: an opening is provided in the insulating layer 234; and the metal film 522 is provided in the opening so that light from the light-emitting element 120 is reflected by the metal film 522. With such a structure, light conventionally absorbed by the insulating layer 234 can be reflected by the metal film 522 and can be condensed and guided to the display surface.

Note that a surface of the metal film 522 may be covered with a light-transmitting insulating layer or a light-transmitting semiconductor film in order to improve reflectance of the metal film 522. The surface of the metal film 522 covered with the insulating layer or the semiconductor film corresponds to a surface from which light from the light-emitting element 120 is reflected.

The metal film 522 is preferably formed using a highly reflective material. For the metal film 522, aluminum, silver, an alloy containing any of these metal materials, or the like can be used. Furthermore, a metal material such as gold, platinum, nickel, tungsten, chromium, molybdenum, iron, cobalt, copper, or palladium or an alloy containing any of these metal materials can be used. Furthermore, lanthanum, neodymium, germanium, or the like may be added to the metal material or the alloy. Furthermore, an alloy containing aluminum (an aluminum alloy) such as an alloy of aluminum and titanium, an alloy of aluminum and nickel, an alloy of aluminum and neodymium, or an alloy of aluminum, nickel, and lanthanum (Al—Ni—La); or an alloy containing silver such as an alloy of silver and copper, an alloy of silver, palladium, and copper (also referred to as Ag—Pd—Cu or APC), or an alloy of silver and magnesium may be used. An alloy containing silver and copper is preferable because of its high heat resistance. Furthermore, when a metal film or a metal oxide film is stacked in contact with an aluminum film or an aluminum alloy film, oxidation can be suppressed. Examples of a material for the metal film or the metal oxide film include titanium and titanium oxide.

The structure illustrated in FIG. 1B is the same as that illustrated in FIG. 1A except for the structure of the light-condensing means 500.

Although not illustrated, the area of a top surface of the light-condensing means 500 in FIG. 1A may be substantially the same as or larger than the area of the opening in the light-blocking layer 153. Specifically, the area of a surface of the insulating layer 521, which is in contact with the coloring layer 152, may be substantially the same as or larger than the area of the opening in the light-blocking layer 153. Thus, light emitted from the light-emitting element 120 and transmitted through the opening in the light-blocking layer 153 can be efficiently condensed by the light-condensing means 500 and extracted to the viewing side of the display device.

The above description of FIG. 1A can be applied to FIG. 1B. The area of a surface of an insulator 523, which is in contact with the coloring layer 152, may be substantially the same as or larger than the area of the opening in the light-blocking layer 153. Thus, light emitted from the light-emitting element 120 can be condensed and guided efficiently and extracted to the viewing side of the display device.

Figure 2A:
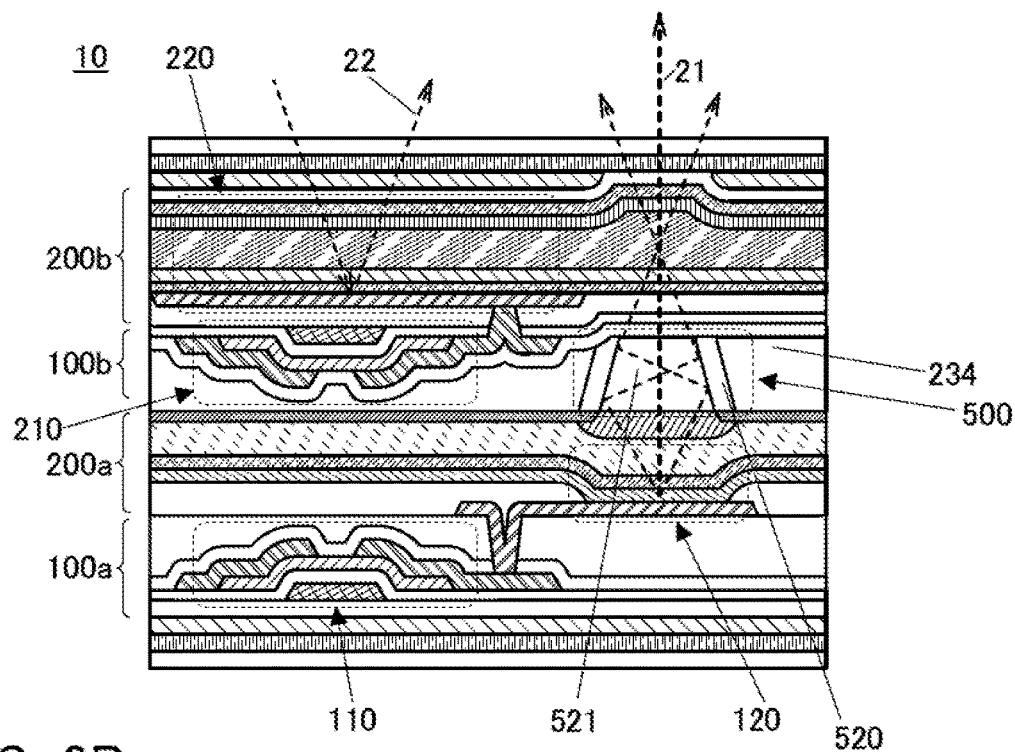
FIGS. 2A and 2B illustrate structure examples of a display device of Embodiment.
Figure 2B:
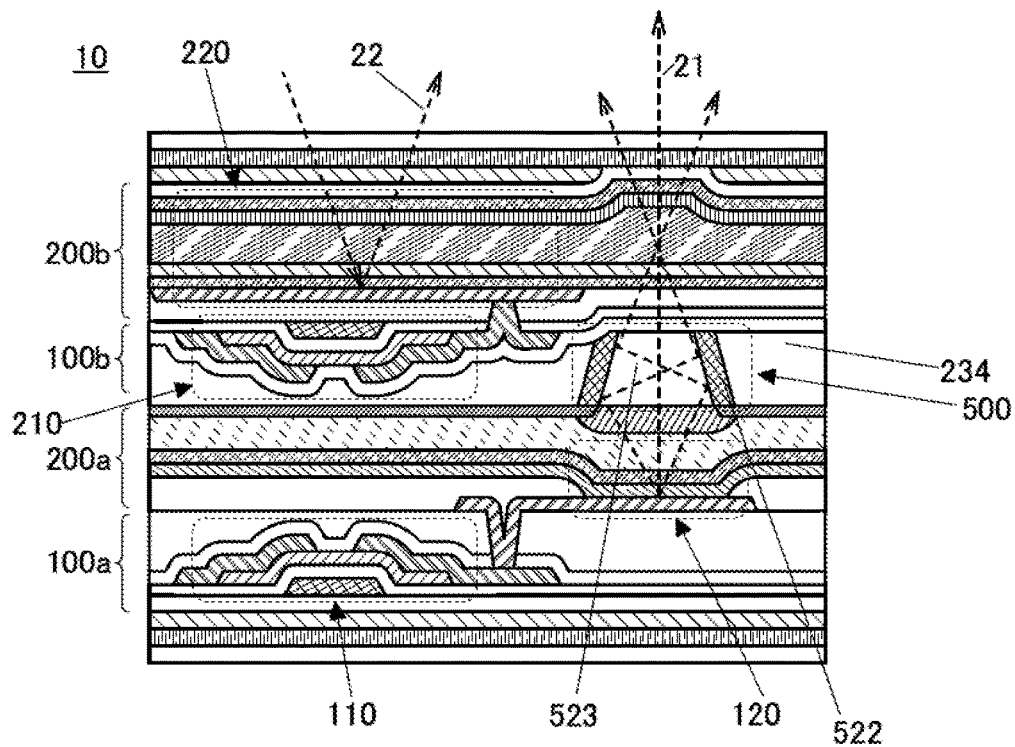

FIGS. 2A and 2B illustrate a light-condensing means having another structure. In FIGS. 2A and 2B, the cross section of the light-condensing means 500 has a tapered shape which gradually becomes narrower from the light-emitting element 120 toward the display surface. In FIG. 2A, the insulating layer 521 has a tapered shape which gradually becomes narrower from the light-emitting element 120 toward the display surface, and the insulating layer 520 covers a side surface of the insulating layer 521. In FIG. 2B, the insulator 523 of the light-condensing means 500 has a tapered shape which gradually becomes narrower from the light-emitting element 120 toward the display surface, and the metal film 522 covers a side surface of the insulator 523. Light is normally diffused in all directions. When the light-condensing means 500 has a tapered shape, a larger amount of light can be extracted to the viewing side of the display device.

Figure 16A:
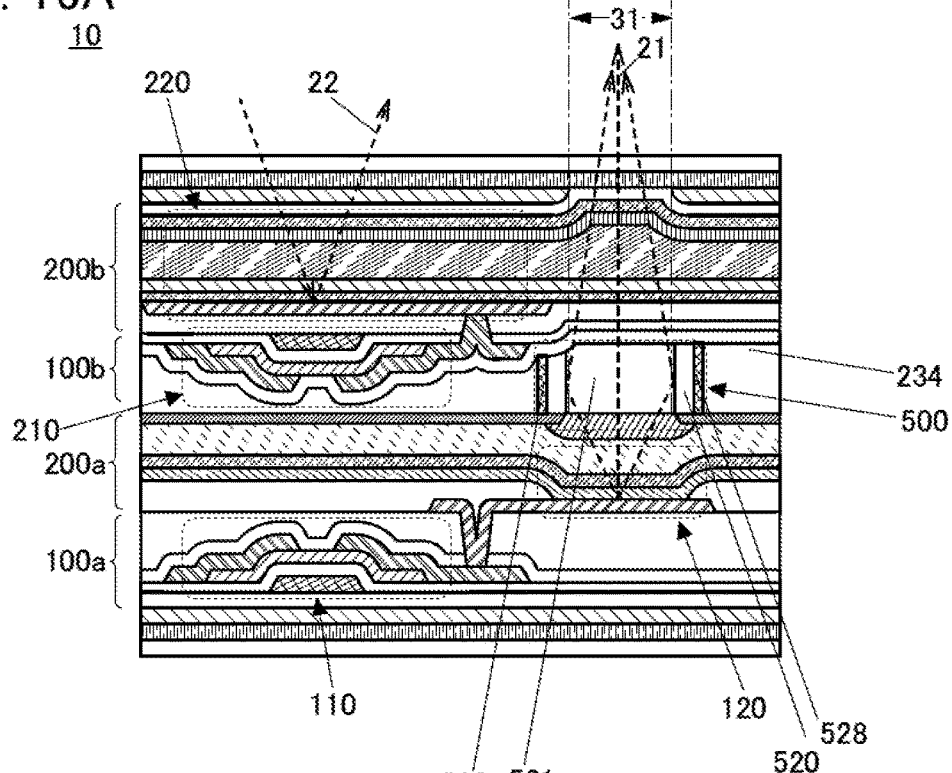
FIGS. 16A and 16B illustrate structure examples of a display device of Embodiment.
Figure 16B:
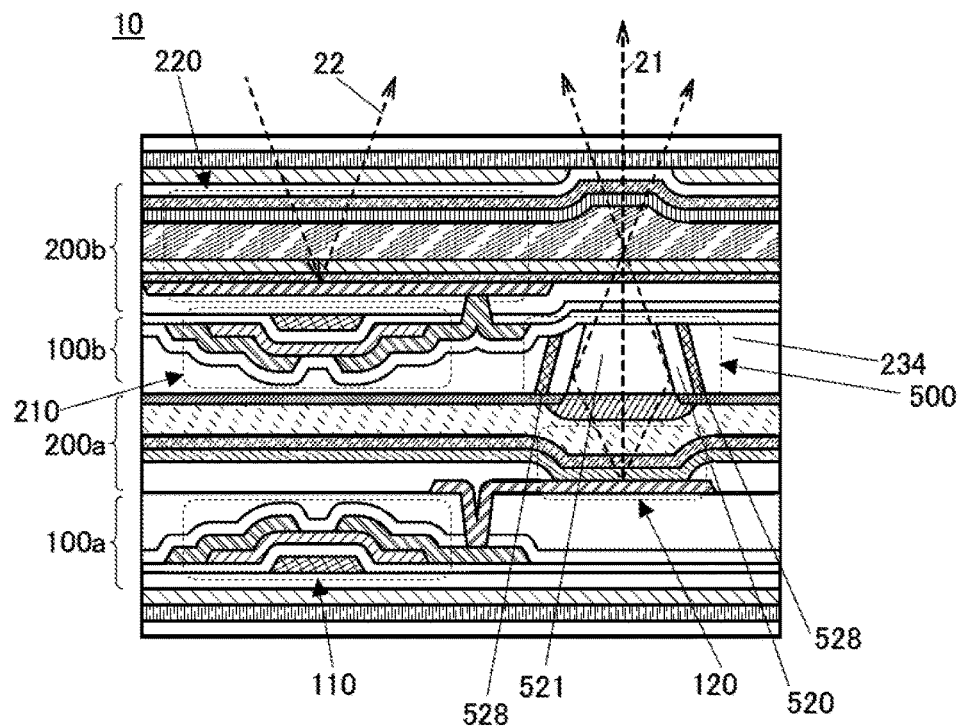

FIGS. 16A and 16B illustrate light-condensing means having other structures. The light-condensing means 500 in FIGS. 16A and 16B each include the insulating layer 521 using a high refractive index material, the insulating layer 520 using a low refractive index material, and a metal film 528 covering an outer surface of the insulating layer 520. The metal film 528 can be formed using the same material as the metal film 522 in FIG. 1B.

In the light-condensing means in FIG. 1A which utilizes total reflection, total reflection occurs in the case where the incident angle of incident light to the boundary surface between the insulating layer 520 and the insulating layer 521 is larger than or equal to the critical angle. However, in the case where the incident angle of incident light is smaller than the critical angle, the light enters the insulating layer 520 without reflection at the boundary surface. Meanwhile, the metal film has high light reflectance with respect to incident light. The light-condensing means having the structure in FIG. 16A can condense more light to the display surface because even light incident on the insulating layer 520 at an incident angle smaller than the critical angle is reflected by the metal film 528.

FIG. 16B illustrates a structure in which the light-condensing means 500 in FIG. 16A has a tapered shape. For advantageous effects of the tapered shape, those of the light-condensing means in FIGS. 2A and 2B can be referred to.

[Element Layer 100a and Element Layer 200a]

Over the resin layer 101, the transistor 110, the light-emitting element 120, an insulating layer 131, an insulating layer 132, an insulating layer 133, an insulating layer 134, an insulating layer 135, and the like are provided.

The transistor 110 includes a conductive layer 111 serving as a gate electrode, part of the insulating layer 132 serving as a gate insulating layer, a semiconductor layer 112, a conductive layer 113a serving as one of a source electrode and a drain electrode, and a conductive layer 113b serving as the other of the source electrode and the drain electrode.

The semiconductor layer 112 preferably includes an oxide semiconductor.

The insulating layer 133 and the insulating layer 134 cover the transistor 110. The insulating layer 134 serves as a planarization layer.

The light-emitting element 120 includes a conductive layer 121, an EL layer 122, and a conductive layer 123 that are stacked. The conductive layer 121 has a function of reflecting visible light, and the conductive layer 123 has a function of transmitting visible light. Therefore, the light-emitting element 120 is a light-emitting element having a top-emission structure which emits light to the side opposite to the formation surface side.

The conductive layer 121 is electrically connected to the conductive layer 113b through an opening provided in the insulating layer 134 and the insulating layer 133. The insulating layer 135 covers an end portion of the conductive layer 121 and is provided with an opening to expose part of a surface of the conductive layer 121. The EL layer 122 and the conductive layer 123 are provided in this order to cover the insulating layer 135 and the exposed portion of the conductive layer 121.

The light-emitting element 120 is sealed with an adhesive layer 151. Furthermore, the element layer 200a and the element layer 100b are bonded to each other with the adhesive layer 151.

Here, a stacked structure including the insulating layer 131, the insulating layer 132, the insulating layer 133, the insulating layer 134, and the transistor 110 is referred to as the element layer 100a. A stacked structure including the insulating layer 135 and the light-emitting element 120 is referred to as the element layer 200a. Note that the element layer 200a may include the coloring layer 152 and the light-blocking layer 153 which are described later.

[Element Layer 100b and Element Layer 200b]

An insulating layer 204, the liquid crystal element 220, a resin layer 201, the transistor 210, an insulating layer 231, an insulating layer 232, an insulating layer 233, the insulating layer 234, and the like are provided on the side opposite to the viewing side of the resin layer 202. The light-condensing means 500 is provided in the same layer as the insulating layer 234.

The liquid crystal element 220 includes a conductive layer 221a, a conductive layer 221b, a liquid crystal 222, and a conductive layer 223. The liquid crystal 222 is sandwiched between the conductive layer 221b and the conductive layer 223. The conductive layer 221a and the conductive layer 221b are provided in contact with each other and function as a pixel electrode. The conductive layer 221a has a function of reflecting visible light and functions as a reflective electrode. The conductive layer 221b has a function of transmitting visible light. Therefore, the liquid crystal element 220 is a reflective liquid crystal element.

The periphery of the liquid crystal 222 is sealed with an adhesive layer in a region which is not illustrated. An alignment film 224 is provided between the conductive layer 223 and the liquid crystal 222. The resin layer 201 is provided between the conductive layer 221b and the liquid crystal 222. The resin layer 201 functions as an alignment film.

The insulating layer 231 is provided to cover the conductive layer 221a. For the transistor 210, a surface of the insulating layer 231 that is opposite to the conductive layer 221a serves as a formation surface.

The transistor 210 includes a conductive layer 211 serving as a gate electrode, part of the insulating layer 232 serving as a gate insulating layer, a semiconductor layer 212, a conductive layer 213a serving as one of a source electrode and a drain electrode, and a conductive layer 213b serving as the other of the source electrode and the drain electrode.

The semiconductor layer 212 preferably includes an oxide semiconductor.

The insulating layer 233 and the insulating layer 234 are provided to cover the transistor 210. The insulating layer 234 serves as a planarization layer. The light-condensing means 500 is provided in part of the insulating layer 234. The light-condensing means 500 in FIG. 1A consists of the insulating layer 521 formed using a high refractive index material having a light-transmitting property and the insulating layer 520 formed using a low refractive index material having a light-transmitting property. In the light-condensing means 500 in FIG. 1B, an opening is provided in part of the insulating layer 234 and the metal film 522 is provided in the opening. The insulator 523 provided on an inner side of the metal film 522 and the insulating layer 234 may be formed using the same material or different materials.

The conductive layer 213b is electrically connected to the conductive layer 221a through an opening provided in the insulating layer 232 and the insulating layer 231. Since a surface of the conductive layer 221a that is on the viewing side is flat in a portion where the conductive layer 221a and the conductive layer 213b are connected to each other, the portion can also function as part of the liquid crystal element 220; thus, the aperture ratio can be increased.

The resin layer 201 functioning as an alignment film is provided to cover the conductive layer 221b. The resin layer 201 supports the conductive layer 221b and the like.

The conductive layer 223 and the alignment film 224 are stacked on the resin layer 201 side of the resin layer 202. The insulating layer 204 is provided between the resin layer 202 and the conductive layer 223. Note that a coloring layer for coloring light reflected by the liquid crystal element 220 may be provided between the conductive layer 223 and the substrate 12. A light-blocking layer for inhibiting mixture of colors between adjacent pixels may be provided.

The insulating layer 204 covers the opening of the resin layer 202. A portion of the insulating layer 204 that overlaps with the opening of the resin layer 202 is in contact with the adhesive layer 52.

The coloring layer 152 and the light-blocking layer 153 are provided on a surface of the insulating layer 234 which is on the substrate 11 side. The coloring layer 152 is provided to overlap with the light-emitting element 120. The light-blocking layer 153 includes an opening in a portion overlapping with the light-emitting element 120.

Here, a stacked structure including the insulating layer 231, the insulating layer 232, the insulating layer 233, the insulating layer 234, and the transistor 210 is referred to as the element layer 100b. A stacked structure including the conductive layer 221a, the conductive layer 221b, the resin layer 201, the liquid crystal 222, the alignment film 224, the conductive layer 223, and the insulating layer 204 is referred to as the element layer 200b.

[Display Device 10]

The display device 10 includes a portion where the light-emitting element 120 does not overlap with the conductive layer 221a serving as the reflective electrode of the liquid crystal element 220 when seen from above. Thus, light 21 that is colored by the coloring layer 152 is emitted from the light-emitting element 120 to the viewing side as shown in FIGS. 1A and 1B. Furthermore, reflected light 22 that is external light reflected by the conductive layer 221a is extracted from the liquid crystal element 220 through the liquid crystal 222.

The light 21 emitted from the light-emitting element 120 is emitted to the viewing side through the opening of the resin layer 202. Since the resin layer 202 is not provided in the path of the light 21, even in the case where the resin layer 202 absorbs part of visible light, high light extraction efficiency and high color reproducibility can be obtained.

Part of the light 21 emitted from the light-emitting element 120 is emitted to the viewing side through the light-condensing means 500. Therefore, light absorbed and trapped by the insulating layer 234 in a conventional structure in which a light-condensing means is not provided can be condensed to the viewing side with the structures illustrated in FIGS. 1A and 1B and FIGS. 2A and 2B.

The conductive layer 221b is also provided in a portion overlapping with the light-emitting element 120. Since the conductive layer 221b transmits visible light, the light 21 can pass through the conductive layer 221b even when the conductive layer 221b is positioned in the path of the light 21. When the conductive layer 221b is provided in a larger area than an area where the conductive layer 221a is provided, the liquid crystal 222 in a region outside the region where the conductive layer 221a is provided can also be aligned by application of an electric field. Therefore, the area of a region of the liquid crystal 222 where defective alignment occurs can be reduced, so that the aperture ratio can be increased. The conductive layer 221b preferably has a transmittance in the entire range of visible light (e.g., in the wavelength range of 400 nm to 750 nm) of 60% or more, further preferably 70% or more, still further preferably 80% or more.

The conductive layer 221b is provided to both ends in FIGS. 1A and 1B and the like; however, in practice, the conductive layer 221b is provided to have an island shape in each pixel and is electrically insulated from those in adjacent pixels.

The conductive layer 221b is not necessarily provided in the case where the aperture ratio is little influenced by defective alignment, e.g., the case where the distance between adjacent pixels is sufficiently long or the case where the conductive layer 221a has a sufficiently large area.

As illustrated in FIGS. 1A and 1B, in the element layers 100a and 200a, the conductive layer 121 serving as a reflective electrode of the light-emitting element 120 is positioned closer to the viewing side than the transistor 110 is. Therefore, the transistor 110 can be provided to overlap with the light-emitting element 120, which enables high integration and high aperture ratio of the pixels.

Similarly, in the element layers 100b and 200b, the conductive layer 221a serving as the reflective electrode of the liquid crystal element 220 is positioned on the viewing side of the transistor 210. Therefore, the transistor 210 can be provided to overlap with the liquid crystal element 220, which enables high integration and high aperture ratio of the pixels.

The display device 10 has a structure in which the transistor 210 and the transistor 110 are stacked to face each other. In other words, the transistor 210 and the transistor 110 are vertically inverted relative to each other.

The substrate 12 preferably serves as a polarizing plate or a circular polarizing plate. A polarizing plate or a circular polarizing plate may be located outward from the substrate 12.

In the above-described structure of the display device 10, a coloring layer is provided not to overlap with the liquid crystal element 220, but a coloring layer may be provided on the resin layer 202 side of the liquid crystal element 220.

As the substrate 11 and the substrate 12, a glass substrate or the like may be used, and a material containing a resin is preferably used. The use of a resin material reduces the weight of the display device 10 as compared with the case where glass or the like is used, even when the thickness is the same. A material which is thin enough to have flexibility (including a glass substrate and the like) is preferably used because the display device can be further reduced in weight. Furthermore, when a resin material is used, the display device can have higher impact resistance; thus, a non-breakable display device can be achieved.

Since the substrate 11 is located on the side opposite to the viewing side, the substrate 11 does not necessarily transmit visible light. Therefore, a metal material can also be used. A metal material, which has high thermal conductivity, can suppress a local temperature rise in the display device 10 because it can easily conduct heat to the whole substrate.

The above is the description of the structure example.

[Example of Manufacturing Method]

An example of a method of manufacturing the display devices 10 illustrated in FIGS. 1A and 1B is described below with reference to drawings.

Note that thin films included in the display device (e.g., insulating films, semiconductor films, or conductive films) can be formed by any of a sputtering method, a chemical vapor deposition (CVD) method, a vacuum evaporation method, a pulsed laser deposition (PLD) method, an atomic layer deposition (ALD) method, and the like. As the CVD method, a plasma-enhanced chemical vapor deposition (PECVD) method or a thermal CVD method may be used. As the thermal CVD method, for example, a metal organic chemical vapor deposition (MOCVD) method may be used.

Alternatively, thin films included in the display device (e.g., insulating films, semiconductor films, or conductive films) can be formed by a method such as spin coating, dipping, spray coating, ink-jetting, dispensing, screen printing, or offset printing, or with a tool (equipment) such as a doctor knife, a slit coater, a roll coater, a curtain coater, or a knife coater.

When thin films included in the display device are processed, a photolithography method or the like can be used for the processing. Alternatively, island-shaped thin films may be formed by a film formation method using a blocking mask. A nanoimprinting method, a sandblasting method, a lift-off method, or the like may be used for the processing of thin films. Examples of the photolithography method include a method in which a photosensitive resist material is applied on a thin film to be processed, the material is exposed to light using a photomask and developed to form a resist mask, the thin film is processed by etching or the like, and the resist mask is removed, and a method in which a photosensitive thin film is formed and then exposed to light and developed to be processed into a desired shape.

As light used for exposure in a photolithography method, for example, light with an i-line (wavelength: 365 nm), light with a g-line (wavelength: 436 nm), light with an h-line (wavelength: 405 nm), or light in which the i-line, the g-line, and the h-line are mixed can be used. Alternatively, ultraviolet light, KrF laser light, ArF laser light, or the like can be used. Light exposure may be performed by liquid immersion exposure technique. As the light for the exposure, extreme ultra-violet light (EUV) or X-rays may be used. Instead of the light for the exposure, an electron beam can be used. It is preferable to use EUV, X-rays, or an electron beam because extremely minute processing can be performed. Note that in the case of performing exposure by scanning with light or a beam such as an electron beam, a photomask is not needed.

For etching of thin films, a dry etching method, a wet etching method, a sandblast method, or the like can be used.

First, a method for forming the element layers 100a and 200a will be described.

[Preparation of Support Substrate]

First, a support substrate 61 is prepared. For the support substrate 61, a material having stiffness high enough to facilitate the transfer and having resistance to heat applied in the manufacturing process can be used. For example, a material such as glass, quartz, ceramics, sapphire, an organic resin, a semiconductor, a metal, or an alloy can be used. As the glass, for example, alkali-free glass, barium borosilicate glass, or aluminoborosilicate glass can be used.

[Formation of Resin Layer]

Figure 3A:
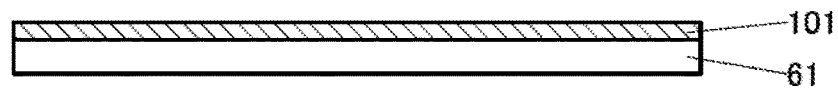
FIGS. 3A to 3E illustrate a method for manufacturing a display device of Embodiment.

Next, the resin layer 101 is formed over the support substrate 61 (FIG. 3A). The resin layer 101 is formed to perform separation of the support substrate 61 in a later step. Note that another method may be used to perform separation of the support substrate 61. For example, a stack of inorganic films including a tungsten film and a silicon oxide film is provided over the support substrate 61, and the support substrate 61 can be separated by applying physical force to the stack. Alternatively, over the support substrate 61, a separation layer is formed using a material from which hydrogen or oxygen is released by heating and is irradiated with light, so that the support substrate 61 can be separated. As the material from which hydrogen or oxygen is released, hydrogenated amorphous silicon, silicon oxide, silicon oxynitride, aluminum oxide, or the like can be used. In the case where the separation is performed using the stack of inorganic films or the material from which hydrogen or oxygen is released, the resin layer 101 need not be formed.

First, a material to be the resin layer 101 is applied on the support substrate 61. For the application, a spin coating method is preferred because the resin layer 101 can be thinly and uniformly formed over a large substrate.

Alternatively, the resin layer 101 can be formed by dipping, spray coating, ink-jetting, dispensing, screen printing, or offset printing, or with a doctor knife, a slit coater, a roll coater, a curtain coater, or a knife coater, for example.

The material contains a polymerizable monomer exhibiting a thermosetting property (also referred to as a thermopolymerization property) in which case polymerization proceeds by heat. Furthermore, the material is preferably photosensitive. In addition, the material contains a solvent for adjusting the viscosity.

The material preferably contains a polymerizable monomer that becomes a polyimide resin, an acrylic resin, an epoxy resin, a polyamide resin, a polyimide amide resin, a siloxane resin, a benzocyclobutene-based resin, or a phenol resin after polymerization. That is, the formed resin layer 101 contains any of these resin materials. In particular, it is preferable that the material include a polymerizable monomer containing an imide bond and then a resin typified by a polyimide resin be used for the resin layer 101 because heat resistance and weather resistance can be improved.

The viscosity of the material used for the application is greater than or equal to 5 cP and less than 500 cP, preferably greater than or equal to 5 cP and less than 100 cP, more preferably greater than or equal to 10 cP and less than or equal to 50 cP. The lower the viscosity of the material is, the easier the application becomes. Furthermore, the lower the viscosity of the material is, the more the entry of bubbles can be suppressed, leading to a film with good quality. Lower viscosity of the material allows application for a thin and uniform film, whereby the resin layer 101 can be thinner.

Then, heat treatment (postbake treatment) is performed to polymerize the applied material, whereby the resin layer 101 is formed. The temperature at this heating is preferably higher than the highest temperature in the process for forming the transistor 110 to be performed later. The temperature is, for example, higher than or equal to 300° C. and lower than or equal to 600° C., preferably higher than or equal to 350° C. and lower than or equal to 550° C., more preferably higher than or equal to 400° C. and lower than or equal to 500° C., and is typically 450° C. For the formation of the resin layer 101, heating at such a temperature is performed in a state where the surface of the resin layer 101 is exposed, so that a gas that can be released from the resin layer 101 can be removed. Thus, release of the gas in the process for forming the transistor 110 can be suppressed.

The thickness of the resin layer 101 is preferably greater than or equal to 0.01 μm and less than 10 μm, further preferably greater than or equal to 0.1 μm and less than or equal to 3 μm, still further preferably greater than or equal to 0.5 μm and less than or equal to 1 μm. The use of a low viscosity solvent facilitates the formation of the thin and uniform resin layer 101.

The thermal expansion coefficient of the resin layer 101 is preferably greater than or equal to 0.1 ppm/° C. and less than or equal to 20 ppm/° C., more preferably greater than or equal to 0.1 ppm/° C. and less than or equal to 10 ppm/° C.

The lower the thermal expansion coefficient of the resin layer 101 is, the more the breakage of the transistor or the like by stress caused by expansion or contraction due to heating can be suppressed.

In the case where an oxide semiconductor film is used as the semiconductor layer 112 in the transistor 110, the semiconductor layer 112 can be formed at a low temperature, so that the resin layer 101 does not need high heat resistance. Thus, the cost of the material can be reduced. The heat resistance of the resin layer 101 and the like can be evaluated by, for example, weight loss percentage due to heating, specifically 5% weight loss temperature. The 5% weight loss temperature of the resin layer 101 and the like is lower than or equal to 450° C., preferably lower than or equal to 400° C., further preferably lower than 400° C., still further preferably lower than 350° C. In addition, the highest temperature in the process for forming the transistor 110 and the like is preferably lower than or equal to 350° C.

[Formation of Insulating Layer 131]

Figure 3B:
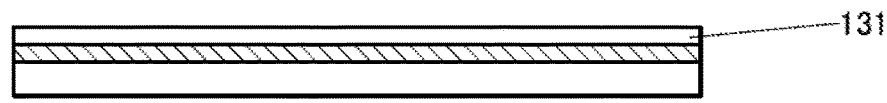

The insulating layer 131 is formed over the resin layer 101 (FIG. 3B).

The insulating layer 131 can be used as a barrier layer that prevents impurities contained in the resin layer 101 from diffusing into a transistor or a light-emitting element to be formed later. Therefore, a material having a high barrier property is preferably used for the insulating layer 131.

As the material having a high barrier property, an inorganic insulating material such as a silicon nitride film, a silicon oxynitride film, a silicon oxide film, a silicon nitride oxide film, an aluminum oxide film, or an aluminum nitride film can be used. Two or more of these insulating films may be stacked. In particular, a structure in which a silicon nitride film and a silicon oxide film are stacked on the resin layer 101 side is preferably employed.

In the case where the resin layer 101 has an uneven surface, the insulating layer 131 preferably covers the unevenness. The insulating layer 131 may function as a planarization layer that fills the unevenness. It is preferable to use a stack including an organic insulating material and an inorganic insulating material for the insulating layer 131, for example. The organic insulating material can be an organic resin such as an epoxy resin, an acrylic resin, a silicone resin, a phenol resin, a polyimide resin, an imide resin, a polyvinyl chloride (PVC) resin, a polyvinyl butyral (PVB) resin, or an ethylene vinyl acetate (EVA) resin.

The insulating layer 131 is preferably formed at a temperature higher than or equal to room temperature and lower than or equal to 400° C., further preferably higher than or equal to 100° C. and lower than or equal to 350° C., still further preferably higher than or equal to 150° C. and lower than or equal to 300° C.

[Formation of Transistor]

Figure 3C:
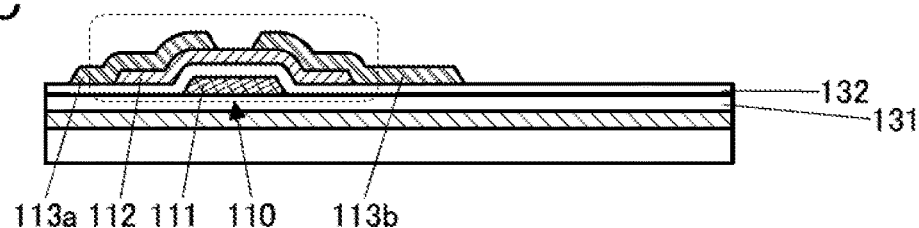

Next, as illustrated in FIG. 3C, the transistor 110 is formed over the insulating layer 131. Here, an example where a bottom-gate transistor is formed as an example of the transistor 110 will be described.

The conductive layer 111 is formed over the insulating layer 131. The conductive layer 111 can be formed in the following manner: a conductive film is formed; a resist mask is formed; the conductive film is etched; and the resist mask is removed.

Next, the insulating layer 132 is formed. For the insulating layer 132, the description of the inorganic insulating film that can be used as the insulating layer 131 can be referred to.

Then, the semiconductor layer 112 is formed. The semiconductor layer 112 can be formed in the following manner: a semiconductor film is formed; a resist mask is formed; the semiconductor film is etched; and the resist mask is removed.

The semiconductor film is formed at a substrate temperature higher than or equal to room temperature and lower than or equal to 300° C., preferably higher than or equal to room temperature and lower than or equal to 220° C., further preferably higher than or equal to room temperature and lower than or equal to 200° C., still further preferably higher than or equal to room temperature and lower than or equal to 170° C. Here, "the substrate temperature for the film formation is room temperature" means that the substrate is not heated, and includes the case where the substrate temperature is higher than the room temperature because the substrate receives energy in the film formation. The room temperature has a range of, for example, higher than or equal to 10° C. and lower than or equal to 30° C., and is typically 25° C.

It is preferable to use an oxide semiconductor for the semiconductor film. In particular, an oxide semiconductor having a wider band gap than silicon is preferably used. A semiconductor material having a wider band gap and a lower carrier density than silicon is preferably used because off-state current of the transistor can be reduced.

It is preferable to use a material having a band gap of greater than or equal to 2.5 eV, preferably greater than or equal to 2.8 eV, more preferably greater than or equal to 3.0 eV as the oxide semiconductor. With use of such an oxide semiconductor, in light (e.g., laser light) irradiation in the separation process to be described later, the light passes through the semiconductor film and thus electrical characteristics of the transistor are less likely to be adversely affected.

In particular, the semiconductor film used for one embodiment of the present invention is preferably formed under an atmosphere that contains one or both of an inert gas (e.g., Ar) and an oxygen gas by a sputtering method.

The substrate temperature for the film formation is preferably higher than or equal to room temperature and lower than or equal to 200° C., more preferably higher than or equal to room temperature and lower than or equal to 170° C. A high substrate temperature results in a larger number of crystal parts with orientation, which electrically stabilize the semiconductor film. A transistor including such a semiconductor film can have high electrical stability. Alternatively, film formation at a low substrate temperature or film formation without substrate heating can make a semiconductor film have a low proportion of crystal parts with orientation and high carrier mobility. A transistor including such a semiconductor film can have high field-effect mobility.

The oxygen flow rate ratio (partial pressure of oxygen) during the film formation is preferably higher than or equal to 0% and lower than 100%, further preferably higher than or equal to 0% and lower than or equal to 50%, still further preferably higher than or equal to 0% and lower than or equal to 33%, and yet still further preferably higher than or equal to 0% and lower than or equal to 15%. A low oxygen flow rate can result in a semiconductor film with high carrier mobility, leading to a transistor with high field-effect mobility. Meanwhile, a high oxygen flow rate can result in a semiconductor film with high crystallinity, which electrically stabilizes the semiconductor film.

Setting the substrate temperature and the oxygen flow rate during the film formation within the above ranges can result in a semiconductor film containing both crystal parts with orientation and crystal parts with no orientation. Furthermore, the proportions of crystal parts with orientation and crystal parts with no orientation can be adjusted by optimization of the substrate temperature and the oxygen flow rate within the above ranges.

An oxide target that can be used for forming the semiconductor film is not limited to an In—Ga—Zn-based oxide; for example, an In-M-Zn-based oxide (M represents one or more of Al, Ga, Si, B, Y, Ti, Fe, Ni, Ge, Zr, Mo, La, Ce, Nd, Hf, Ta, W, Mg, V, Be, and Cu) can be used.

When a semiconductor film containing crystal parts is formed using a sputtering target containing a polycrystalline oxide having a plurality of crystal grains, a semiconductor film with crystallinity can be obtained easier than the case of using a sputtering target not containing a polycrystalline oxide.

In particular, a transistor including a semiconductor film that contains both crystal parts with orientation in a thickness direction (also referred to as a film surface direction, or a direction perpendicular to a formation surface or surface of a film) and randomly aligned crystal parts with no such orientation can have more stable electrical characteristics and a smaller channel length, for example. On the other hand, a transistor including a semiconductor film that contains only crystal parts with no orientation can have high field-effect mobility. Note that as described later, a reduction in oxygen vacancies in an oxide semiconductor can achieve a transistor with high field-effect mobility and high stability of electrical characteristics.

The semiconductor layer 112 can be formed at a significantly low temperature. Therefore, the resin layer 101 can be formed thin.

Then, the conductive layer 113a and the conductive layer 113b are formed. The conductive layers 113a and 113b can be formed in the following manner: a conductive film is formed; a resist mask is formed; the conductive film is etched; and the resist mask is removed.

Note that during the processing of the conductive layers 113a and 113b, the semiconductor layer 112 might be partly etched to be thin in a region not covered with the resist mask. An oxide semiconductor film containing crystal parts with orientation is preferable for the semiconductor layer 112 because the unintended etching can be prevented.

In the above manner, the transistor 110 can be fabricated. The transistor 110 contains an oxide semiconductor in the semiconductor layer 112 where a channel is formed. In the transistor 110, part of the conductive layer 111 functions as a gate, part of the insulating layer 132 functions as a gate insulating layer, and the conductive layer 113a and the conductive layer 113b function as a source and a drain.

[Formation of Insulating Layer 133]

Next, the insulating layer 133 that covers the transistor 110 is formed. The insulating layer 133 can be formed in a manner similar to that of the insulating layer 132.

The insulating layer 133 is preferably formed at a temperature higher than or equal to room temperature and lower than or equal to 400° C., further preferably higher than or equal to 100° C. and lower than or equal to 350° C., still further preferably higher than or equal to 150° C. and lower than or equal to 300° C. Higher temperatures can provide the insulating film with higher density and a higher barrier property.

It is preferable to use an oxide insulating film, such as a silicon oxide film or a silicon oxynitride film, formed at a low temperature in the above range under an atmosphere containing oxygen for the insulating layer 133. An insulating film with low oxygen diffusibility and low oxygen permeability, such as a silicon nitride film, is preferably stacked over the silicon oxide film or the silicon oxynitride film. The oxide insulating film formed at low temperatures under an atmosphere containing oxygen can easily release a large amount of oxygen by heating. When a stack including such an oxide insulating film that releases oxygen and an insulating film with low oxygen diffusibility and low oxygen permeability is heated, oxygen can be supplied to the semiconductor layer 112. As a result, oxygen vacancies in the semiconductor layer 112 can be filled and defects at the interface between the semiconductor layer 112 and the insulating layer 133 can be repaired, leading to a reduction in defect levels. Accordingly, an extremely highly reliable semiconductor device can be fabricated.

Through the above steps, the transistor 110 and the insulating layer 133 covering the transistor 110 can be formed over the flexible resin layer 101. If the resin layer 101 and the support substrate 61 are separated from each other at this stage by a method described later, a flexible device including no display element can be fabricated. Forming the transistor 110 or forming a capacitor, a resistor, a wiring, and the like in addition to the transistor 110 can provide a flexible device including a semiconductor circuit, for example.

[Formation of Insulating Layer 134]

Then, the insulating layer 134 is formed over the insulating layer 133. The display element is formed on the insulating layer 134 in a later step; thus, the insulating layer 134 preferably functions as a planarization layer. For the insulating layer 134, the description of the organic insulating film or the inorganic insulating film that can be used for the insulating layer 131 can be referred to.

For the insulating layer 134, as well as for the resin layer 101, a photosensitive and thermosetting resin material is preferably used. In particular, the same material is preferably used for the insulating layer 134 and the resin layer 101. In that case, the insulating layer 134 can be formed using the same material and apparatus as the resin layer 101.

The thickness of the insulating layer 134, as well as the thickness of the resin layer 101, is preferably greater than or equal to 0.01 μm and less than 10 μm, further preferably greater than or equal to 0.1 μm and less than or equal to 3 μm, still further preferably greater than or equal to 0.5 μm and less than or equal to 1 μm. The use of a low viscosity solvent facilitates the formation of the thin and uniform insulating layer 134.

[Formation of Light-Emitting Element 120]

Next, an opening that reaches the conductive layer 113b and the like is formed in the insulating layer 134 and the insulating layer 133.

After that, the conductive layer 121 is formed. Part of the conductive layer 121 functions as a pixel electrode. The conductive layer 121 can be formed in the following manner: a conductive film is formed; a resist mask is formed; the conductive film is etched; and the resist mask is removed.

Figure 3D:
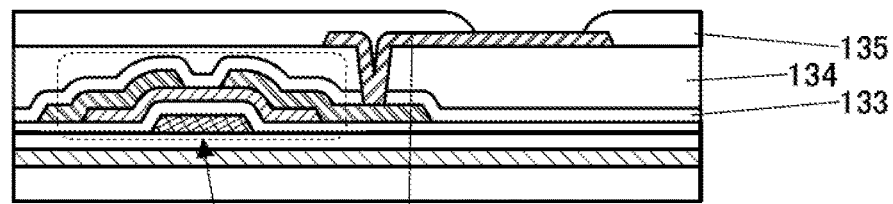

Subsequently, the insulating layer 135 that covers an end portion of the conductive layer 121 is formed as illustrated in FIG. 3D. For the insulating layer 135, the description of the organic insulating film or the inorganic insulating film that can be used for the insulating layer 131 can be referred to.

For the insulating layer 135, as well as for the resin layer 101, a photosensitive and thermosetting resin material is preferably used. In particular, the same material is preferably used for the insulating layer 135 and the resin layer 101. In that case, the insulating layer 135 can be formed using the same material and apparatus as the resin layer 101.

The thickness of the insulating layer 135, as well as the thickness of the resin layer 101, is preferably greater than or equal to 0.01 µm and less than 10 µm, further preferably greater than or equal to 0.1 µm and less than or equal to 3 µm, still further preferably greater than or equal to 0.5 µm and less than or equal to 1 µm. The use of a low viscosity solvent facilitates the formation of the thin and uniform insulating layer 135.

Figure 3E:
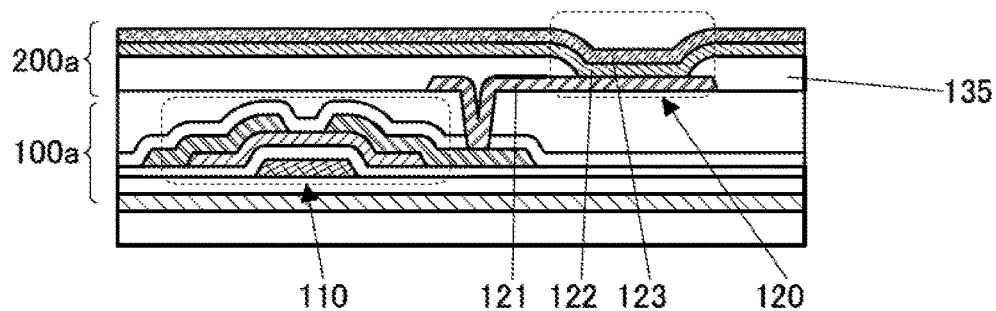

Next, the EL layer 122 and the conductive layer 123 are formed as illustrated in FIG. 3E.

The EL layer 122 can be formed by an evaporation method, a coating method, a printing method, a discharge method, or the like. In the case where the EL layer 122 is formed for each individual pixel, an evaporation method using a shadow mask such as a metal mask, an ink-jet method, or the like can be used. In the case of sharing the EL layer 122 by some pixels, an evaporation method not using a metal mask can be used. Here, an example where the EL layer 122 is formed by an evaporation method without using a metal mask is described.

The conductive layer 123 can be formed by an evaporation method, a sputtering method, or the like.

In the above manner, the light-emitting element 120 can be completed. In the light-emitting element 120, the conductive layer 121 part of which functions as a pixel electrode, the EL layer 122, and the conductive layer 123 part of which functions as a common electrode are stacked.

Note that an insulating layer serving as a barrier layer against impurities such as water may be formed to cover the conductive layer 123.

In the case where an inorganic insulating film is used as the insulating layer, the inorganic insulating film can be suitably formed by a sputtering method, a plasma CVD method, an ALD method, or a vapor deposition method, for example. An organic insulating film is preferably formed between the inorganic insulating film and the light-emitting element 120, specifically, between the inorganic insulating film and the conductive layer 123 so that the light-emitting element 120 is prevented from being damaged when the inorganic insulating film is formed. The organic insulating film may be thin (e.g., with a thickness of 100 nm or less), and can be formed by a vapor deposition method, for example.

Through the above steps, the element layers 100a and 200a can be formed. At the point of FIG. 3E, the element layers 100a and 200a are supported by the support substrate 61.

Next, a method for forming the element layer 100b will be described.

[Formation of Resin Layer 201]

Figure 4A:
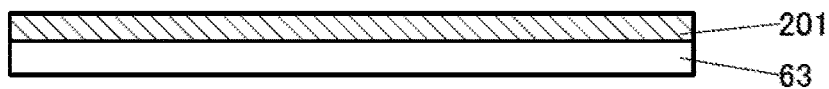
FIGS. 4A to 4F illustrate a method for manufacturing a display device of Embodiment.

A support substrate 63 is prepared and the resin layer 201 is formed over the support substrate 63 (FIG. 4A). The description of the support substrate 61 can be referred to for the support substrate 63. The description of the method and the material for forming the resin layer 101 can be referred to for those for forming the resin layer 201. As in the case of the resin layer 101, a separation method without the resin layer 201 may be employed. In that case, as in the method for separating the support substrate 61, a stack structure of inorganic films or a separation layer using a material from which hydrogen or oxygen is released by heating may be used.

An insulating layer serving as a barrier film may be formed over the resin layer 201. The description of the method and the material for forming the insulating layer 131 can be referred to for those for forming the insulating layer.

[Formation of Conductive Layer 221b and Conductive Layer 221a]

Figure 4B:
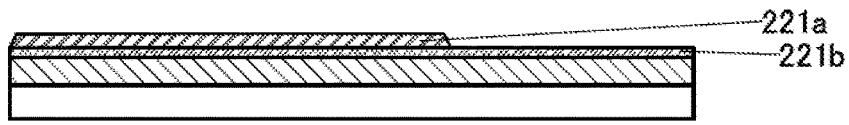

Next, the conductive layer 221b and the conductive layer 221a are stacked (FIG. 4B).

The conductive layer 221b is formed in the following manner: a conductive film to be the conductive layer 221b is formed; a resist mask is formed; the conductive film is etched; and the resist mask is removed. Subsequently, the conductive layer 221a is formed in the following manner: a conductive film to be the conductive layer 221a is formed; a resist mask is formed; the conductive film is etched; and the resist mask is removed.

Alternatively, the conductive film to be the conductive layer 221b and the conductive film to be the conductive layer 221a may be successively formed first, the conductive film to be the conductive layer 221a may be processed, and then, the conductive film to be the conductive layer 221b may be processed. In that case, resist masks may be separately formed and processed; however, an exposure technique using a multi-tone mask such as a half-tone mask or a gray-tone mask or a multiple exposure technique using two or more photomasks is preferably used, which leads to a reduction in steps.

[Formation of Insulating Layer 231]

Figure 4C:
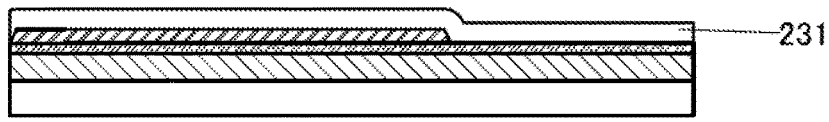

Next, the insulating layer 231 is formed to cover the conductive layer 221a, the conductive layer 221b, and the resin layer 201 (FIG. 4C). The description of the method and the material for forming the insulating layer 131 can be referred to for those for forming the insulating layer 231.

[Formation of Transistor 210]

Figure 4D:
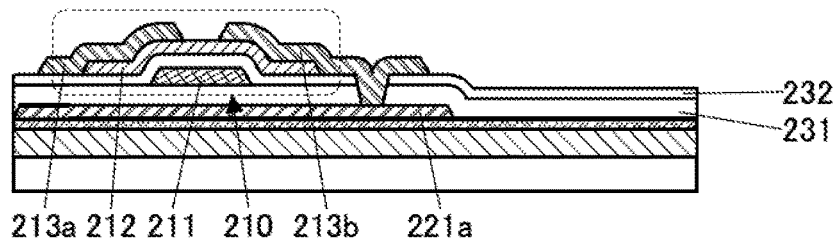

Next, as illustrated in FIG. 4D, the transistor 210 is formed over the insulating layer 231.

First, the conductive layer 211 is formed over the insulating layer 231, the insulating layer 232 is formed to cover the conductive layer 211 and the insulating layer 231, and the semiconductor layer 212 is formed over the insulating layer 232. The conductive layer 211, the insulating layer 232, and the semiconductor layer 212 can be formed by methods similar to those for forming the conductive layer 111, the insulating layer 132, and the semiconductor layer 112, respectively.

Next, an opening that reaches the conductive layer 221a is formed in the insulating layer 232 and the insulating layer 231.

Then, the conductive layer 213a and the conductive layer 213b are formed. The conductive layer 213a and the conductive layer 213b can be formed by a method similar to that for forming the conductive layer 113a and the conductive layer 113b.

Here, the conductive layer 213b is formed to fill the opening in the insulating layers 231 and 232, so that the conductive layer 213b and the conductive layer 221a are electrically connected to each other.

Through the above process, the transistor 210 can be formed.

The transistor 210 contains an oxide semiconductor in the semiconductor layer 212 where a channel is formed. In the transistor 210, part of the conductive layer 211 functions as a gate, part of the insulating layer 232 functions as a gate insulating layer, and the conductive layer 213a and the conductive layer 213b function as a source and a drain.

[Formation of Insulating Layer 233, Insulating Layer 234, Light-Condensing Means 500]

Next, the insulating layer 233 and the insulating layer 234 are formed in this order to cover the transistor 210. The insulating layer 233 and the insulating layer 234 can be formed by methods similar to those for forming the insulating layer 133 and the insulating layer 134, respectively.

Figure 4E:
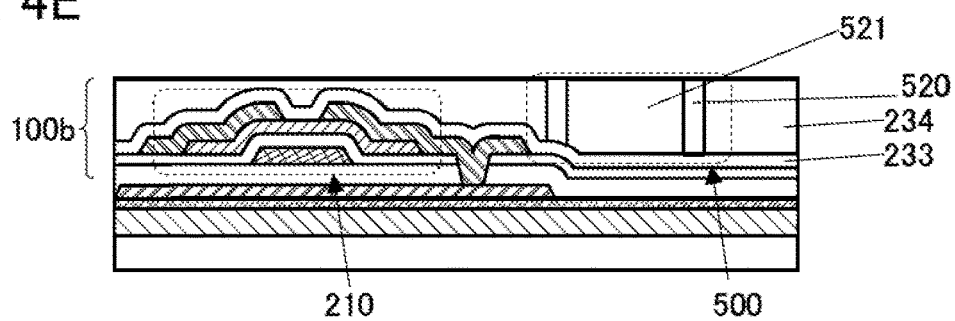

Then, an opening reaching the insulating layer 233 is formed in the insulating layer 234. In the case where the insulating layer 521 using a high refractive index material having a light-transmitting property and the insulating layer 234 having a light-transmitting property may be formed using the same material, the opening is provided only in a portion where the insulating layer 520 is to be formed. After that, the insulating layer 520 illustrated in FIG. 1A is formed using a low refractive index material. The insulating layer 520 is formed to fill the opening in the insulating layer 234. The insulating layer 520 is formed using a material having a refractive index lower than that of the insulating layer 521 (insulating layer 234) (FIG. 4E).

In the case where not the insulating layer 234 but another insulating layer is used as the insulating layer 521 formed using a high refractive index material having a light-transmitting property, an opening with the same size as the light-condensing means 500 to be formed later is formed in the insulating layer 234. Then, the insulating layer 520 and the insulating layer 521 are formed.

The opening in the insulating layer 234 is filled with the insulating layer 521 and the insulating layer 520, and then, if needed, planarization treatment may be performed so that the surface of the insulating layer 234 and the surface of the light-condensing means 500 are in the same plane.

For the insulating layer 521 using a high refractive index material having a light-transmitting property, SiC, $TiO_2$, ZnS, $CeO_2$, indium tin oxide, polycarbonate, or a polyester resin can be used, for example. For the insulating layer 520 using a low refractive index material having a light-transmitting property, silicon oxide, $CaF_2$, $MgF_2$, acrylic, or a fluorine resin can be used, for example.

FIGS. 4A to 4F illustrate an example of the light-condensing means 500 in FIG. 1A that includes the insulating layer 521 using a high refractive index material having a light-transmitting property and the insulating layer 520 using a low refractive index material having a light-transmitting property, and the light-condensing means 500 in FIG. 1B can be formed in a similar manner. In that case, after the insulating layer 234 is formed, an opening is formed in a portion where the metal film 522 is to be formed in FIG. 1B, and the metal film 522 is formed to fill the opening. Therefore, the insulating layer 234 and the insulator 523 are formed using the same material in FIG. 1B. Needless to say, the insulating layer 234 and the insulator 523 may be formed using different materials. An unnecessary portion of the metal film may be removed by etching.

In the case where the light-condensing means 500 has a tapered shape as illustrated in FIGS. 2A and 2B, an opening is formed in the insulating layer 234 so that the top surface (coloring layer 152 side) has a larger area than that of the bottom surface (insulating layer 233 side). The opening is filled with a low refractive index material, an opening having a tapered shape is formed in the low refractive index material, and then, the opening is filled with a high refractive index material. In such a manner, the light-condensing means 500 in FIG. 2A can be formed. The order and method for forming the insulating layer 520 and the insulating layer 521 in the opening in the insulating layer 234 are not limited to those described above, and may be selected from existing deposition methods and etching methods as appropriate.

Also in the case of the light-condensing means 500 illustrated in FIG. 2B, the opening is formed in the insulating layer 234 so that the top surface (coloring layer 152 side) has a larger area than that of the bottom surface (insulating layer 233 side). The opening is filled with a metal film, an opening having a tapered shape is formed in the metal film, and then, the opening is filled with an insulator. In such a manner, the light-condensing means 500 in FIG. 2B can be formed. The order and method for forming the insulator 523 and the metal film 522 in the opening in the insulating layer 234 are not limited to those described above, and may be selected from the existing deposition methods and etching methods as appropriate.

Also in the case of the light-condensing means in FIGS. 16A and 16B, an opening is formed in the insulating layer 234, the metal film 528 and the insulating layer 520 are formed, and the insulating layer 521 may be further formed if needed.

Through the above steps, the element layer 100b can be formed. At the point of FIG. 4E, the element layer 100b is supported by the support substrate 63.

[Formation of Coloring Layer 152 and Light-Blocking Layer 153]

Figure 4F:
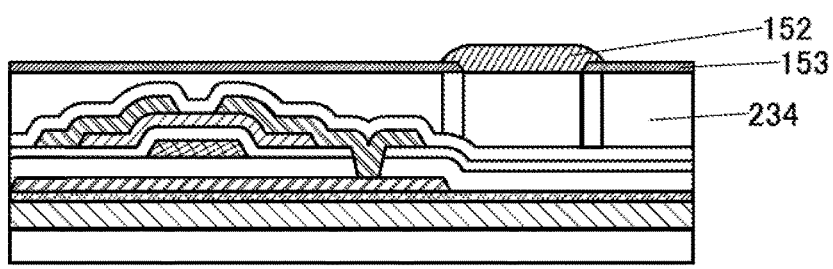

Next, the light-blocking layer 153 and the coloring layer 152 are formed over the insulating layer 234 (FIG. 4F).

For the light-blocking layer 153, a metal material or a resin material can be used, for example. In the case where a metal material is employed, the light-blocking layer 153 can be formed in such a manner that a conductive film is formed and an unnecessary portion is removed by a photolithography method or the like. In the case where a metal material or a photosensitive resin material containing pigment or dye is used, the light-blocking layer 153 can be formed by a photolithography method or the like. The light-blocking layer 153 may include an opening overlapping with the light-condensing means 500.

For the coloring layer 152, a photosensitive material can be used. The coloring layer 152 formed with a photosensitive material can be processed into an island-like shape by a photolithography method or the like.

In that case, the light-blocking layer 153 includes an opening overlapping with the coloring layer 152.

The light-blocking layer 153 is preferably provided to cover the transistor 210. Specifically, in the case where the transistor 210 is a bottom-gate transistor, external light and light from the light-emitting element 120 are prevented from reaching the semiconductor layer 212 by the light-blocking layer 153, so that the reliability can be improved.

In the case where the light-condensing means 500 includes the metal film 522 in FIG. 1B, the metal film 522 and the light-blocking layer 153 can be formed using the same material. After an opening for providing the metal film 522 is formed in the insulating layer 234, a conductive layer is formed to cover the top surface of the insulating layer 234 and fill the opening. By removing only a portion of the conductive layer that overlaps with the insulator 523 in FIG. 1B, the metal film 522 and the light-blocking layer 153 can be formed at the same time. In that case, the metal film 522 and the light-blocking layer 153 are integrated.

[Bonding]

Figure 5A:
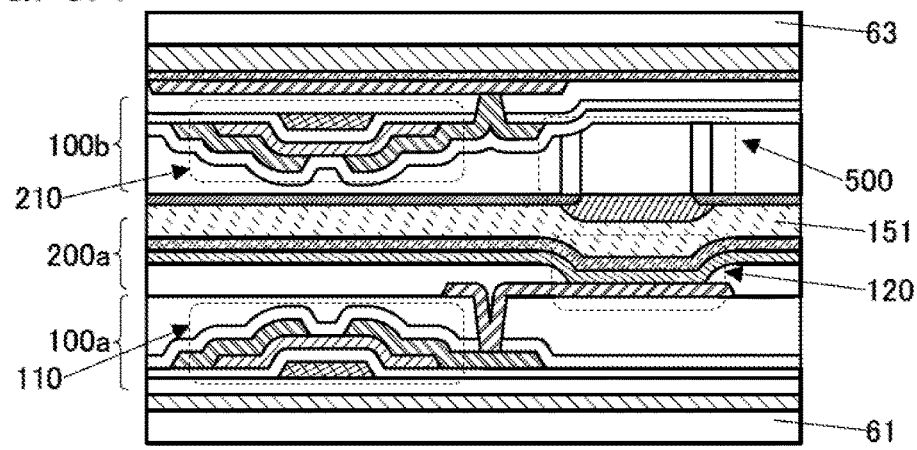
FIGS. 5A to 5C illustrate a method for manufacturing a display device of Embodiment.

Next, as illustrated in FIG. 5A, the support substrate 61 and the support substrate 63 are bonded to each other with the adhesive layer 151 so that the element layer 100a and the element layer 100b face each other. Then, the adhesive layer 151 is cured. Thus, the light-emitting element 120 can be sealed by the adhesive layer 151.

A curable material is preferably used for the adhesive layer 151. For example, a photocurable resin, a reactive curable resin, or a thermosetting resin can be used. In particular, a resin material without a solvent is preferably used.

When misalignment of the support substrate 61 and the support substrate 63 occurs, light from the light-emitting element 120 is blocked by a light-blocking member in the element layer 100b or the like, the light-blocking layer 153, or the like in some cases. Therefore, it is preferable that each of the support substrates 63 and 61 be provided with an alignment marker.

[Separation of Support Substrate 61]

Figure 5B:
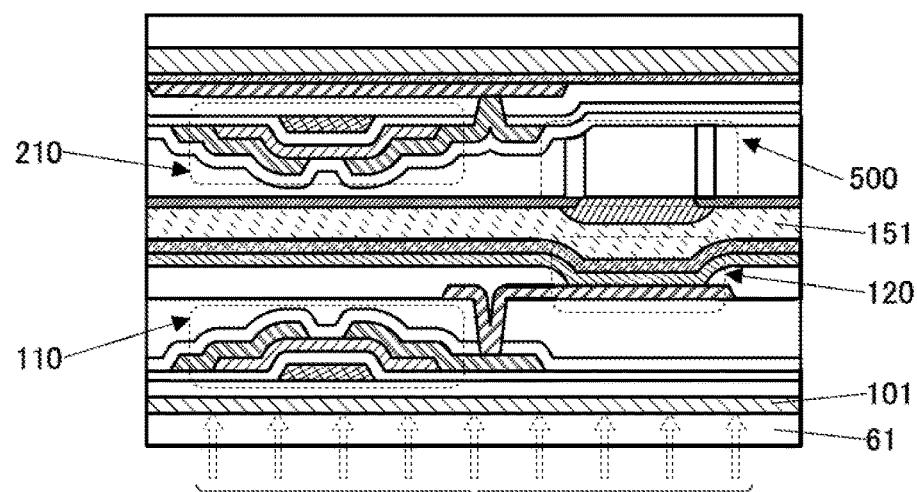

Next, as illustrated in FIG. 5B, the resin layer 101 is irradiated with light 70 through the support substrate 61 from the support substrate 61 side.

Laser light is suitable for the light 70. In particular, linear laser is preferable.

Note that a flash lamp or the like may be used as long as the resin layer 101 can be irradiated with light whose energy is as high as that of laser light.

As the light 70, light having a wavelength by which at least part of the light 70 is transmitted through the support substrate 61 and absorbed by the resin layer 101 is preferably used. In particular, it is preferable to use light with a wavelength range from visible light to ultraviolet light as the light 70. For example, light having a wavelength of greater than or equal to 200 nm and less than or equal to 400 nm, preferably greater than or equal to 250 nm and less than or equal to 350 nm, is used. In particular, an excimer laser having a wavelength of 308 nm is preferably used because the productivity is increased. The excimer laser is preferable because the excimer laser can be used also for laser crystallization of LTPS, so that the existing LTPS production line device can be used and newly capital investment is not necessary. Alternatively, a solid-state UV laser (also referred to as a semiconductor UV laser), such as a UV laser having a wavelength of 355 nm which is the third harmonic of an Nd:YAG laser, may be used. As a laser, a CW (continuous wave) laser or a pulsed laser may be used. As the pulsed laser, a short time pulsed laser such as a nanosecond laser, a picosecond laser, or a femtosecond laser, or a longer time pulsed laser (for example, shorter than or equal to several hundreds of hertz) can be used.

In the case where a linear laser light is used as the light 70, scanning is performed with the light 70 and a region to be peeled is entirely irradiated with the light 70 by relatively moving the support substrate 61 and a light source. At this step, when irradiation is performed on the entire surface where the resin layer 101 is provided, the resin layer 101 can be peeled entirely and it is not necessary to cut the peripheral portion of the support substrate 61 by scribing or the like in a subsequent separation step. Alternatively, it is preferable that the peripheral portion of the region where the resin layer 101 is provided have a region not irradiated with the light 70 because the adhesion of the region remains strong and separation of the resin layer 101 and the support substrate 61 can be suppressed at the irradiation with the light 70.

By the irradiation with the light 70, the vicinity of the surface of the resin layer 101 on the support substrate 61 side or part of the inside of the resin layer 101 is improved and the adhesion between the support substrate 61 and the resin layer 101 is reduced and a state where separation is easily performed can be formed.

Figure 5C:
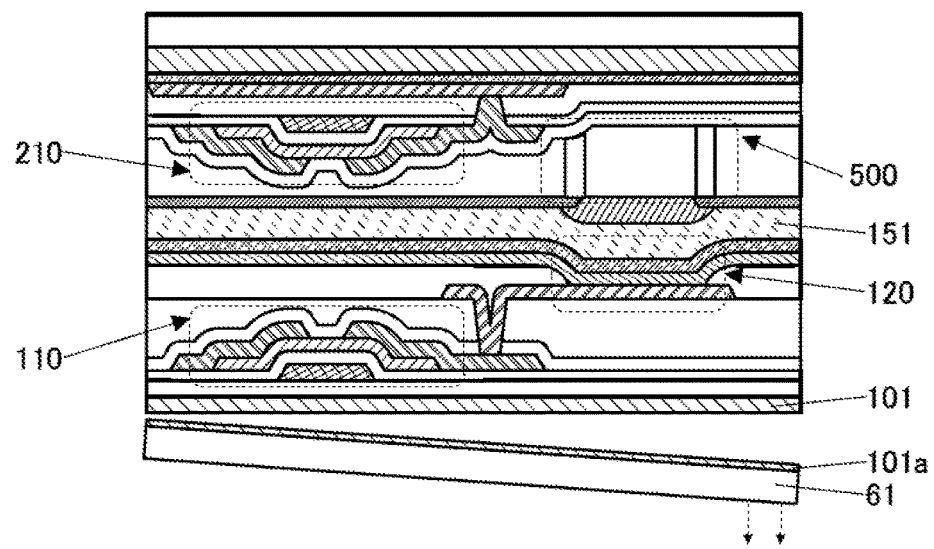

Next, the support substrate 61 and the resin layer 101 are separated (FIG. 5C). Separation can be performed by applying pulling force in the perpendicular direction to the support substrate 61 while the support substrate 63 is fixed to a stage. For example, the support substrate 61 can be separated by adsorbing part of the top surface of the support substrate 61 and pulling it upward. The stage may have any structure as long as the support substrate 63 can be fixed. For example, the stage may have an adsorption mechanism capable of vacuum adsorption, electrostatic adsorption, or the like or a mechanism physically fastening the support substrate 63. Alternatively, separation may be performed by applying pulling force in the perpendicular direction to the support substrate 63 while the support substrate 61 is fixed to the stage.

Alternatively, separation may be performed by pressing a drum-shaped member with an adhesive surface against the top surface of the support substrate 61 or 63 and rotating the member. At this time, the stage may be moved in the peeling direction.

In the case where the region not irradiated with the light 70 is provided in the peripheral portion of the resin layer 101, a notch may be formed in part of the resin layer 101 irradiated with the light 70 to serve as a trigger for peeling. The notch can be formed with a sharp edged tool or a needle-like member or can be formed by cutting the support substrate 61 and the resin layer 101 at the same time by scribing or the like.

Depending on the condition of the irradiation with the light 70, separation (fracture) occurs inside the resin layer 101 and part of the resin layer 101 remains on the support substrate 61 side in some cases. FIG. 5C illustrates a case in which fracture occurs inside the resin layer 101 and a resin layer 101a which is part of the resin layer 101 remains on the support substrate 61 side.

Also in the case where part of the surface of the resin layer 101 is melted, part of the resin layer 101 sometimes remains on the support substrate 61 side in a similar manner. In the case where separation is performed at the interface between the support substrate 61 and the resin layer 101, part of the resin layer 101 sometimes does not remain on the support substrate 61 side.

The thickness of the resin layer 101a remaining on the support substrate 61 side can be less than or equal to 100 nm, specifically approximately greater than or equal to 40 nm and less than or equal to 70 nm. The support substrate 61 can be reused by removing the remaining resin layer 101a. For example, in the case where glass is used for the support substrate 61 and a polyimide resin is used for the resin layer 101, the remaining resin layer 101a can be removed by ashing treatment or with fuming nitric acid or the like.

[Bonding of Substrate 11]

Figure 6A:
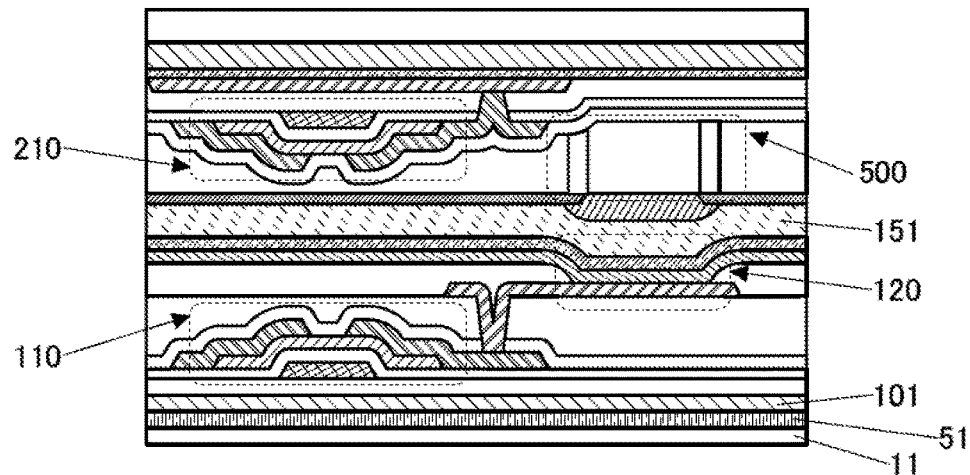
FIGS. 6A to 6C illustrate a method for manufacturing a display device of Embodiment.

Next, as illustrated in FIG. 6A, the resin layer 101 and the substrate 11 are bonded to each other with the adhesive layer 51.

The description of the adhesive layer 151 can be referred to for the adhesive layer 51.

When a resin material is used for the substrate 11 and the substrate 12 to be described later, the display device can be reduced in weight as compared with the case where glass or the like is used for the substrate 11 and the substrate 12 with the same thicknesses. A material which is thin enough to have flexibility is preferably used because the display device can be further reduced in weight. Furthermore, when a resin material is used, the display device can have higher impact resistance; thus, a non-breakable display device can be achieved.

Since the substrate 11 is located on the side opposite to the viewing side, the substrate 11 does not necessarily transmit visible light. Therefore, a metal material can also be used. A metal material, which has high thermal conductivity, can suppress a local temperature rise in the display device because it can easily conduct heat to the whole substrate.

Next, a method for forming the element layer 200b will be described.

[Separation of Support Substrate 63]

Figure 6B:
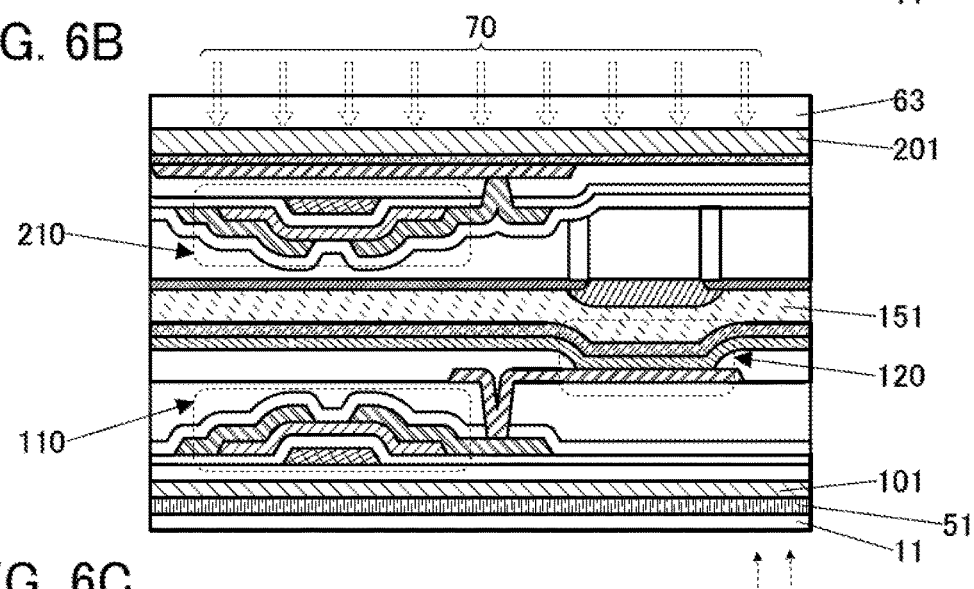

Next, the resin layer 201 is irradiated with the light 70 through the support substrate 63 from the support substrate 63 side (FIG. 6B). The above description can be referred to for the irradiation method of the light 70.

Figure 6C:
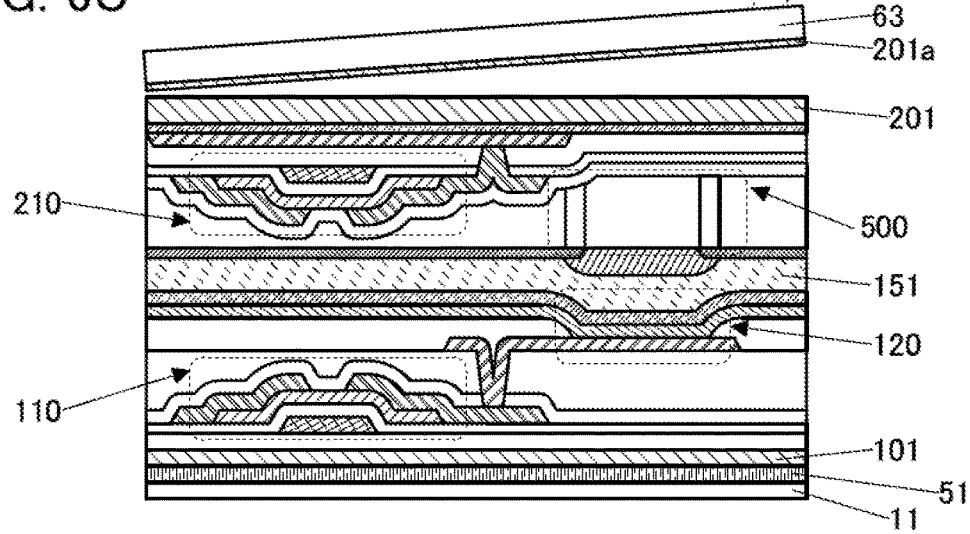

After that, as illustrated in FIG. 6C, the support substrate 63 and the resin layer 201 are separated. FIG. 6C illustrates an example in which fracture occurs inside the resin layer 201 and a resin layer 201*a* which is part of the resin layer 201 remains on the support substrate 63 side.

[Thinning of Resin Layer 201]

Next, part of the resin layer 201 is removed to thin the resin layer 201. The thinned resin layer 201 can be thinner than the resin layer 101, for example. Specifically, the thinned resin layer 201 preferably has a thickness of greater than or equal to 1 nm and less than 3 μm, further preferably greater than or equal to 5 nm and less than or equal to 1 μm, still further preferably greater than or equal to 10 nm and less than or equal to 200 nm.

The thinning method is not particularly limited as long as the resin layer 201 can be etched; plasma treatment, a dry etching method, a wet etching method, or the like can be used. Especially, a dry etching method is preferable because high uniformity can be obtained. It is particularly preferable that plasma treatment in an environment containing oxygen (also referred to as ashing treatment) be employed because the resin layer 201 contains an organic substance. In the case where a wet etching method is employed, a diluted etchant or the like is preferably used to prevent the resin layer 201 from being completely removed. Alternatively, a method without thinning may be employed; for example, the resin layer 201 is formed thin by sufficiently diluting a material for forming a thin film to be the resin layer 201 with a solvent to have low viscosity.

Figure 7A:
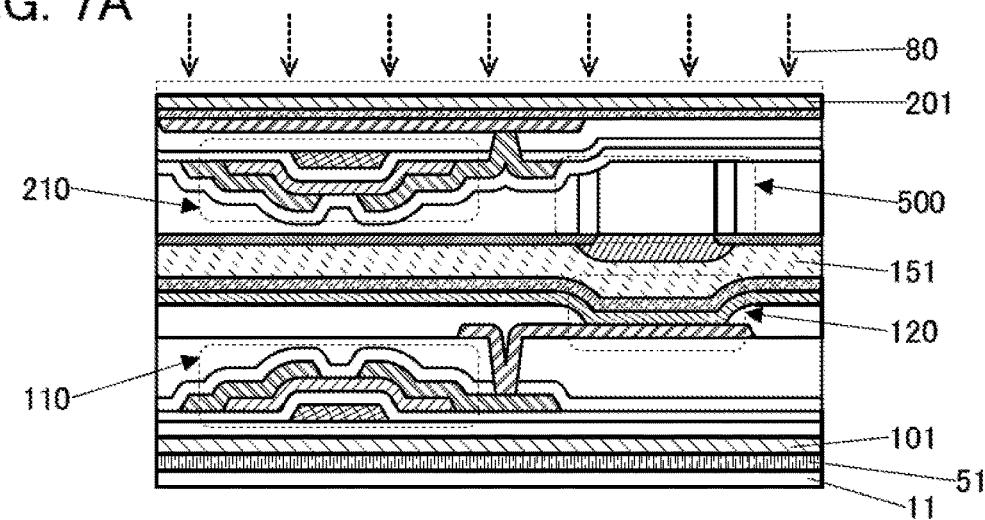
FIGS. 7A and 7B illustrate a method for manufacturing a display device of Embodiment.

FIG. 7A illustrates a state where the top surface of the resin layer 201 is irradiated with plasma 80, so that part of the upper portion of the resin layer 201 is etched to be thinned.

[Rubbing Treatment]

Next, rubbing treatment is performed on the top surface of the resin layer 201. Thus, the resin layer 201 can be used as an alignment film.

Figure 7B:
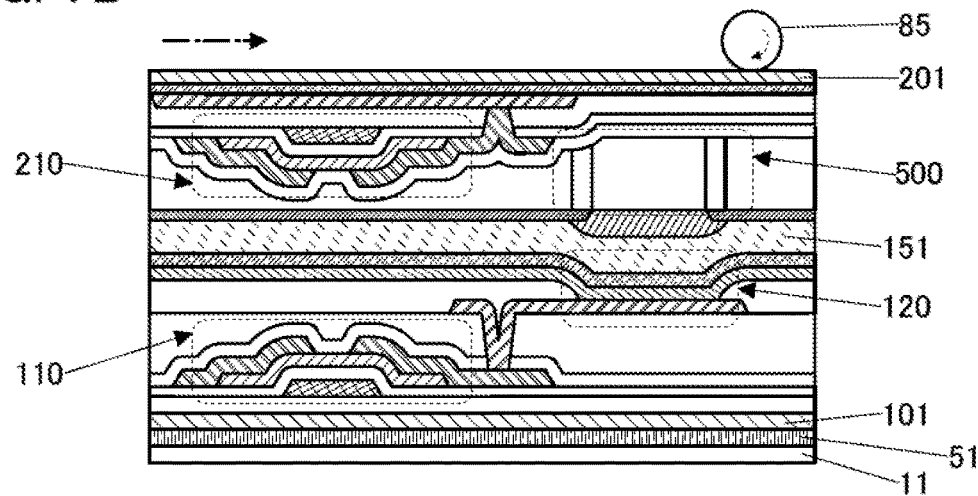

FIG. 7B illustrates a state where the rubbing treatment is performed. As illustrated in FIG. 7B, uniaxial alignment can be performed on the resin layer 201 by sliding the substrate 11 as shown by an arrow of a dashed-dotted line in the drawing in a state where a rotating rubbing roller 85 is pressed against the resin layer 201.

The example where the resin layer 201 is thinned and used as an alignment film is shown here, and the planarity of a surface of the resin layer 201 might be lowered in thinning treatment. In that case, a resin or the like to be an alignment film may be formed after the resin layer 201 is completely removed in a step of thinning the resin layer 201. Furthermore, the resin or the like is subjected to rubbing treatment, so that the alignment film can be formed.

Although not illustrated here, it is preferable that the substrate 11 side be fixed to another support substrate to facilitate transfer in subsequent steps after bonding of the substrate 11. For example, the substrate 11 and the support substrate can be fixed with a viscous material, a double-sided tape, a silicone sheet, a water-soluble adhesive, or the like. Similarly, it is preferable that the substrate 11 side be fixed to another support substrate also in subsequent steps after bonding of the support substrate 64 described later.

[Formation of Light Absorption Layer 103]

Next, the support substrate 64 is prepared. For the support substrate 64, the description of the support substrate 61 can be referred to.

Figure 8A:
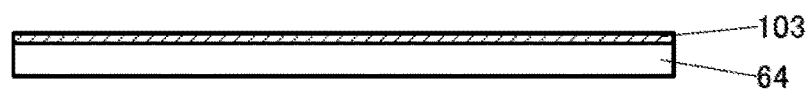
FIGS. 8A to 8D illustrate a method for manufacturing a display device of Embodiment.

A light absorption layer 103 is formed over the support substrate 64 (FIG. 8A). The light absorption layer 103 releases hydrogen, oxygen, or the like by absorbing light 70 and generating heat in a light 70 irradiation step to be performed later.

As the light absorption layer 103, for example, a hydrogenated amorphous silicon (a-Si:H) film from which hydrogen is released by heating can be used. The hydrogenated amorphous silicon film can be formed by, for example, a plasma CVD method using a deposition gas containing $SiH_4$. Furthermore, after the deposition, heat treatment may be performed under an atmosphere containing hydrogen in order that the light absorption layer 103 contains a larger amount of hydrogen.

Alternatively, as the light absorption layer 103, an oxide film from which oxygen is released by heating can be used. In particular, an oxide semiconductor film or an oxide conductor film is preferred because they have a narrower band gap and are more likely to absorb light than an insulating film such as a silicon oxide film. Note that the oxide conductor film can be formed by increasing defect states or impurity states in the oxide semiconductor film. In the case where an oxide semiconductor is used for the light absorption layer 103, the above-described method for forming the semiconductor layer 112 and a material to be described later which can be used for the semiconductor layer can be employed. The oxide film can be formed by a plasma CVD method, a sputtering method, or the like under an atmosphere containing oxygen, for example. In particular, in the case where an oxide semiconductor film is used, a sputtering method under an atmosphere containing oxygen is preferred. Furthermore, after the deposition, heat treatment may be performed under an atmosphere containing oxygen in order that the light absorption layer 103 contains a larger amount of oxygen.

Alternatively, the oxide film that can be used as the light absorption layer 103 may be an oxide insulating film. For example, a silicon oxide film, a silicon oxynitride film, an aluminum oxide film, or a silicon oxynitride film can be used. For example, such an oxide insulating film is formed under an atmosphere containing oxygen at a low temperature (e.g., lower than or equal to 250° C., preferably lower than or equal to 220° C.), whereby an oxide insulating film containing excess oxygen can be formed. This oxide insulating film can be formed by, for example, a sputtering method or a plasma CVD method.

[Formation of Resin Layer 202]

Figure 8B:
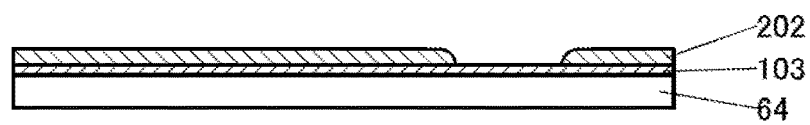

Next, the resin layer 202 having an opening is formed over the light absorption layer 103 (FIG. 8B). The description of the method and the material for forming the resin layer 101 can be referred to for those for forming the resin layer 202 except for the opening of the resin layer 202. A stack of the light absorption layer 103 and the resin layer 202 is formed to separate the support substrate 64; however, another separation method may be employed. For example, the support substrate 64 can be separated in the following manner: a stack of inorganic films including a tungsten film and a silicon oxide film is provided over the support substrate 64; and physical force is applied to the stack. In that case, the formation steps of the light absorption layer 103 and the resin layer 202 and the irradiation step with the light 70 become unnecessary. The insulating layer 204, the conductive layer 223, and the alignment film 224 are formed in this order after the stack of inorganic films is provided over the support substrate 64.

In order to form the resin layer 202, first, a photosensitive material is applied on the light absorption layer 103 to form a thin film, and pre-baking is performed. Next, the material is exposed to light with use of a photomask, and then developed, whereby the resin layer 202 having an opening can be formed. After that, post-baking is performed to sufficiently polymerize the material and remove a gas in the film.

[Formation of Insulating Layer 204]

Figure 8C:
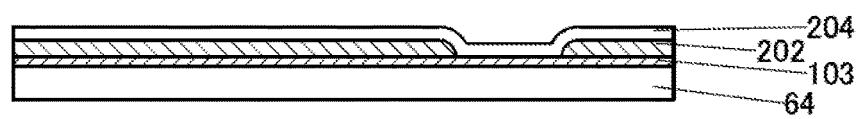

Next, the insulating layer 204 is formed to cover the resin layer 202 and the opening of the resin layer 202 (FIG. 8C). Part of the insulating layer 204 is in contact with the light absorption layer 103. The insulating layer 204 can be used as a barrier layer that prevents impurities contained in the resin layer 202 from diffusing into a transistor, a liquid crystal element, or the like to be formed later. Thus, a material having a high barrier property is preferably used for the insulating layer 204.

The description of the method and the material for forming the insulating layer 131 can be referred to for those for forming the insulating layer 204.

[Formation of Conductive Layer 223]

Next, the conductive layer 223 is formed over the insulating layer 204. The conductive layer 223 can be formed using a material that transmits visible light. The conductive layer 223 can be formed by forming a conductive film. Note that the conductive layer 223 may be formed by, for example, a sputtering method using a shadow mask such as a metal mask such that the conductive layer 223 is not provided in the peripheral portion of the resin layer 202. Alternatively, the conductive layer 223 may be formed in such a manner that a conductive film is formed and then an unnecessary portion of the conductive film is removed by etching using a photolithography method or the like.

[Formation of Alignment Film 224]

Figure 8D:
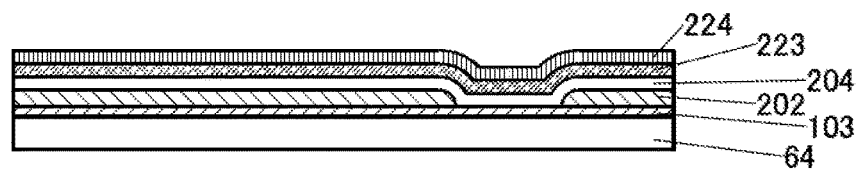

Next, the alignment film 224 is formed over the conductive layer 223 (FIG. 8D). The alignment film 224 can be formed in the following manner: a thin film is formed using a resin or the like and then, rubbing treatment is performed.

[Bonding of Substrate 11 and Support Substrate 64]

Figure 9A:
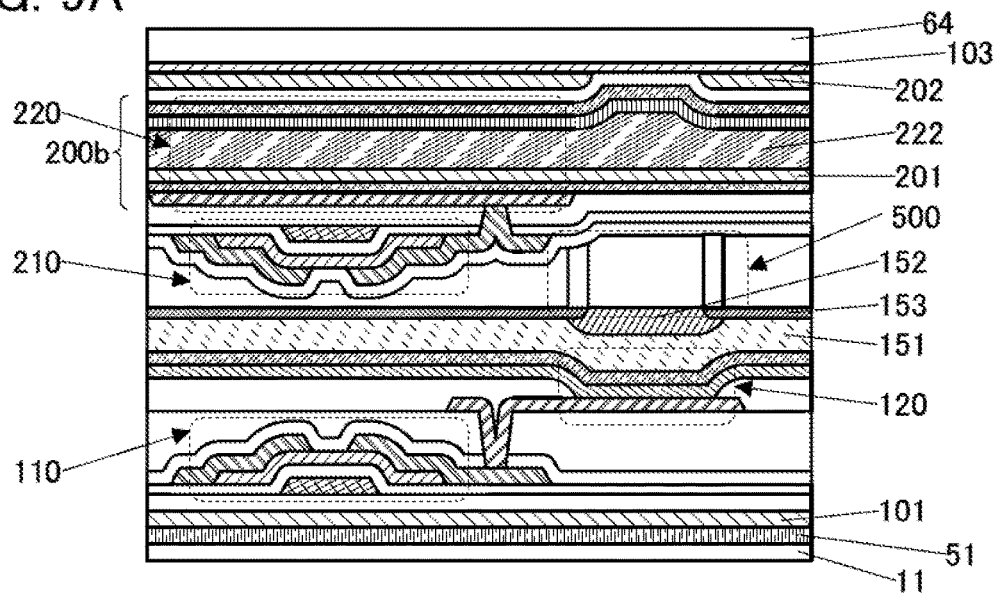
FIGS. 9A and 9B illustrate a method for manufacturing a display device of Embodiment.

Next, as illustrated in FIG. 9A, the substrate 11 and the support substrate 64 are bonded to each other with the liquid crystal 222 interposed therebetween. In that case, the substrate 11 and the support substrate 64 are bonded so that the opening of the resin layer 202 and the light-emitting element 120 overlap with each other. Furthermore, the substrate 11 and the support substrate 64 are bonded so that the opening of the resin layer 202 overlaps with the opening of the light-blocking layer 153 and the coloring layer 152.

In addition, the resin layer 201 and the resin layer 202 are bonded with an adhesive layer (not illustrated) in the peripheral portion.

Next, an adhesive layer (not illustrated) for bonding the resin layer 201 and the resin layer 202 is formed on one or both of the resin layer 201 and the resin layer 202. The adhesive layer is formed to surround a region where a pixel is provided. The adhesive layer can be formed by a screen printing method, a dispensing method, or the like. For the adhesive layer, a thermosetting resin, an ultraviolet curable resin, or the like can be used. Alternatively, a resin which is cured when heated after pre-cured by ultraviolet light or the like may be used. Alternatively, a thermosetting and ultraviolet curable resin or the like may be used as the adhesive layer.

Next, the liquid crystal 222 is dropped in a region surrounded by the adhesive layer by a dispensing method or the like. Then, the substrate 11 and the support substrate 64 are bonded to each other such that the liquid crystal 222 is interposed therebetween, and the adhesive layer is cured. The bonding is preferably performed in a reduced-pressure atmosphere because air bubbles and the like can be prevented from entering between the substrate 11 and the support substrate 64.

In addition, after the liquid crystal 222 is dropped, a particulate gap spacer may be dispersed in a region where the pixel is provided or outside the region, or the liquid crystal 222 containing the gap spacer may be dropped. The liquid crystal 222 may be injected in a reduced-pressure atmosphere through a space provided in the adhesive layer after the substrate 11 and the support substrate 64 are bonded to each other.

Through the above steps, the liquid crystal element 220 and the element layer 200b can be formed at the same time. At this time, the support substrate 64 and the light absorption layer 103 are provided on the display surface side.

[Separation of Support Substrate 64]

Figure 9B:
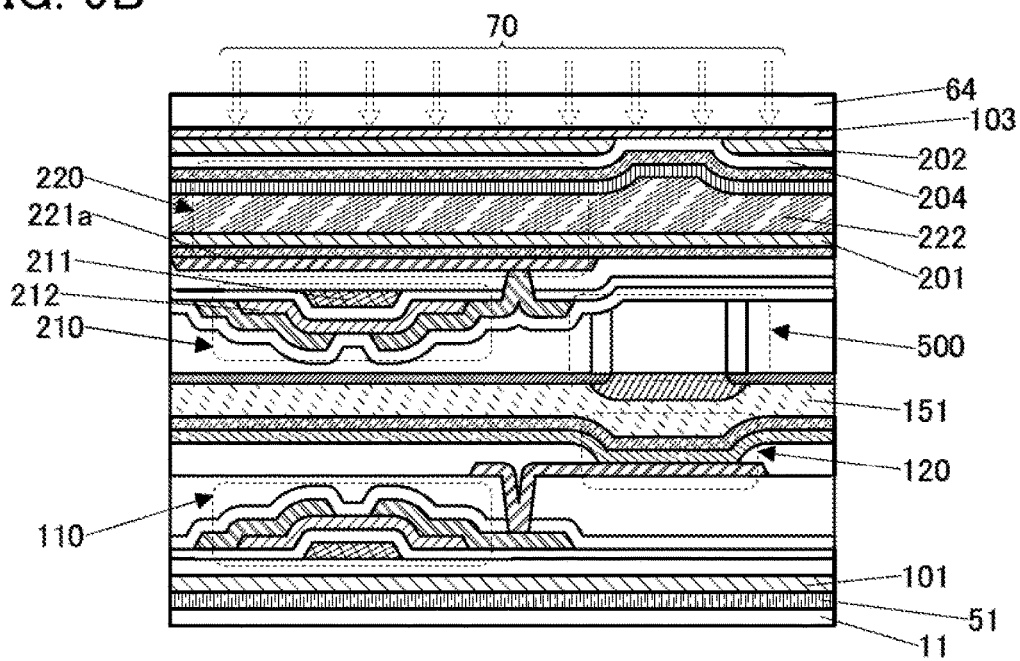

Next, as illustrated in FIG. 9B, the light absorption layer 103 is irradiated with the light 70 through the support substrate 64 from the support substrate 64. The above description can be referred to for the irradiation method of the light 70.

Here, as the light 70, light having a wavelength by which at least part of the light 70 is transmitted through the support substrate 61 and absorbed by the light absorption layer 103 is selected.

By the irradiation with the light 70, the light absorption layer 103 is heated and hydrogen, oxygen, or the like is released from the light absorption layer 103. At this time, hydrogen, oxygen, or the like is released in a gaseous state. The released gas remains near the interface between the light absorption layer 103 and the resin layer 202 or near the interface between the light absorption layer 103 and the support substrate 64; thus, the force of peeling them occurs. Consequently, adhesion between the light absorption layer 103 and the resin layer 202 or adhesion between the light absorption layer 103 and the support substrate 64 is reduced and a state where peeling is easily performed can be formed.

Part of the gas released from the light absorption layer 103 remains in the light absorption layer 103 in some cases. Therefore, in some cases, the light absorption layer 103 is embrittled and separation is likely to occur inside the light absorption layer 103.

Moreover, in the case where a film releasing oxygen is used as the light absorption layer 103, part of the resin layer 202 is oxidized and embrittled in some cases by oxygen released from the light absorption layer 103. Accordingly, a state where peeling is easily performed can be formed at the interface between the resin layer 202 and the light absorption layer 103.

Also in a region overlapping with the opening of the resin layer 202, adhesion at the interface between the light absorption layer 103 and the insulating layer 204 or adhesion at the interface between the light absorption layer 103 and the support substrate 64 is reduced and a state where peeling is easily performed is formed for the same reason as above. In some cases, the light absorption layer 103 is embrittled and a state where separation is likely to occur.

In contrast, the region not irradiated with the light 70 still has high adhesion.

Here, in the case where an oxide semiconductor film is used for each of the light absorption layer 103 and the semiconductor layer 212 of the transistor 210, light having a wavelength which can be absorbed by the oxide semiconductor film is used as the light 70. However, the conductive layer 221a serving as a reflective electrode is provided between the light absorption layer 103 and the semiconductor layer 212. Therefore, even when part of the light 70 is not absorbed by the light absorption layer 103 and is transmitted, the part of the light 70 is absorbed or reflected by the conductive layer 221a and reaching of the light to the semiconductor layer 112 is suppressed. Even when the light 70 passes through the conductive layer 221a, the light can be reflected or absorbed by the conductive layer 211 because the conductive layer 211 serving as a gate electrode is provided between the conductive layer 221a and the semiconductor layer 212 in the case where the transistor 210 has a bottom-gate structure. Consequently, the electrical characteristics of the transistor 210 are hardly changed.

Figure 10A:
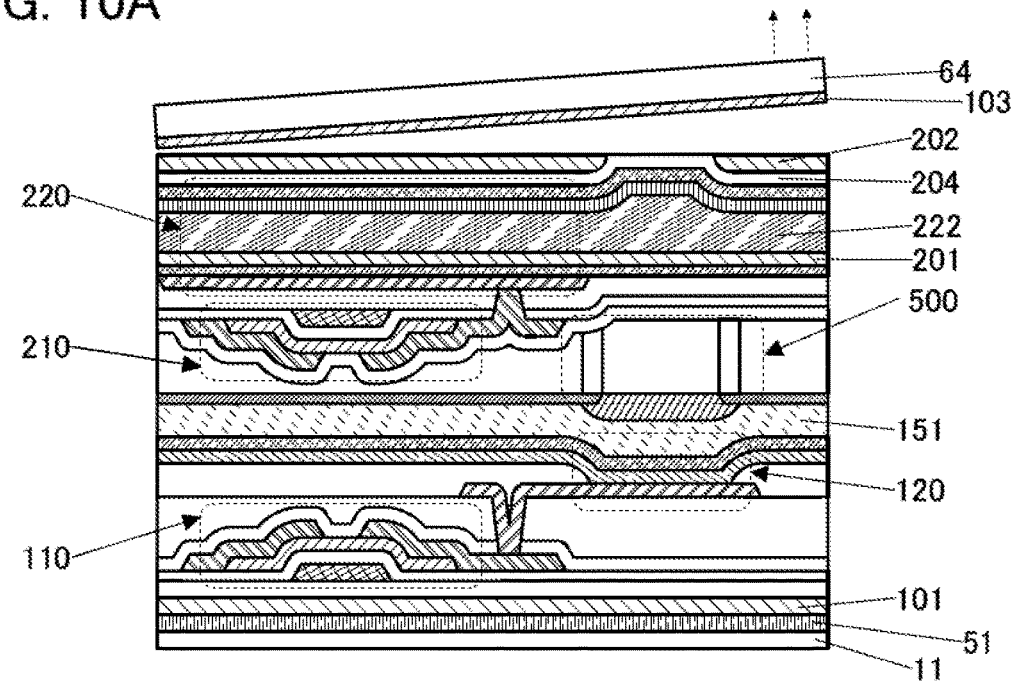
FIGS. 10A and 10B illustrate a method for manufacturing a display device of Embodiment.

Next, the support substrate 64 and the resin layer 202 are separated (FIG. 10A). The above description can be referred to for the separation. FIG. 10A illustrates an example in which separation occurs at the interface between the light absorption layer 103 and the resin layer 202 and the interface between the light absorption layer 103 and the insulating layer 204.

Part of the light absorption layer 103 remains on surfaces of the resin layer 202 and the insulating layer 204 in some cases. For example, this example corresponds to the case where separation (fracture) occurs inside the light absorption layer 103. In the case where separation occurs at the interface between the light absorption layer 103 and the support substrate 64, the light absorption layer 103 entirely remains on the resin layer 202 and the insulating layer 204 in some cases.

The light absorption layer is preferably removed when partly remaining in this manner. Although the remaining light absorption layer can be removed by a dry etching method, a wet etching method, a sandblast method, or the like, it is particularly preferable to employ a dry etching method. Note that in removing the remaining light absorption layer, part of the resin layer 202 and part of the insulating layer 204 are thinned by etching in some cases. The remaining light absorption layer may remain in the case where the light absorption layer 103 is formed using a light-transmitting material or the case where the remaining light absorption layer is thin enough to transmit light.

[Bonding of Substrate 12]

Figure 10B:
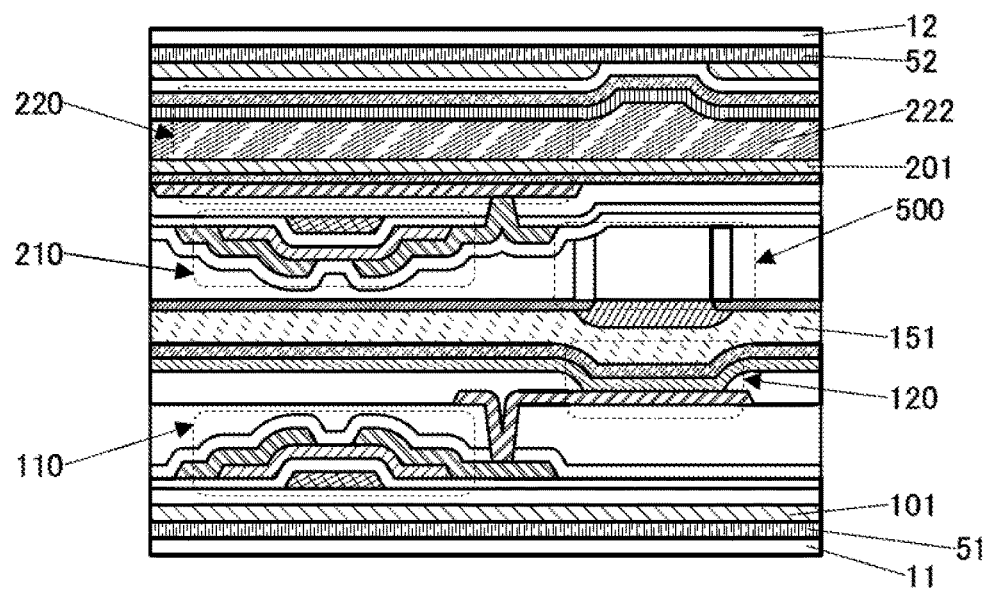

Next, the resin layer 202 and the substrate 12 are bonded to each other with the adhesive layer 52 (FIG. 10B). The description of the adhesive layer 151 can be referred to for the adhesive layer 52.

Since the substrate 12 is located on the viewing side, a material that transmits visible light can be used.

Through the above steps, the display devices 10 illustrated in FIGS. 1A and 1B, FIGS. 2A and 2B, and FIGS. 16A and 16B can be manufactured.

In the display device 10 manufactured according to this embodiment, light from the light-emitting element 120 can be efficiently extracted to the display surface by the light-condensing means 500, a bright image can be displayed, and the display device can have higher display quality. In particular, the display quality can be improved in the second mode or the third mode in which an image is displayed using the light-emitting element 120. Furthermore, when resin substrates are used as the substrates 11 and 12, the display device 10 which is lightweight, is not easily broken, and is bendable can be provided.

Since display can be performed using light of the light-emitting element 120 that is the light source in the second mode, an extremely vivid image with extremely high color reproducibility can be displayed regardless of the illuminance and chromaticity of external light. For example, the second mode is effective in the case where the illuminance of external light is extremely low, such as during the nighttime or in a dark room. When a bright image is displayed under weak external light, a user may feel that the image is too bright. To prevent this, an image with reduced luminance is preferably displayed in the second mode. In that case, not only a reduction in brightness but also low power consumption can be achieved. The second mode is a mode suitable for displaying a vivid image and a smooth moving image, for example. Thus, by providing the light-condensing means 500, a bright image can be displayed in the second mode without change in power consumption. In other words, an image with conventional brightness can be displayed with less power consumption. Furthermore, since an image with conventional brightness can be displayed with a small current value. The application of load to the light-emitting element 120 can be suppressed, which enables a longer lifetime of the light-emitting element 120.

In the third mode, display can be performed using both light of the light-emitting element 120 that is the light source and reflected light. Specifically, the display device is driven so that light emitted from the light-emitting element 120 and light transmitted through the liquid crystal element 220 are mixed to express one color. A vivider image with higher color reproducibility than that in the first mode can be displayed and power consumption can be lower than that in the second mode. For example, the third mode is effective when the illuminance of external light is relatively low, such as under indoor illumination or in the morning or evening, or when the external light does not represent a white chromaticity.

By providing the light-condensing means 500, a large amount of light from the light-emitting element 120 can be extracted also in the third mode; thus, display with low power consumption and improved display quality can be performed regardless of a usage environment.

Embodiment 2

In this embodiment, a display device including a light-condensing means which has a structure different from the structures illustrated in FIGS. 1A and 1B, and a manufacturing method thereof will be described. In this embodiment, the description in Embodiment 1 can be referred to for the description of portions denoted by the same reference numerals as those in Embodiment 1.

FIGS. 11A to 11D correspond to FIGS. 4A to 4F in Embodiment 1 and illustrate steps of forming the element layer 100b. The steps similar to those in FIGS. 4A to 4C in Embodiment 1 are performed to obtain a structure in FIG. 11A.

Figure 11A:
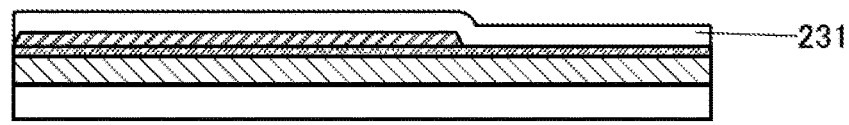
FIGS. 11A to 11D illustrate a method for manufacturing a display device of Embodiment.
Figure 11B:
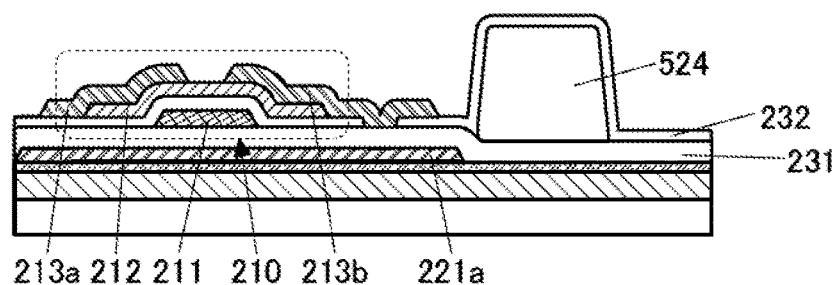

After the insulating layer 231 is formed, an insulator 524 is formed over the insulating layer 231. Then, the insulating layer 232 is formed over the conductive layer 211 and the insulator 524, and the transistor 210 is formed in a manner similar to that illustrated in FIG. 4D in Embodiment 1 (FIG. 11B). The formation order of the conductive layer 211 serving as a gate electrode of the transistor 210 and the insulator 524 may be reversed.

The insulator 524 is formed using a high refractive index material having a light-transmitting property, and the insulating layer 232 is formed using a low refractive index material having a light-transmitting property. Examples of the high refractive index material having a light-transmitting property include SiC, $TiO_2$, ZnS, $CeO_2$, indium tin oxide, polycarbonate, and a polyester resin. Examples of the low refractive index material having a light-transmitting property include silicon oxide, $CaF_2$, $MgF_2$, acrylic, and a fluorine resin.

Figure 11C:
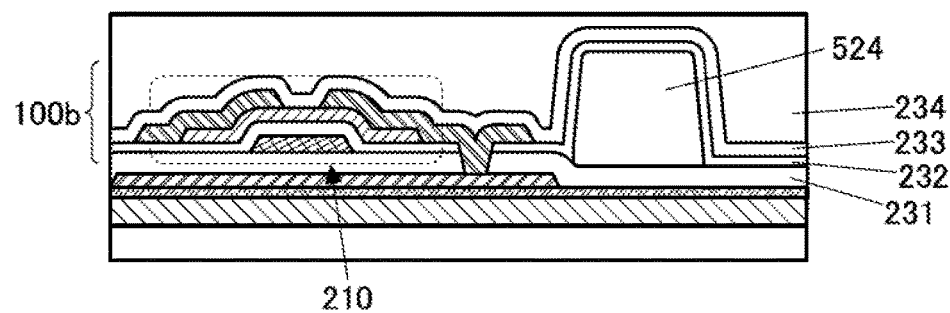

Next, the insulating layer 233 and the insulating layer 234 are formed in this order to cover the transistor 210 and the insulating layer 232. The insulating layer 233 and the insulating layer 234 can be formed by methods similar to those for forming the insulating layer 133 and the insulating layer 134 in Embodiment 1, respectively (FIG. 11C).

After the insulating layer 234 is formed, the insulating layer 234, the insulating layer 233, the insulating layer 232, and the insulator 524 are etched back. A top surface of the insulator 524 is exposed by the etching back process. The etching back process can also serve as a planarization process.

Figure 11D:
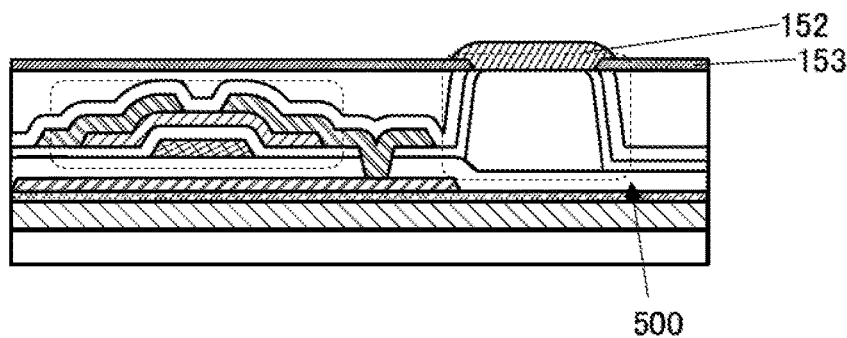

Next, the light-blocking layer 153 and the coloring layer 152 are formed over the insulating layer 234 and the insulator 524 (FIG. 11D).

Figure 12:
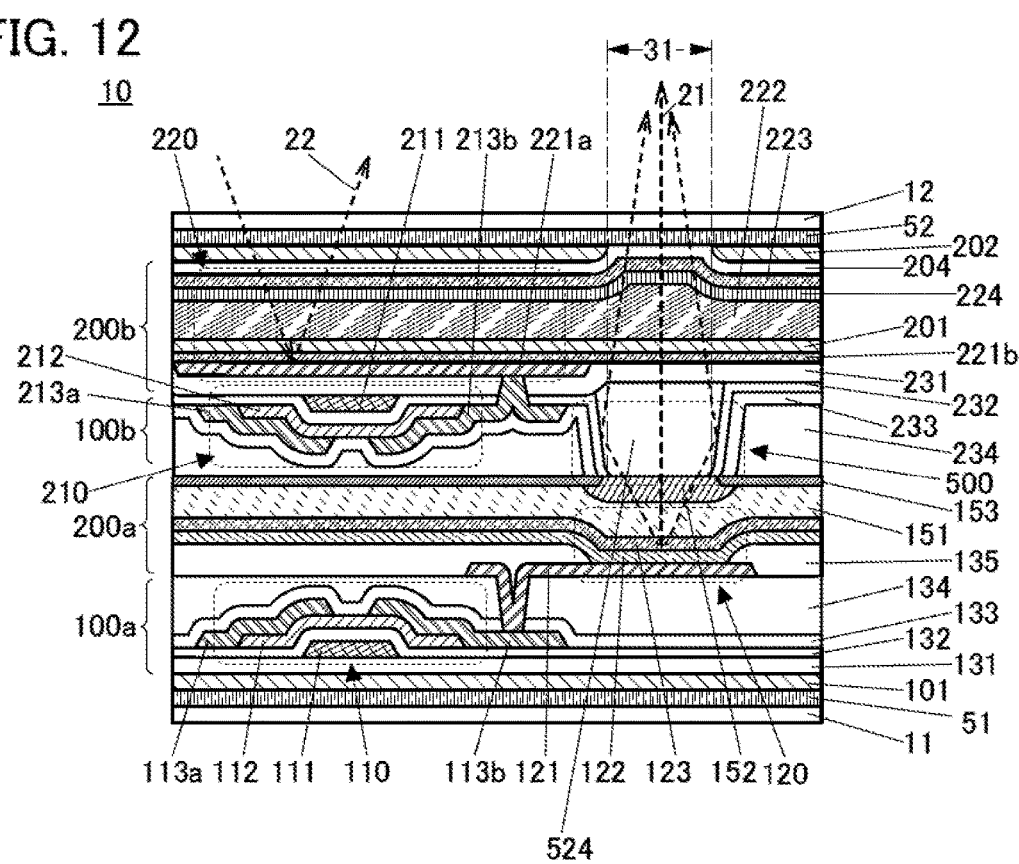
FIG. 12 illustrates a structural example of a display device of Embodiment.

Then, steps similar to those in FIG. 5A to FIG. 10B in Embodiment 1 are carried out, so that the display device 10 illustrated in FIG. 12 can be obtained. In the display device in FIG. 12, total reflection occurs at a boundary between the insulator 524 and the insulating layer 232, and the light-condensing means 500 utilizing total reflection of light is provided.

Although the insulator 524 is formed between the insulating layer 231 and the insulating layer 232 in this embodiment, the insulator 524 may be formed between the insulating layer 232 and the insulating layer 233. Alternatively, the insulator 524 may be formed between the insulating layer 233 and the insulating layer 234. Further alternatively, the insulator 524 may be formed between the conductive layer 221b and the insulating layer 231.

In other words, the light-condensing means 500 including the insulator 524 and any one of the insulating layer 231, the insulating layer 232, the insulating layer 233, and the insulating layer 234 may be provided in the path of the light emitted from the light-emitting element 120 through the opening of the light-blocking layer 153. When total reflection occurs at a boundary between the insulator 524 and the insulating layer (any one of the insulating layers 231, 232, 233, and 234) covering a side surface of the insulator 524, the light 21 can be efficiently condensed and guided to the display surface of the display device. Thus, a bright image can be displayed and the display quality of the display device can be improved.

By providing a metal film on a side surface of the insulator 524 in FIG. 11B, a light-condensing means utilizing reflection on the metal surface may be formed. In that case, after the insulator 524 is formed, a conductive film to be the conductive layer 211 is formed over the insulator 524. At the same time as etching for forming the conductive layer 211, a metal film covering the side surface of the insulator 524 is formed. After that, a step of forming the insulating layer 232 and subsequent steps are performed in a manner similar to that in FIGS. 11B to 11D. Needless to say, the side surface of the insulator 524 may be covered with a metal film using a material different from that of the conductive layer 211.

A light-condensing means in which light that is not totally reflected and passes through the boundary between the insulator 524 and the insulating layer (any one of the insulating layers 231, 232, 233, and 234) covering the side surface of the insulator 524 is reflected by a metal film may be provided. In that case, as in the structures illustrated in FIGS. 16A and 16B, the metal film is provided on an outer surface of the insulating layer covering the side surface of the insulator 524. With such structures, light whose incident angle is smaller than the critical angle is reflected by the metal film, so that light can be condensed to the display surface.

Figure 13A:
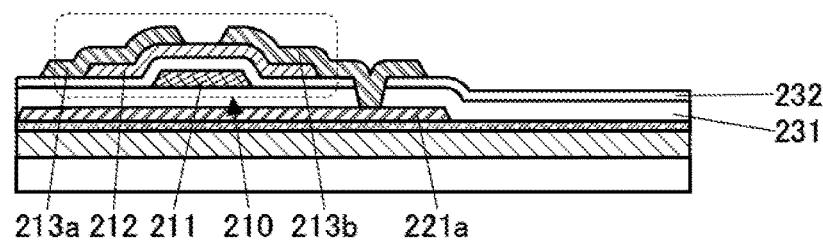
FIGS. 13A to 13E illustrate a method for manufacturing a display device of Embodiment.

Next, a display device including a light-condensing means having another structure and a manufacturing method thereof will be described. Steps similar to those up to and including the step in FIG. 4D in Embodiment 1 are performed to obtain a state illustrated in FIG. 13A.

Figure 13B:
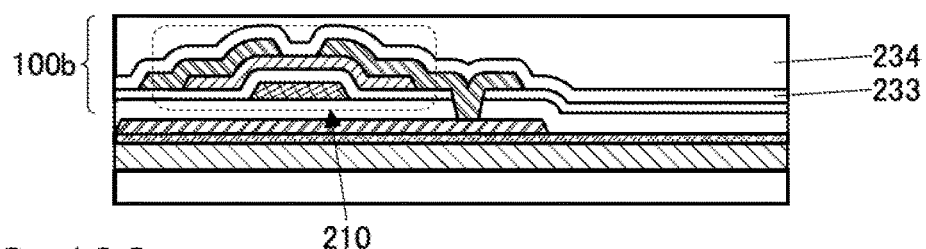

Next, the insulating layer 233 and the insulating layer 234 are formed in this order to cover the transistor 210 (FIG. 13B). The insulating layer 233 and the insulating layer 234 can be formed by methods similar to those for forming the insulating layer 133 and the insulating layer 134 in Embodiment 1, respectively.

Figure 13C:
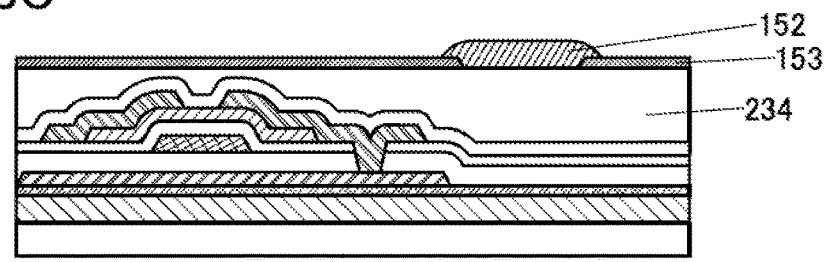

Next, the light-blocking layer 153 and the coloring layer 152 are formed over the insulating layer 234 (FIG. 13C).

Figure 13D:
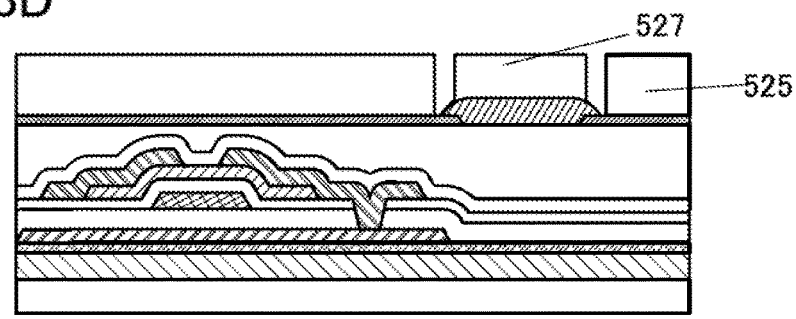
Figure 13E:
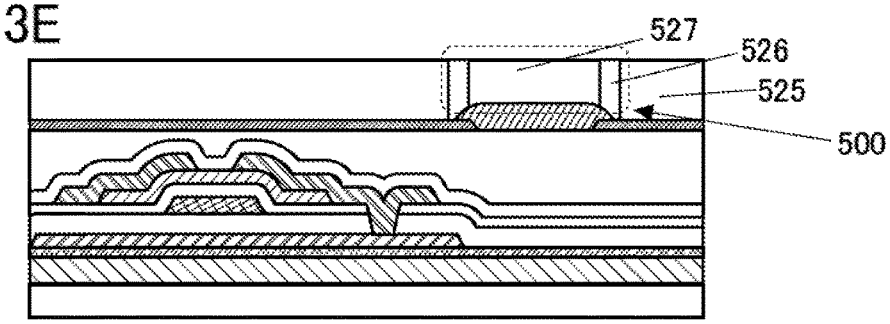

Next, an insulating layer is formed over the light-blocking layer 153 and the coloring layer 152. An opening reaching the coloring layer 152 and the light-blocking layer 153 is formed in the insulating layer. The opening may be formed along a peripheral edge of the coloring layer 152. By forming the opening, the insulating layer 525 and the insulator 527 are obtained (FIG. 13D). After that, an insulator 526 is formed to fill the opening (FIG. 13E). The insulator 527 is formed using a high refractive index material having a light-transmitting property, and the insulator 526 is formed using a low refractive index material having a light-transmitting property. As the high refractive index material and the low refractive index material, materials similar to those of the insulating layer 521 and the insulating layer 520 in Embodiment 1 can be used.

Through the above steps, the light-condensing means 500 including the insulator 526 using a low refractive index material and the insulator 527 using a high refractive index material is formed.

The light-condensing means 500 utilizing reflection on metal as in FIG. 1B is formed in the following manner: the opening is formed in the insulating layer so that the insulating layer 525 and the insulator 527 are obtained; and a metal film is formed in the opening.

The light-condensing means illustrated in FIGS. 16A and 16B may be formed by providing a metal film between the insulating layer 525 and the insulator 526. With such structures, light entering the insulator 526 can be reflected by the metal film and condensed on the display surface side.

Figure 14:
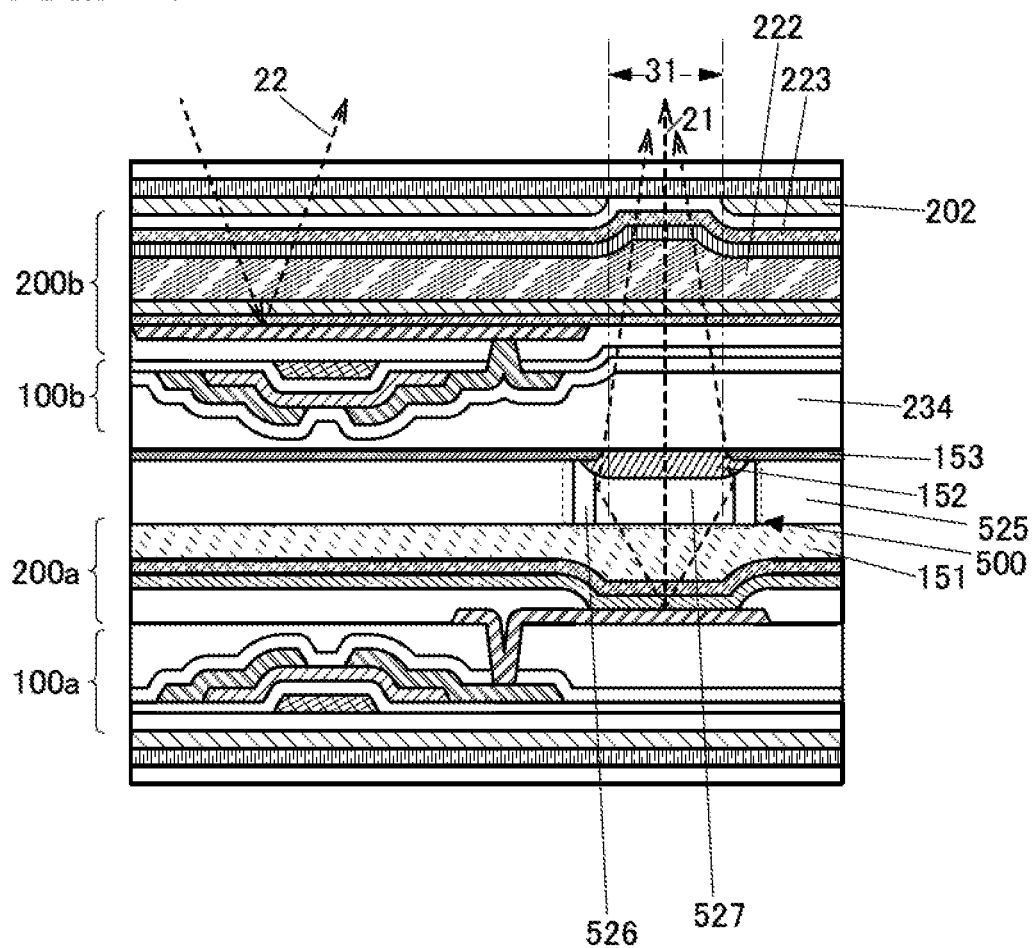
FIG. 14 illustrates a structural example of a display device of Embodiment.

After that, steps similar to those in FIG. 5A to FIG. 10B in Embodiment 1 are performed to obtain the display device 10 illustrated in FIG. 14. In the display device in FIG. 14, the light-condensing means 500 is formed in a newly provided layer between the coloring layer 152 and the adhesive layer 151 instead of the insulating layer in the element layer 100b. The light-condensing means 500 in FIG. 14 utilizes total reflection of light at the boundary between the insulator 526 and the insulator 527. The light-condensing means 500 including a metal film instead of the insulator 526 and utilizing reflection on metal may be formed.

As in FIGS. 2A and 2B in Embodiment 1, the insulator 526 and the insulator 527 may have a tapered shape which gradually becomes narrower from the element layer 200a toward the element layer 100b. A metal film having a tapered shape may be used instead of the insulator 526. With the tapered shape, light can be condensed more efficiently, and a large amount of light can be extracted through the opening in the resin layer 202.

Embodiment 3

The display devices 10 exemplified in Embodiments 1 and 2 each show an example of using bottom-gate transistors as the transistor 110 and the transistor 210.

In each of the transistors 110 in Embodiments 1 and 2, the conductive layer 111 functioning as a gate electrode is located closer to the formation surface (the resin layer 101 side) than the semiconductor layer 112. The insulating layer 132 serving as a gate insulating layer covers the conductive layer 111. The semiconductor layer 112 covers the conductive layer 111. A region of the semiconductor layer 112 that overlaps with the conductive layer 111 corresponds to a channel formation region. The conductive layers 113a and 113b are provided in contact with the top surface and side end portions of the semiconductor layer 112.

Note that in the transistor 110 shown as an example, the width of the semiconductor layer 112 is wider than that of the conductive layer 111. In such a structure, the semiconductor layer 112 is located between the conductive layer 111 and each of the conductive layers 113a and 113b. Thus, the parasitic capacitance between the conductive layer 111 and each of the conductive layers 113a and 113b can be reduced.

The transistor 110 is a channel-etched transistor and can be suitably used for a high-resolution display device because the occupation area of the transistor can be reduced comparatively easily.

The transistor 210 and the transistor 110 have common characteristics.

A structure example of a transistor that can be used for the transistor 110 and the transistor 210 will be described.

Figure 15A:
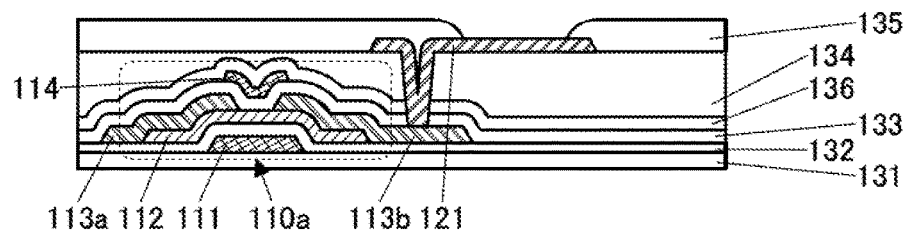
FIGS. 15A to 15E illustrate structure examples of a display device of Embodiment.

A transistor 110a illustrated in FIG. 15A is different from the transistor 110 in that the transistor 110a includes a conductive layer 114 and an insulating layer 136. The conductive layer 114 is provided over the insulating layer 133 and includes a region overlapping with the semiconductor layer 112. The insulating layer 136 covers the conductive layer 114 and the insulating layer 133.

The conductive layer 114 is located to face the conductive layer 111 with the semiconductor layer 112 interposed therebetween. In the case where the conductive layer 111 is used as a first gate electrode, the conductive layer 114 can function as a second gate electrode. By supplying the same potential to the conductive layer 111 and the conductive layer 114, the on-state current of the transistor 110a can be increased. By supplying a potential for controlling the threshold voltage to one of the conductive layer 111 and the conductive layer 114 and a potential for driving to the other, the threshold voltage of the transistor 110a can be controlled.

A conductive material including an oxide is preferably used for the conductive layer 114. In that case, a conductive film to be the conductive layer 114 is formed in an atmosphere containing oxygen, whereby oxygen can be supplied to the insulating layer 133. The proportion of an oxygen gas in a film formation gas is preferably higher than or equal to 90% and lower than or equal to 100%. Oxygen supplied to the insulating layer 133 is supplied to the semiconductor layer 112 by heat treatment to be performed later, so that oxygen vacancies in the semiconductor layer 112 can be reduced.

It is particularly preferable to use, as the conductive layer 114, an oxide semiconductor whose resistance is reduced. In this case, the insulating layer 136 is preferably formed using an insulating film that releases hydrogen, for example, a silicon nitride film. Hydrogen is supplied to the conductive layer 114 during the formation of the insulating layer 136 or by heat treatment to be performed after that, whereby the electrical resistance of the conductive layer 114 can be reduced effectively.

Figure 15B:
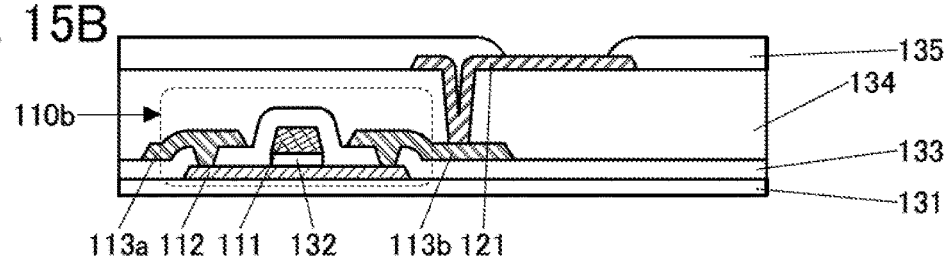

A transistor 110b illustrated in FIG. 15B is a top-gate transistor.

In the transistor 110b, the conductive layer 111 functioning as a gate electrode is provided over the semiconductor layer 112 (provided on the side opposite to the formation surface side). The semiconductor layer 112 is formed over the insulating layer 131. The insulating layer 132 and the conductive layer 111 are stacked over the semiconductor layer 112. The insulating layer 133 covers the top surface and the side end portions of the semiconductor layer 112, side surfaces of the insulating layer 132, and the conductive layer 111. The conductive layers 113a and 113b are provided over the insulating layer 133. The conductive layers 113a and 113b are electrically connected to the top surface of the semiconductor layer 112 through openings provided in the insulating layer 133.

Note that although the insulating layer 132 is not present in a portion that does not overlap with the conductive layer 111 in the example, the insulating layer 132 may be provided in a portion covering the top surface and the side end portion of the semiconductor layer 112.

In the transistor 110b, the physical distance between the conductive layer 111 and the conductive layer 113a or 113b can be easily increased, so that the parasitic capacitance therebetween can be reduced.

Figure 15C:
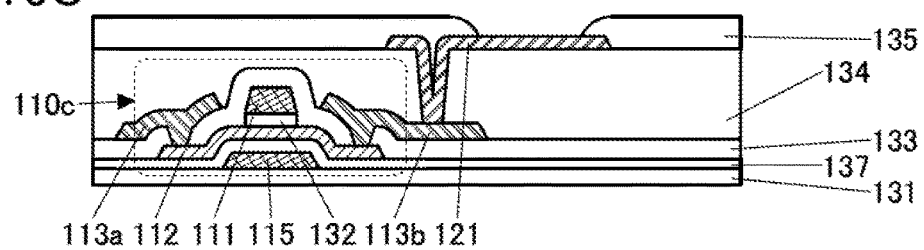

A transistor 110c illustrated in FIG. 15C is different from the transistor 110b in that the transistor 110c includes a conductive layer 115 and an insulating layer 137. The conductive layer 115 is provided over the insulating layer 131 and includes a region overlapping with the semiconductor layer 112. The insulating layer 137 covers the conductive layer 115 and the insulating layer 131.

The conductive layer 115 functions as a second gate electrode like the conductive layer 114. Thus, the on-state current can be increased and the threshold voltage can be controlled, for example.

Figure 15D:
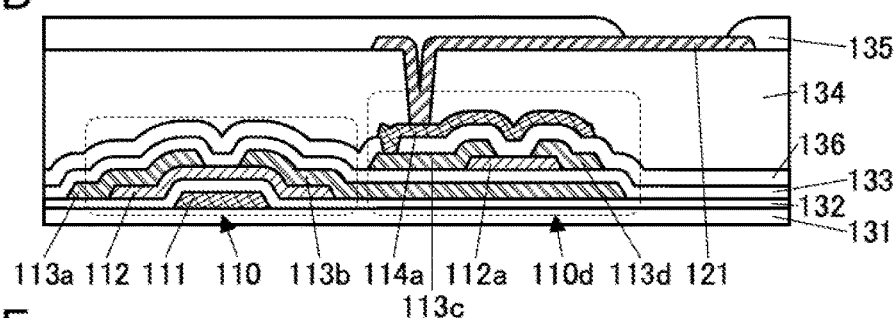

FIG. 15D illustrates a stacked-layer structure of the transistor 110 and a transistor 110d. The transistor 110d is a transistor including a pair of gate electrodes.

The transistor 110d includes part of the conductive layer 113b serving as a first gate electrode, part of the insulating layer 133 serving as a first gate insulating layer, a semiconductor layer 112a, a conductive layer 113c serving as one of a source electrode and a drain electrode, a conductive layer 113d serving as the other of the source electrode and the drain electrode, part of the insulating layer 136 serving as a second gate insulating layer, and a conductive layer 114a serving as a second gate electrode.

Such a structure is particularly suitable to the first element layer 100a. That is, it is preferable to use the transistor 110 as a transistor (also referred to as a switching transistor or a selection transistor) for controlling whether a pixel is selected or not, and to use the transistor 110d as a transistor (also referred to as a driving transistor) for controlling current flowing to the light-emitting element 120.

In the structure illustrated in FIG. 15D, the conductive layer 114a is electrically connected to the conductive layer 113c through an opening formed in the insulating layer 136. The conductive layer 121 is electrically connected to the conductive layer 114a through an opening provided in the insulating layer 134. Here, the capacitance (also referred to as gate capacitance) between the conductive layer 114a and the semiconductor layer 112a can be utilized as a storage capacitor of a pixel.

Figure 15E:
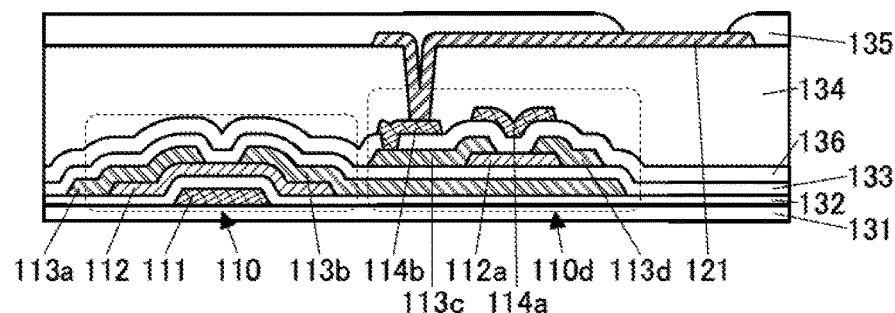

As illustrated in FIG. 15E, a conductive layer 114b functioning as an electrode for connecting the conductive layer 113c and the conductive layer 121 and the conductive layer 114a functioning as a second gate electrode of the transistor 110d may be separately formed. Here, since the conductive layer 114a is not connected to the conductive layer 113c, for example, a potential for controlling a threshold voltage of the transistor 110d may be supplied to the conductive layer 114a, or the conductive layer 114a and the conductive layer 113b functioning as a first gate electrode may be electrically connected to each other and supplied with the same potential.

Instead of the transistors 110 illustrated in FIGS. 1A and 1B and the like, the transistor 110a, the transistor 110b, the transistor 110c, the transistor 110d, or the like can be used. Furthermore, instead of the transistors 210, the transistor 110a, the transistor 110b, the transistor 110c, the transistor 110d, or the like can be used.

In the display device 10, the transistor included in the element layer 100a and the transistor included in the element layer 100b may be different from each other. For example, a transistor including two gate electrodes, e.g., the transistor 110a, the transistor 110c, or the transistor 110d, can be used as the transistor that is electrically connected to the light-emitting element 120 because a comparatively large amount of current needs to be fed to the transistor, and the transistor 110 or the like can be suitably used as the other transistor to reduce the occupation area of the transistor.

The above is the description of the transistor.

At least part of this embodiment can be implemented in appropriate combination with any of the other embodiments described in this specification.

Embodiment 4

In this embodiment, a specific example of a display device of one embodiment of the present invention will be described. A display device described below includes both a reflective liquid crystal element and a light-emitting element. The display device can perform display in a transmission mode and in a reflection mode.

Structure Example

FIG. 17A is a block diagram illustrating an example of the structure of a display device 400. The display device 400 includes a plurality of pixels 410 that are arranged in a matrix in a display portion 362. The display device 400 also includes a circuit GD and a circuit SD. In addition, the display device 400 includes a plurality of wirings G1, a plurality of wirings G2, a plurality of wirings ANO, and a plurality of wirings CSCOM, which are electrically connected to the circuit GD and the plurality of pixels 410 arranged in a direction R. Moreover, the display device 400 includes a plurality of wirings S1 and a plurality of wirings S2, which are electrically connected to the circuit SD and the plurality of pixels 410 arranged in a direction C.

Although the configuration including one circuit GD and one circuit SD is illustrated here for simplicity, the circuit GD and the circuit SD for driving the liquid crystal element and those for driving the light-emitting element may be provided separately. Specifically, the element layers 100a and 100b exemplified in Embodiment 1 may each include a circuit GD and a circuit SD.

The pixel 410 includes a reflective liquid crystal element and a light-emitting element. In the pixel 410, the liquid crystal element and the light-emitting element partly overlap with each other.

FIG. 17B1 illustrates a structure example of a conductive layer 311b included in the pixel 410. The conductive layer 311b serves as a reflective electrode of the liquid crystal element in the pixel 410. The conductive layer 311b includes an opening 451.

In FIG. 17B1, a light-emitting element 360 in a region overlapping with the conductive layer 311b is shown by a dashed line. The light-emitting element 360 overlaps with the opening 451 included in the conductive layer 311b. Thus, light from the light-emitting element 360 is emitted to the display surface side through the opening 451. Therefore, the light-condensing means described in Embodiments 1 and 2 are provided to overlap with the opening 451 or the light-emitting element 360 in FIGS. 17B1 and 17B2. The light-condensing means may have a top surface larger than the opening 451. With such a structure, light from the light-emitting element 360 can be condensed more efficiently by the light-condensing means and extracted through the opening 451.

In FIG. 17B1, the pixels 410 adjacent in the direction R correspond to different emission colors. As illustrated in FIG. 17B1, the openings 451 are preferably provided in different positions in the conductive layers 311b so as not to be aligned in the two pixels adjacent to each other in the direction R. This allows the two adjacent light-emitting elements 360 to be apart from each other, thereby preventing light emitted from the light-emitting element 360 from entering a coloring layer in the adjacent pixel 410 (such a phenomenon is also referred to as "crosstalk"). Furthermore, since the two adjacent light-emitting elements 360 can be arranged apart from each other, a high-resolution display device can be obtained even when EL layers of the light-emitting elements 360 are separately formed with a shadow mask or the like.

Alternatively, arrangement illustrated in FIG. 17B2 may be employed.

The opening 451 may have a polygonal shape, a quadrangular shape, an elliptical shape, a circular shape, a cross-like shape, a stripe shape, a slit-like shape, or a checkered pattern, for example. The opening 451 may be close to the adjacent pixel. Preferably, the opening 451 is provided close to another pixel that emits light of the same color, in which case crosstalk can be suppressed.

The top surface of the light-condensing means described in Embodiments 1 and 2 may have a similar shape to the shape of the opening 451. For example, when the opening 451 has a polygonal shape, the top surface of the light-condensing means has a polygonal shape, and when the opening 451 has a cross-like shape, the top surface of the light-condensing means has a cross-like shape. The area of the top surface of the light-condensing means is the same as or larger than the area of the opening 451. Thus, light from the light-emitting element 360 can be condensed more efficiently by the light-condensing means and extracted through the opening 451. Furthermore, the light-condensing means may be provided across adjacent pixels.

[Circuit Configuration Example]

Figure 18:
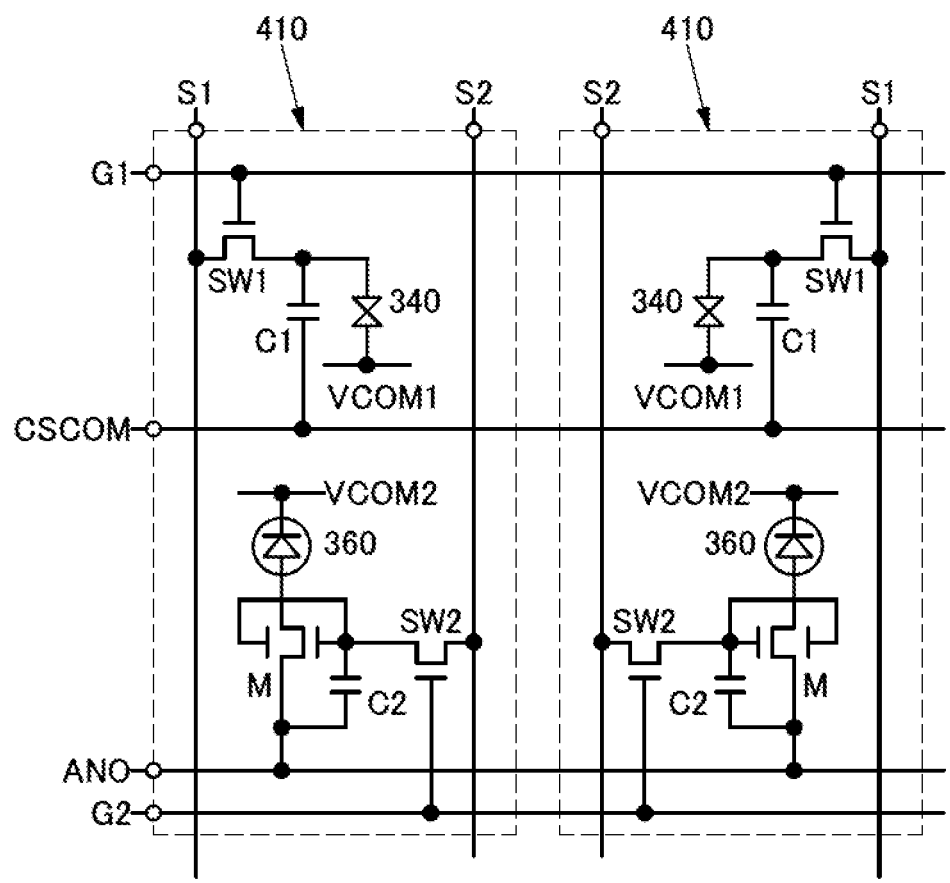
FIG. 18 is a circuit diagram of a display device of Embodiment.

FIG. 18 is a circuit diagram illustrating a configuration example of the pixel 410. FIG. 18 shows two adjacent pixels 410.

The pixel 410 includes a switch SW1, a capacitor C1, a liquid crystal element 340, a switch SW2, a transistor M, a capacitor C2, the light-emitting element 360, and the like. The pixel 410 is electrically connected to the wiring G1, the wiring G2, the wiring ANO, the wiring CSCOM, the wiring S1, and the wiring S2. FIG. 18 also illustrates a wiring VCOM1 electrically connected to the liquid crystal element 340 and a wiring VCOM2 electrically connected to the light-emitting element 360.

FIG. 18 illustrates an example in which a transistor is used as each of the switches SW1 and SW2. The switch SW1 is electrically connected to the liquid crystal element 340 and corresponds to the transistor 210 in Embodiments 1 and 2. The transistor M is electrically connected to the light-emitting element 360 and corresponds to the transistor 110 in Embodiments 1 and 2.

A gate of the switch SW1 is connected to the wiring G1. One of a source and a drain of the switch SW1 is connected to the wiring S1, and the other of the source and the drain is connected to one electrode of the capacitor C1 and one electrode of the liquid crystal element 340. The other electrode of the capacitor C1 is connected to the wiring CSCOM. The other electrode of the liquid crystal element 340 is connected to the wiring VCOM1.

A gate of the switch SW2 is connected to the wiring G2. One of a source and a drain of the switch SW2 is connected to the wiring S2, and the other of the source and the drain is connected to one electrode of the capacitor C2 and a gate of the transistor M. The other electrode of the capacitor C2 is connected to one of a source and a drain of the transistor M and the wiring ANO. The other of the source and the drain of the transistor M is connected to one electrode of the light-emitting element 360. The other electrode of the light-emitting element 360 is connected to the wiring VCOM2.

FIG. 18 illustrates an example in which the transistor M includes two gates between which a semiconductor is provided and which are connected to each other. This structure can increase the amount of current flowing through the transistor M. As a specific structure of the transistor M including two gates, the structure illustrated in FIG. 15A or FIG. 15C in Embodiment 3 can be employed, for example.

The wiring G1 can be supplied with a signal for changing the on/off state of the switch SW1. A predetermined potential can be supplied to the wiring VCOM1. The wiring S1 can be supplied with a signal for changing the orientation of a liquid crystal of the liquid crystal element 340. A predetermined potential can be supplied to the wiring CSCOM.

The wiring G2 can be supplied with a signal for changing the on/off state of the switch SW2. The wiring VCOM2 and the wiring ANO can be supplied with potentials having a difference large enough to make the light-emitting element 360 emit light. The wiring S2 can be supplied with a signal for changing the conduction state of the transistor M.

In the pixel 410 of FIG. 18, for example, an image can be displayed in the reflective mode by driving the pixel with the signals supplied to the wiring G1 and the wiring S1 and utilizing the optical modulation of the liquid crystal element 340. In the case where an image is displayed in the transmissive mode, the pixel is driven with the signals supplied to the wiring G2 and the wiring S2 and the light-emitting element 360 emits light. In the case where both modes are performed at the same time, the pixel can be driven with the signals supplied to the wiring G1, the wiring G2, the wiring S1, and the wiring S2.

Figure 19A:
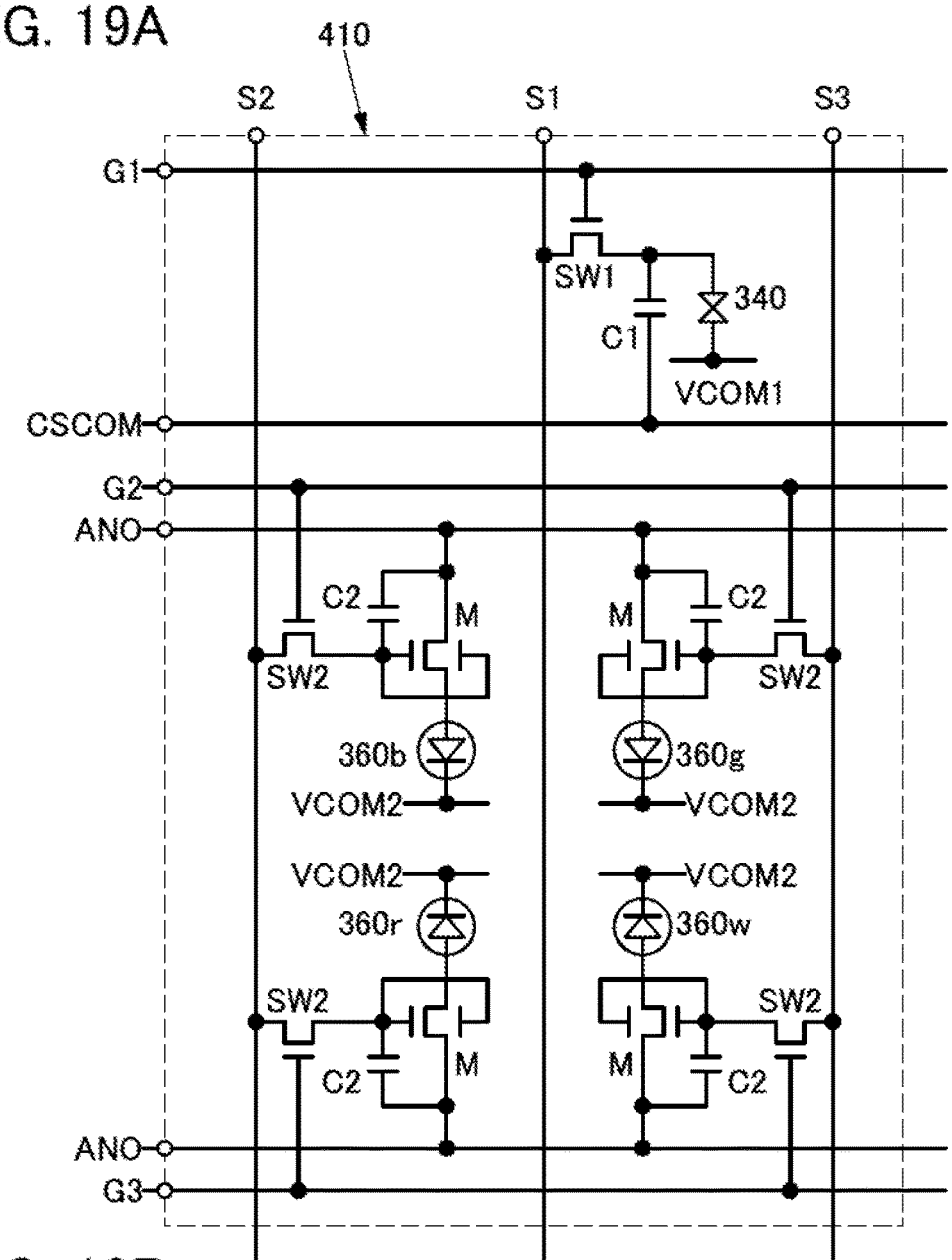
FIGS. 19A and 19B are circuit diagrams of a display device of Embodiment.

Although FIG. 18 illustrates the example in which one pixel 410 includes one liquid crystal element 340 and one light-emitting element 360, one embodiment of the present invention is not limited to this example. FIG. 19A illustrates an example in which one pixel 410 includes one liquid crystal element 340 and four light-emitting elements 360 (light-emitting elements 360r, 360g, 360b, and 360w). The pixel 410 illustrated in FIG. 19A differs from that in FIG. 18 in being capable of performing full-color display by one pixel.

In addition to the example in FIG. 18, a wiring G3 and a wiring S3 are connected to the pixel 410 in FIG. 19A.

In the example illustrated in FIG. 19A, light-emitting elements which exhibit red (R), green (G), blue (B), and white (W) can be used as the four light-emitting elements 360, for example. A reflective liquid crystal element which exhibits white light can be used as the liquid crystal element 340. This enables white display with high reflectance in the reflective mode. This also enables display with excellent color-rendering properties and low power consumption in the transmissive mode.

Figure 19B:
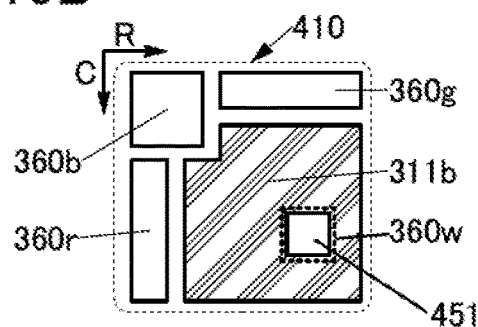

FIG. 19B illustrates a configuration example of the pixel 410. The pixel 410 includes the light-emitting element 360w which overlaps with the opening 451 in the conductive layer 311b and the light-emitting elements 360r, 360g, and 360b which are located near the conductive layer 311b. It is preferable that the light-emitting elements 360r, 360g, and 360b have substantially the same light-emitting area.

In FIG. 19B, the light-condensing means described in Embodiments 1 and 2 is provided to overlap with the opening 451 or the light-emitting element 360w.

[Structure Example of Display Device]

Figure 20:
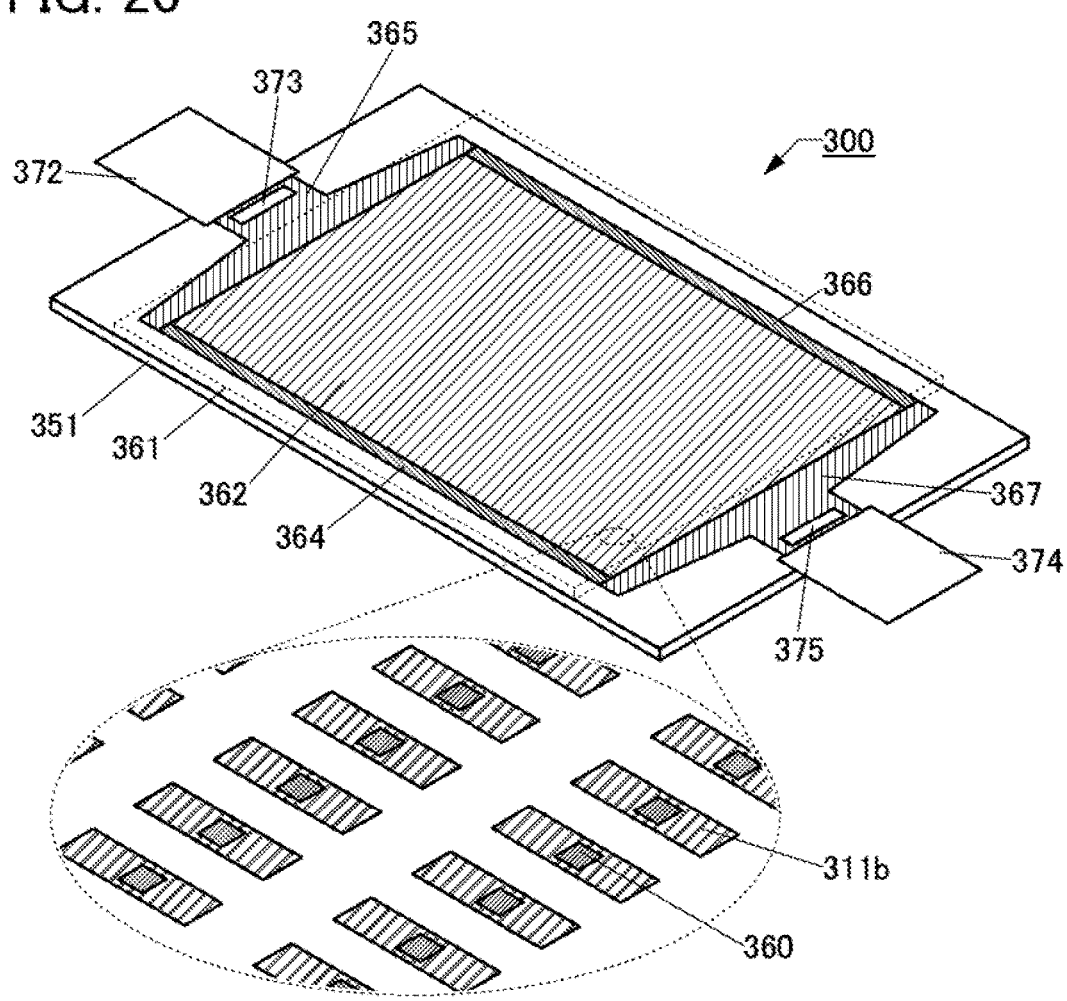
FIG. 20 illustrates a structure example of a display device of Embodiment.

FIG. 20 is a schematic perspective view illustrating a display device 300 of one embodiment of the present invention. In the display device 300, a substrate 351 and a substrate 361 are bonded to each other. In FIG. 20, the substrate 361 is shown by a dashed line.

The display device 300 includes the display portion 362, a circuit portion 364, a wiring 365, a circuit portion 366, a wiring 367, and the like. The substrate 351 is provided with the circuit portion 364, the wiring 365, the circuit portion 366, the wiring 367, the conductive layer 311b functioning as a reflective electrode of a liquid crystal element, and the like. In FIG. 20, an IC 373, an FPC 372, an IC 375, and an FPC 374 are mounted on the substrate 351. Thus, the structure illustrated in FIG. 20 can be referred to as a display module including the display device 300, the IC 373, the FPC 372, the IC 375, and the FPC 374.

For the circuit portion 364, a circuit functioning as a scan line driver circuit can be used, for example.

The wiring 365 has a function of supplying signals and electric power to the display portion and the circuit portion 364. The signals and electric power are input to the wiring 365 from the outside through the FPC 372 or from the IC 373.

FIG. 20 shows an example in which the IC 373 is provided on the substrate 351 by a chip on glass (COG) method or the like. As the IC 373, an IC functioning as a scan line driver circuit, a signal line driver circuit, or the like can be used. Note that it is possible that the IC 373 is not provided, for example, when the display device 300 includes circuits functioning as a scan line driver circuit and a signal line driver circuit and when the circuits functioning as a scan line driver circuit and a signal line driver circuit are provided outside and signals for driving the display device 300 are input through the FPC 372. Alternatively, the IC 373 may be mounted on the FPC 372 by a chip on film (COF) method or the like.

FIG. 20 is an enlarged view of part of the display portion 362. Conductive layers 311b included in a plurality of display elements are arranged in a matrix in the display portion 362. The conductive layer 311b has a function of reflecting visible light and serves as a reflective electrode of the liquid crystal element 340 described later.

As illustrated in FIG. 20, the conductive layer 311b has an opening in the central portion. The light-emitting element 360 is positioned closer to the substrate 351 than the conductive layer 311b. Accordingly, part of the light-emitting element 360 can be exposed through the opening in the conductive layer 311b in FIG. 20. Light is emitted from the light-emitting element 360 to the substrate 361 side through the opening in the conductive layer 311b. Light from the light-emitting element 360 can be condensed more efficiently by the light-condensing means in Embodiments 1 and 2 and extracted through the opening in the conductive layer 311b.

[Cross-Sectional Structure Examples]

Figure 21:
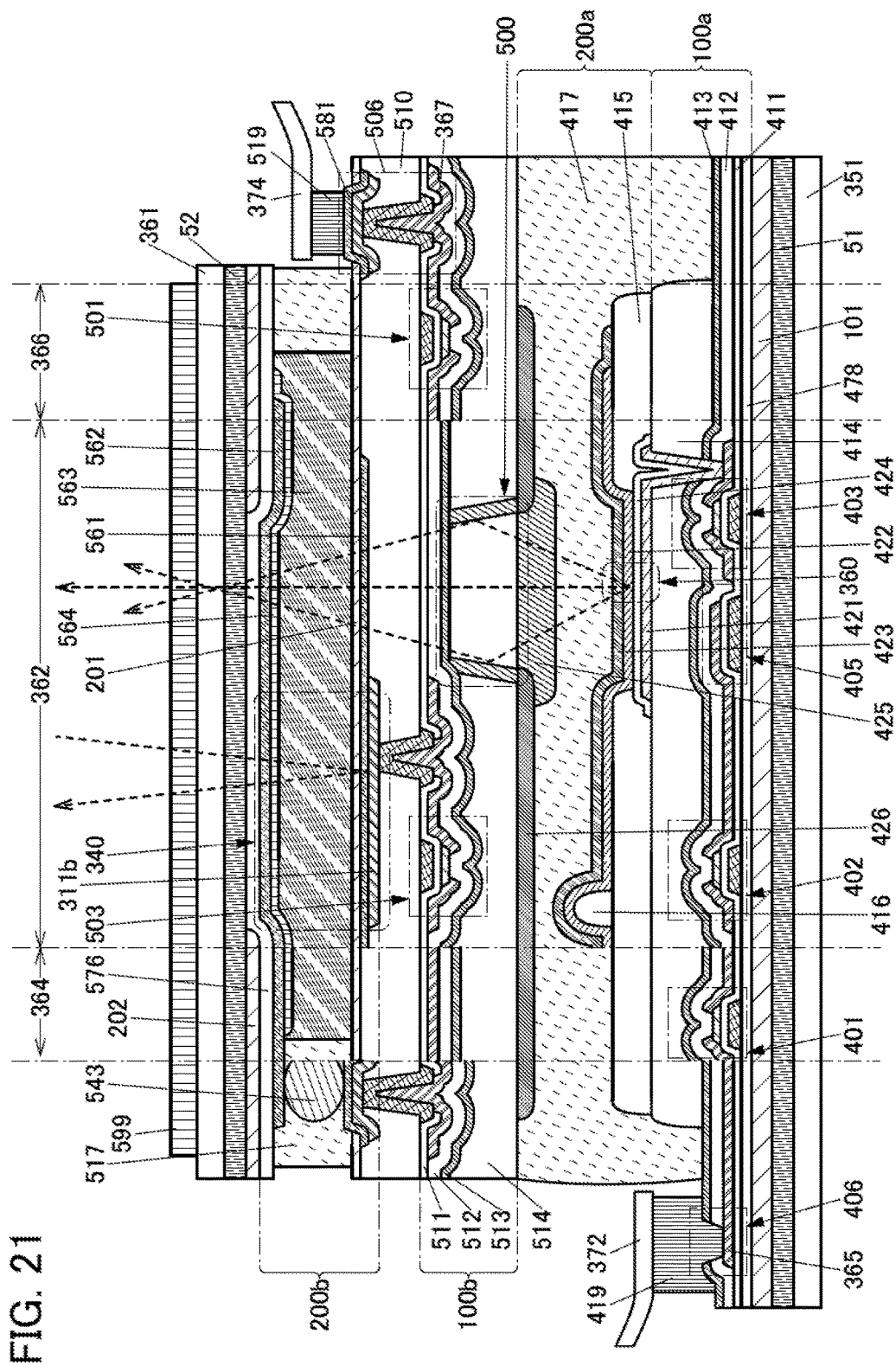
FIG. 21 illustrates a structure example of a display device of Embodiment.

FIG. 21 illustrates an example of cross sections of part of a region including the FPC 372, part of a region including the circuit portion 364, part of a region including the display portion 362, part of a region including the circuit portion 366, and part of a region including the FPC 374 of the display device 300 illustrated in FIG. 20.

The display device illustrated in FIG. 21 has a structure in which the element layer 100a, the element layer 200a, the element layer 100b, and the element layer 200b are stacked in this order from the substrate 351 side. The resin layer 101 is positioned between the element layer 100a and the substrate 351. The resin layer 202 is positioned between the element layer 200b and the substrate 361. The resin layer 101 and the substrate 351 are bonded to each other with the adhesive layer 51. The resin layer 202 and the substrate 361 are bonded to each other with the adhesive layer 52.

[Element Layer 100a and Element Layer 200a]

The element layer 100a includes, over the resin layer 101, an insulating layer 478, a plurality of transistors, a capacitor 405, the wiring 365, an insulating layer 411, an insulating layer 412, an insulating layer 413, an insulating layer 414, and the like. The element layer 200a includes an insulating layer 415, the light-emitting element 360, a spacer 416, a coloring layer 425, a light-blocking layer 426, and the like. The coloring layer 425 and the light-blocking layer 426 are provided on the insulating layer 514 (described later) side, and the insulating layer 514 is bonded to the resin layer 101 side with an adhesive layer 417.

The circuit portion 364 includes a transistor 401. The display portion 362 includes a transistor 402, a transistor 403, and the capacitor 405.

Each of the transistors includes a gate, the insulating layer 411, a semiconductor layer, a source, and a drain. The gate and the semiconductor layer overlap with each other with the insulating layer 411 provided therebetween. Part of the insulating layer 411 functions as a gate insulating layer, and another part of the insulating layer 411 functions as a dielectric of the capacitor 405. A conductive layer that functions as the source or the drain of the transistor 402 also functions as one electrode of the capacitor 405.

The transistors illustrated in FIG. 21 have bottom-gate structures. The transistor structures may be different between the circuit portion 364 and the display portion 362. The circuit portion 364 and the display portion 362 may each include a plurality of kinds of transistors.

The capacitor 405 includes a pair of electrodes and the dielectric therebetween. The capacitor 405 includes a conductive layer that is formed using the same material and the same process as the gates of the transistors 402 and 403, and a conductive layer that is formed using the same material and the same process as the sources and the drains of the transistors 402 and 403.

The insulating layer 412, the insulating layer 413, and the insulating layer 414 are each provided to cover the transistors and the like. There is no particular limitation on the number of the insulating layers covering the transistors and the like. The insulating layer 414 functions as a planarization layer. It is preferred that at least one of the insulating layer 412, the insulating layer 413, and the insulating layer 414 be formed using a material inhibiting diffusion of impurities such as water and hydrogen. Diffusion of impurities from the outside into the transistors can be effectively inhibited, leading to improved reliability of the display device.

In the case of using an organic material for the insulating layer 414, impurities such as moisture might enter the light-emitting element 360 or the like from the outside of the display device through the insulating layer 414 exposed at an end portion of the display device. Deterioration of the light-emitting element 360 due to the entry of impurities can lead to deterioration of the display device. For this reason, the insulating layer 414 is preferably not positioned at the end portion of the display device, as illustrated in FIG. 21. Since an insulating layer formed using an organic material is not positioned at the end portion of the display device in the structure of FIG. 21, entry of impurities into the light-emitting element 360 can be inhibited.

The light-emitting element 360 includes a conductive layer 421, an EL layer 422, and a conductive layer 423. The light-emitting element 360 may include an optical adjustment layer 424. The light-emitting element 360 has a top-emission structure with which light is emitted to the conductive layer 423 side.

The transistors, the capacitor, the wiring, and the like are positioned so as to overlap with a light-emitting region of the light-emitting element 360; accordingly, the aperture ratio of the display portion 362 can be increased.

One of the conductive layer 421 and the conductive layer 423 functions as an anode and the other functions as a cathode. When a voltage higher than the threshold voltage of the light-emitting element 360 is applied between the conductive layer 421 and the conductive layer 423, holes are injected to the EL layer 422 from the anode side and electrons are injected to the EL layer 422 from the cathode side. The injected electrons and holes are recombined in the EL layer 422 and a light-emitting substance contained in the EL layer 422 emits light.

The conductive layer 421 is electrically connected to the source or the drain of the transistor 403 directly or through a conductive layer. The conductive layer 421 functioning as a pixel electrode is provided for each light-emitting element 360. Two adjacent conductive layers 421 are electrically insulated from each other by the insulating layer 415.

The EL layer 422 contains a light-emitting substance.

The conductive layer 423 functioning as a common electrode is shared by a plurality of light-emitting elements 360. A fixed potential is supplied to the conductive layer 423.

The light-emitting element 360 overlaps with the coloring layer 425 with the adhesive layer 417 provided therebetween. The spacer 416 overlaps with the light-blocking layer 426 with the adhesive layer 417 provided therebetween. Although FIG. 21 illustrates the case where a space is provided between the conductive layer 423 and the light-blocking layer 426, the conductive layer 423 and the light-blocking layer 426 may be in contact with each other. Although the spacer 416 is provided on the substrate 351 side in the structure illustrated in FIG. 21, the spacer 416 may be provided on the substrate 361 side (e.g., in a position closer to the substrate 361 than that of the light-blocking layer 426).

Owing to the combination of a color filter (the coloring layer 425) and a microcavity structure (the optical adjustment layer 424), light with high color purity can be extracted from the display device. The thickness of the optical adjustment layer 424 is varied depending on the color of the pixel.

The coloring layer 425 is a coloring layer that transmits light in a specific wavelength range. For example, a color filter for transmitting light in a red, green, blue, or yellow wavelength range can be used.

Note that one embodiment of the present invention is not limited to a color filter method, and a separate coloring method, a color conversion method, a quantum dot method, and the like may be employed.

The light-blocking layer 426 is provided between the adjacent coloring layers 425. The light-blocking layer 426 blocks light emitted from the adjacent light-emitting element 360 to inhibit color mixture between the adjacent light-emitting elements 360. Here, the coloring layer 425 is provided such that its end portion overlaps with the light-blocking layer 426, whereby light leakage can be reduced. For the light-blocking layer 426, a material that blocks light emitted from the light-emitting element 360 can be used. Note that it is preferable to provide the light-blocking layer 426 in a region other than the display portion 362, such as the circuit portion 364, in which case undesired leakage of guided light or the like can be inhibited.

The insulating layer 478 is formed on a surface of the resin layer 101. The insulating layer 513 and the like are formed on the substrate 361 side of the light-emitting element 360. The insulating layer 478 and the insulating layer 513 are preferably highly resistant to moisture. The light-emitting element 360, the transistors, and the like are preferably provided between a pair of insulating layers which are highly resistant to moisture, in which case impurities such as water can be prevented from entering these elements, leading to an increase in the reliability of the display device. Note that an insulating film which is highly resistant to moisture may be provided to cover the coloring layer 425 and the light-blocking layer 426.

Examples of the insulating film highly resistant to moisture include a film containing nitrogen and silicon (e.g., a silicon nitride film and a silicon nitride oxide film) and a film containing nitrogen and aluminum (e.g., an aluminum nitride film). Alternatively, a silicon oxide film, a silicon oxynitride film, an aluminum oxide film, or the like may be used.

For example, the moisture vapor transmission rate of the insulating film highly resistant to moisture is lower than or equal to $1\times10^{-5}$ [g/(m$^2$·day)], preferably lower than or equal to $1\times10^{-6}$ [g/(m$^2$·day)], further preferably lower than or equal to $1\times10^{-7}$ [g/(m$^2$·day)], still further preferably lower than or equal to $1\times10^{-8}$ [g/(m$^2$·day)].

A connection portion 406 includes the wiring 365. The wiring 365 can be formed using the same material and the same process as those of the sources and the drains of the transistors, for example. The connection portion 406 is electrically connected to an external input terminal through which a signal and a potential from the outside are transmitted to the circuit portion 364. Here, an example in which the FPC 372 is provided as the external input terminal is described. The FPC 372 is electrically connected to the connection portion 406 through a connection layer 419.

The connection layer 419 can be formed using any of various kinds of anisotropic conductive films (ACF), anisotropic conductive pastes (ACP), and the like.

The above is the description of the element layers 100a and 200a.

[Element Layer 100b and Element Layer 200b]

The element layer 100b and the element layer 200b are stacked with the insulating layer 510 provided therebetween. The element layers 100b and 200b can be referred to as a reflective liquid crystal display device employing a vertical electric field mode.

The element layer 100b includes a plurality of transistors, a capacitor (not illustrated), the wiring 367, an insulating layer 511, an insulating layer 512, the insulating layer 513, the insulating layer 514, the light-condensing means 500, and the like that are positioned closer to the substrate 351 than the insulating layer 510 is. The element layer 200b includes the liquid crystal element 340, the resin layer 201, an alignment film 564, an adhesive layer 517, an insulating layer 576, and the like that are positioned closer to the substrate 361 than the insulating layer 510 is. Furthermore, the resin layer 202 is provided between the element layer 200b and the adhesive layer 52.

Light from the light-emitting element 360 can be efficiently condensed by the light-condensing means 500 and extracted to the display surface side of the substrate 361. The light-condensing means 500 is provided to overlap with an opening in the light-blocking layer 426. The light-condensing means 500 can have any one of the structures described in Embodiments 1 and 2.

The resin layers 201 and 202 are bonded to each other with the adhesive layer 517. Liquid crystal 563 is sealed in a region surrounded by the resin layer 201, the resin layer 202, and the adhesive layer 517. The polarizing plate 599 is positioned on an outer surface of the substrate 361.

An opening overlapping with the liquid crystal element 340 and the light-emitting element 360 is formed in the resin layer 202. The opening in the resin layer 202 and the light-condensing means 500 preferably overlap with each other because light condensed by the light-condensing means can be extracted to the display surface side without being absorbed by the resin layer 202.

The liquid crystal element 340 includes the conductive layer 311b, a conductive layer 561, a conductive layer 562, and the liquid crystal 563. The conductive layer 311b and the conductive layer 561 are electrically connected to each other and function as a pixel electrode. The conductive layer 562 functions as a common electrode. Alignment of the liquid crystal 563 can be controlled with an electric field generated between the conductive layer 561 and the conductive layer 562. The resin layer 201 functioning as an alignment film is provided between the liquid crystal 563 and the conductive layer 561. The alignment film 564 is provided between the liquid crystal 563 and the conductive layer 562.

The conductive layer 561 and the conductive layer 311b are stacked, and the insulating layer 510 is provided to cover the conductive layer 561 and the conductive layer 311b. A surface of the insulating layer 510 on the substrate 361 side and a surface of the conductive layer 561 on the substrate 361 side are positioned at substantially the same level. The resin layer 201 is provided on surfaces of the insulating layer 510 and the conductive layer 561 on the substrate 361 side. The conductive layer 311b has a function of reflecting visible light and serves as a reflective electrode. The conductive layer 561 has a function of transmitting visible light.

The conductive layer 561 is provided to extend beyond the conductive layer 311b in a plan view. Part of the conductive layer 561 overlaps with the light-emitting element 360. Light from the light-emitting element 360 passes through a portion of the conductive layer 561 that does not overlap with the conductive layer 311b serving as the reflective electrode. In other words, light from the light-emitting element 360 passes through the opening in the conductive layer 311b serving as the reflective electrode. The light-condensing means 500 is provided in the path of the light from the light-emitting element 360. The light-condensing means 500 overlaps with the opening in the conductive layer 311b. The light-condensing means 500 also overlaps with the conductive layer 561.

The insulating layer 576, the conductive layer 562, the alignment film 564, and the like are provided to cover the resin layer 202.

A transistor 501, a transistor 503, a capacitor (not illustrated), the wiring 367, and the like are provided on the substrate 351 side of the insulating layer 510. Insulating layers, e.g., the insulating layer 511, the insulating layer 512, the insulating layer 513, and the insulating layer 514, are provided on the substrate 351 side of the insulating layer 510. The coloring layer 425 and the light-blocking layer 426 are provided on the substrate 351 side of the insulating layer 514.

One of a source and a drain of the transistor 503 is electrically connected to the conductive layer 311b through an opening in the insulating layer 510. FIG. 21 shows an example where the one of the source and the drain of the transistor 503 is electrically connected to the conductive layer 311b through a conductive layer formed by processing the same conductive film as a gate electrode of the transistor 503.

As illustrated in FIG. 21, the conductive layer 311b can have a flat surface on the viewing side even in a contact portion with the one of the source and the drain of the transistor 503. Thus, the contact portion also contributes to display, so that the aperture ratio can be increased.

Note that a portion of the conductive layer functioning as the source or the drain of the transistor 503 which is not electrically connected to the conductive layer 311b may function as part of a signal line. The conductive layer functioning as the gate of the transistor 503 may function as part of a scan line.

FIG. 21 illustrates a structure without a coloring layer as an example of the display portion 362. Thus, the liquid crystal element 340 is an element that performs monochrome display.

FIG. 21 illustrates an example of the circuit portion 366 in which the transistor 501 is provided.

A material inhibiting diffusion of impurities such as water and hydrogen is preferably used for at least one of the insulating layers 512 and 513 which cover the transistors.

Since a reflective liquid crystal display device is used here, a conductive material that reflects visible light is used for the conductive layer 311b and a conductive material that transmits visible light is used for the conductive layer 562.

As the polarizing plate 599, a linear polarizing plate or a circularly polarizing plate can be used. An example of a circularly polarizing plate is a stack including a linear polarizing plate and a quarter-wave retardation plate. Such a structure can reduce reflection of external light. The cell gap, alignment, drive voltage, and the like of the liquid crystal element 340 are controlled in accordance with the kind of the polarizing plate 599 so that desirable contrast is obtained.

The connection portion 506 is provided in a region near an end portion of the resin layer 201. A conductive layer 581 functioning as a terminal is provided in the connection portion 506. The conductive layer 581 is electrically connected to the wiring 367 through the opening in the insulating layer 510. The conductive layer 581 is provided to expose its top surface and is electrically connected to the FPC 374 through a connection layer 519. In the example shown in FIG. 21, part of the wiring 367, a conductive layer obtained by processing the same conductive film as a gate electrode of the transistor, a conductive layer obtained by processing the same conductive film as the conductive layer 311b, and the conductive layer 581 obtained by processing the same conductive film as the conductive layer 561 are stacked to form the connection portion 506.

The top surface of the conductive layer 581 projects above the top surface of the resin layer 201. The conductive layer 581 having such a structure can be formed in the following manner: an opening is formed in the resin layer 201; the conductive layer 581 is formed to fill the opening; the resin layer 201 and the support substrate are separated from each other; and the resin layer 201 is thinned. When the top surface of the conductive layer 581 projects, the exposed surface area is increased, so that adhesion with the connection layer 519 can be enhanced.

The conductive layer 562 is electrically connected to a conductive layer on the resin layer 201 side through a connector 543 in a portion close to an end portion of the resin layer 202. Thus, a potential or a signal can be supplied from the FPC 374, an IC, or the like placed on the resin layer 201 side to the conductive layer 562.

As the connector 543, a conductive particle can be used, for example. As the conductive particle, a particle of an organic resin, silica, or the like coated with a metal material can be used. It is preferable to use nickel or gold as the metal material because contact resistance can be decreased. It is also preferable to use a particle coated with layers of two or more kinds of metal materials, such as a particle coated with nickel and further with gold. As the connector 543, a material capable of elastic deformation or plastic deformation is preferably used. As illustrated in FIG. 21, the connector 543, which is the conductive particle, has a shape that is vertically crushed in some cases. With the crushed shape, the contact area between the connector 543 and a conductive layer electrically connected to the connector 543 can be increased, thereby reducing contact resistance and suppressing the generation of problems such as disconnection.

The connector 543 is preferably provided so as to be covered with the adhesive layer 517. For example, the connectors 543 are dispersed in the adhesive layer 517 before curing of the adhesive layer 517.

Note that the conductive layer 581, the conductive layer 311b, the conductive layer 561, and the like are positioned on the formation surface side of the transistor 503 and the like. Therefore, these conductive layers can also be referred to as rear electrodes.

The above is the description of the element layers 100b and 200b.

[Components]

The above components will be described below.

[Substrate]

A material having a flat surface can be used as the substrate included in the display panel. The substrate on the side from which light from the display element is extracted is formed using a material transmitting the light. For example, a material such as glass, quartz, ceramics, sapphire, or an organic resin can be used.

The weight and thickness of the display panel can be reduced by using a thin substrate. A flexible display panel can be obtained by using a substrate that is thin enough to have flexibility.

Since the substrate through which light is not extracted does not need to have a light-transmitting property, a metal substrate or the like can be used, other than the above-mentioned substrates. A metal substrate, which has high thermal conductivity, is preferable because it can easily conduct heat to the whole substrate and accordingly can prevent a local temperature rise in the display panel. To obtain flexibility and bendability, the thickness of a metal substrate is preferably greater than or equal to 10 μm and less than or equal to 400 μm, more preferably greater than or equal to 20 μm and less than or equal to 50 μm.

Although there is no particular limitation on a material of a metal substrate, it is favorable to use, for example, a metal such as aluminum, copper, and nickel, an aluminum alloy, or an alloy such as stainless steel.

It is possible to use a substrate subjected to insulation treatment, e.g., a metal substrate whose surface is oxidized or provided with an insulating film. The insulating film may be formed by, for example, a coating method such as a spin-coating method or a dipping method, an electrodeposition method, an evaporation method, or a sputtering method. An oxide film may be formed on the substrate surface by exposure to or heating in an oxygen atmosphere or by an anodic oxidation method or the like.

Examples of the material that has flexibility and transmits visible light include glass which is thin enough to have flexibility, polyester resins such as polyethylene terephthalate (PET) and polyethylene naphthalate (PEN), a polyacrylonitrile resin, a polyimide resin, a polymethyl methacrylate resin, a polycarbonate (PC) resin, a polyethersulfone (PES) resin, a polyamide resin, a cycloolefin resin, a polystyrene resin, a polyamide imide resin, a polyvinyl chloride resin, and a polytetrafluoroethylene (PTFE) resin. It is particularly preferable to use a material with a low thermal expansion coefficient, for example, a material with a thermal expansion coefficient lower than or equal to $30\times10^{-6}$/K, such as a polyamide imide resin, a polyimide resin, or PET. A substrate in which a glass fiber is impregnated with an organic resin or a substrate whose thermal expansion coefficient is reduced by mixing an inorganic filler with an organic resin can also be used. A substrate using such a material is lightweight, and thus a display panel using this substrate can also be lightweight.

In the case where a fibrous body is included in the above material, a high-strength fiber of an organic compound or an inorganic compound is used as the fibrous body. The high-strength fiber is specifically a fiber with a high tensile elastic modulus or a fiber with a high Young's modulus. Typical examples thereof include a polyvinyl alcohol-based fiber, a polyester-based fiber, a polyamide-based fiber, a polyethylene-based fiber, an aramid-based fiber, a polyparaphenylene benzobisoxazole fiber, a glass fiber, and a carbon fiber. As the glass fiber, a glass fiber using E glass, S glass, D glass, Q glass, or the like can be used. These fibers may be used in a state of a woven or nonwoven fabric, and a structure body in which this fibrous body is impregnated with a resin and the resin is cured may be used as the flexible substrate. The structure body including the fibrous body and the resin is preferably used as the flexible substrate, in which case the reliability against bending or breaking due to local pressure can be increased.

Alternatively, glass, metal, or the like that is thin enough to have flexibility can be used as the substrate. Alternatively, a composite material where glass and a resin material are bonded to each other with an adhesive layer may be used. When a glass layer is used, a barrier property against water and oxygen can be improved and thus a highly reliable display panel can be provided.

A hard coat layer (e.g., a silicon nitride layer and an aluminum oxide layer) by which a surface of a display panel is protected from damage, a layer (e.g., an aramid resin layer) that can disperse pressure, or the like may be stacked over the flexible substrate. Furthermore, to suppress a decrease in lifetime of the display element due to moisture and the like, an insulating film with low water permeability may be stacked over the flexible substrate. For example, an inorganic insulating material such as silicon nitride, silicon oxynitride, silicon nitride oxide, aluminum oxide, or aluminum nitride can be used.

[Transistor]

The transistor includes a conductive layer serving as a gate electrode, a semiconductor layer, a conductive layer serving as a source electrode, a conductive layer serving as a drain electrode, and an insulating layer serving as a gate insulating layer. In the above, a bottom-gate transistor is used.

Note that there is no particular limitation on the structure of the transistor included in the display device of one embodiment of the present invention. For example, a planar transistor, a staggered transistor, or an inverted staggered transistor can be used. A top-gate transistor or a bottom-gate transistor may be used. Gate electrodes may be provided above and below a channel.

There is no particular limitation on the crystallinity of a semiconductor material used for the transistors, and an amorphous semiconductor or a semiconductor having crystallinity (a microcrystalline semiconductor, a polycrystalline semiconductor, a single crystal semiconductor, or a semiconductor partly including crystal regions) may be used. It is preferred that a semiconductor having crystallinity be used, in which case deterioration of the transistor characteristics can be suppressed.

As the semiconductor material used for the transistor, an oxide semiconductor can be used. Typically, an oxide semiconductor containing indium can be used.

In particular, a semiconductor material having a wider band gap and a lower carrier density than silicon is preferably used because off-state current of the transistor can be reduced.

In a transistor with an oxide semiconductor whose band gap is larger than the band gap of silicon, charges stored in a capacitor that is connected in series to the transistor can be held for a long time, owing to the low off-state current of the transistor. When such a transistor is used for a pixel, operation of a driver circuit can be stopped while a gray scale of each pixel is maintained. As a result, a display device with extremely low power consumption is obtained.

The semiconductor layer preferably includes, for example, a film represented by an In-M-Zn-based oxide that contains at least indium, zinc, and M (a metal such as aluminum, titanium, gallium, germanium, yttrium, zirconium, lanthanum, cerium, tin, neodymium, or hafnium). In order to reduce variations in electrical characteristics of the transistor including the oxide semiconductor, the oxide semiconductor preferably contains a stabilizer in addition to In, Zn, and M.

As examples of the stabilizer, in addition to the above metals that can be used as M, lanthanoid such as praseodymium, samarium, europium, gadolinium, terbium, dysprosium, holmium, erbium, thulium, ytterbium, or lutetium can be given.

As an oxide semiconductor included in the semiconductor layer, any of the following can be used, for example: an In—Ga—Zn-based oxide, an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, and an In—Hf—Al—Zn-based oxide.

Note that here, an "In—Ga—Zn-based oxide" means an oxide containing In, Ga, and Zn as its main components and there is no limitation on the ratio of In:Ga:Zn. Furthermore, a metal element in addition to In, Ga, and Zn may be contained.

The semiconductor layer and the conductive layer may include the same metal elements contained in the above oxides. The use of the same metal elements for the semiconductor layer and the conductive layer can reduce the manufacturing cost. For example, the use of metal oxide targets with the same metal composition can reduce the manufacturing cost. In addition, the same etching gas or the same etchant can be used in processing the semiconductor layer and the conductive layer. Note that even when the semiconductor layer and the conductive layer include the same metal elements, they have different compositions in some cases. For example, a metal element in a film is released during the manufacturing process of the transistor and the capacitor, which might result in different metal compositions.

The energy gap of the oxide semiconductor included in the semiconductor layer is preferably 2 eV or more, further preferably 2.5 eV or more, still further preferably 3 eV or more. The use of such an oxide semiconductor having a wide energy gap leads to a reduction in off-state current of a transistor.

In the case where the oxide semiconductor contained in the semiconductor layer is an In-M-Zn-based oxide, it is preferable that the atomic ratio of metal elements of a sputtering target used to deposit a film of the In-M-Zn oxide satisfy In≥M and Zn≥M The atomic ratio of metal elements in such a sputtering target is preferably, for example, In:M:Zn=1:1:1, In:M:Zn=1:1:1.2, In:M:Zn=3:1:2, In:M:Zn=4:2:3, In:M:Zn=4:2:4.1, In:M:Zn=5:1:6, In:M:Zn=5:1:7, or In:M:Zn=5:1:8. Note that the atomic ratio of metal elements in the formed semiconductor layer varies from the above atomic ratios of metal elements of the sputtering targets in a range of ±40%.

The bottom-gate transistor described in this embodiment is preferable because the number of manufacturing steps can be reduced. When an oxide semiconductor, which can be formed at a lower temperature than polycrystalline silicon, is used, materials with low heat resistance can be used for a wiring, an electrode, or a substrate below the semiconductor layer, so that the range of choices of materials can be widened. For example, an extremely large glass substrate can be favorably used.

[Conductive Layer]

As materials for the gates, the source, and the drain of a transistor, and the conductive layers serving as the wirings and electrodes included in the display device, any of metals such as aluminum, titanium, chromium, nickel, copper, yttrium, zirconium, molybdenum, silver, tantalum, and tungsten, or an alloy containing any of these metals as its main component can be used. A single-layer structure or a layered structure including a film containing any of these materials can be used. For example, the following structures can be given: a single-layer structure of an aluminum film containing silicon, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a copper film is stacked over a titanium film, a two-layer structure in which a copper film is stacked over a tungsten film, a three-layer structure in which a titanium film or a titanium nitride film, an aluminum film or a copper film, and a titanium film or a titanium nitride film are stacked in this order, and a three-layer structure in which a molybdenum film or a molybdenum nitride film, an aluminum film or a copper film, and a molybdenum film or a molybdenum nitride film are stacked in this order. Note that an oxide such as indium oxide, tin oxide, or zinc oxide may be used. Copper containing manganese is preferably used because controllability of a shape by etching is increased.

A conductive material that transmits visible light or a conductive material that reflects visible light can be used for a conductive layer (a conductive layer serving as a pixel electrode or a common electrode) in a display element (a liquid crystal element, a light-emitting element, or another display element).

For example, a material containing one of indium, zinc, and tin is preferably used as the conductive material that transmits visible light. Specifically, indium oxide, indium tin oxide, indium zinc oxide, indium oxide containing tungsten oxide, indium zinc oxide containing tungsten oxide, indium oxide containing titanium oxide, indium tin oxide containing titanium oxide, indium tin oxide containing silicon oxide, zinc oxide, and zinc oxide containing gallium are given, for example. Alternatively, a film of a metal material such as gold, silver, platinum, magnesium, nickel, tungsten, chromium, molybdenum, iron, cobalt, copper, palladium, or titanium; an alloy containing any of these metal materials; or a nitride of any of these metal materials (e.g., titanium nitride) can be formed thin so as to have a light-transmitting property. Alternatively, a stacked film of any of the above materials can be used for the conductive layer. For example, a stacked film of indium tin oxide and an alloy of silver and magnesium is preferably used, in which case conductivity can be increased. Note that a film including graphene can be used as well. The film including graphene can be formed, for example, by reducing a film containing graphene oxide.

Examples of a conductive material that reflects visible light include aluminum, silver, and an alloy containing any of these metal materials. Furthermore, a metal material such as gold, platinum, nickel, tungsten, chromium, molybdenum, iron, cobalt, copper, or palladium or an alloy containing any of these metal materials can be used. Furthermore, lanthanum, neodymium, germanium, or the like may be added to the metal material or the alloy. Furthermore, an alloy containing aluminum (an aluminum alloy) such as an alloy of aluminum and titanium, an alloy of aluminum and nickel, an alloy of aluminum and neodymium, or an alloy of aluminum, nickel, and lanthanum (Al—Ni—La); or an alloy containing silver such as an alloy of silver and copper, an alloy of silver, palladium, and copper (also referred to as Ag—Pd—Cu or APC), or an alloy of silver and magnesium may be used. An alloy containing silver and copper is preferable because of its high heat resistance. Furthermore, when a metal film or a metal oxide film is stacked in contact with an aluminum film or an aluminum alloy film, oxidation can be suppressed. Examples of a material for the metal film or the metal oxide film include titanium and titanium oxide. Alternatively, the above conductive film that transmits visible light and a film containing a metal material may be stacked. For example, a stack of silver and indium tin oxide, a stack of indium tin oxide and an alloy of silver and magnesium, or the like can be used.

The conductive layers may each be formed by an evaporation method or a sputtering method. Alternatively, a discharging method such as an inkjet method, a printing method such as a screen printing method, or a plating method may be used.

[Insulating Layer]

As an insulating material that can be used for the insulating layers, polyimide, acrylic, epoxy, a silicone resin, or an inorganic insulating material such as silicon oxide, silicon oxynitride, silicon nitride oxide, silicon nitride, or aluminum oxide can be used.

The light-emitting element is preferably provided between a pair of insulating films with low water permeability, in which case entry of impurities such as water into the light-emitting element can be inhibited. Thus, a decrease in device reliability can be suppressed.

As an insulating film with low water permeability, a film containing nitrogen and silicon, such as a silicon nitride film or a silicon nitride oxide film, a film containing nitrogen and aluminum, such as an aluminum nitride film, or the like can be used. Alternatively, a silicon oxide film, a silicon oxynitride film, an aluminum oxide film, or the like may be used.

For example, the amount of water vapor transmission of the insulating film with low water permeability is lower than or equal to $1\times10^{-5}$ [g/(m$^2$·day)], preferably lower than or equal to $1\times10^{-6}$ [g/(m$^2$·day)], further preferably lower than or equal to $1\times10^{-7}$ [g/(m$^2$·day)], still further preferably lower than or equal to $1\times10^{-8}$ [g/(m$^2$·day)].

[Display Element]

As a display element included in the first pixel located on the display surface side, an element which performs display by reflecting external light can be used. Such an element does not include a light source and thus power consumption in display can be significantly reduced. As a typical example of the display element included in the first pixel, a reflective liquid crystal element can be given. Alternatively, as the display element included in the first pixel, an element using a microcapsule method, an electrophoretic method, an electrowetting method, an Electronic Liquid Powder (registered trademark) method, or the like can be used, other than a microelectromechanical systems (MEMS) shutter element or an optical interference type MEMS element.

As a display element included in the second pixel located on the side opposite to the display surface side, an element which includes a light source and performs display using light from the light source can be used. Since the luminance and the chromaticity of light emitted from such a pixel are not affected by external light, an image with high color reproducibility (a wide color gamut) and a high contrast, i.e., a clear image can be displayed. As the display element included in the second pixel, a self-luminous light-emitting element such as an organic light-emitting diode (OLED), a light-emitting diode (LED), or a quantum-dot light-emitting diode (QLED) can be used. Alternatively, a combination of a backlight as a light source and a transmissive liquid crystal element which controls the amount of transmitted light emitted from a backlight may be used as the display element included in the second pixel.

[Liquid Crystal Element]

The liquid crystal element can employ, for example, a vertical alignment (VA) mode. Examples of the vertical alignment mode include a multi-domain vertical alignment (MVA) mode, a patterned vertical alignment (PVA) mode, and an advanced super view (ASV) mode.

The liquid crystal element can employ a variety of modes; for example, other than the VA mode, a twisted nematic (TN) mode, an in-plane switching (IPS) mode, a fringe field switching (FFS) mode, an axially symmetric aligned microcell (ASM) mode, an optically compensated birefringence (OCB) mode, a ferroelectric liquid crystal (FLC) mode, or an antiferroelectric liquid crystal (AFLC) mode can be used.

The liquid crystal element controls transmission or non-transmission of light utilizing an optical modulation action of liquid crystal. Note that the optical modulation action of liquid crystal is controlled by an electric field applied to the liquid crystal (including a horizontal electric field, a vertical electric field, and an oblique electric field). As the liquid crystal used for the liquid crystal element, thermotropic liquid crystal, low-molecular liquid crystal, high-molecular liquid crystal, polymer dispersed liquid crystal (PDLC), ferroelectric liquid crystal, anti-ferroelectric liquid crystal, or the like can be used. These liquid crystal materials exhibit a cholesteric phase, a smectic phase, a cubic phase, a chiral nematic phase, an isotropic phase, or the like depending on conditions.

As the liquid crystal material, either a positive liquid crystal or a negative liquid crystal may be used, and an appropriate liquid crystal material can be used depending on the mode or design to be used.

An alignment film can be provided to adjust the alignment of liquid crystal. In the case where a horizontal electric field mode is employed, liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase appears only in a narrow temperature range, a liquid crystal composition in which several weight percent or more of a chiral material is mixed is used for the liquid crystal layer in order to improve the temperature range. The liquid crystal composition which includes liquid crystal exhibiting a blue phase and a chiral material has a short response time and has optical isotropy. In addition, the liquid crystal composition which includes liquid crystal exhibiting a blue phase and a chiral material does not need alignment treatment and has a small viewing angle dependence. An alignment film is not necessarily provided and rubbing treatment is thus not necessary; accordingly, electrostatic discharge damage caused by the rubbing treatment can be prevented and defects and damage of the liquid crystal display device in the manufacturing process can be reduced.

In one embodiment of the present invention, in particular, the reflective liquid crystal element can be used. In the reflective liquid crystal element, an electrode on the viewing side can be formed using a conductive material that transmits visible light and an electrode on the side opposite to the viewing side can be formed using a conductive material that reflects visible light.

In the case where a reflective liquid crystal element is used, a polarizing plate is provided on the display surface side. In addition, a light diffusion plate is preferably provided on the display surface side to improve visibility.

[Light-Emitting Element]

As the light-emitting element, a self-luminous element can be used, and an element whose luminance is controlled by current or voltage is included in the category of the light-emitting element. For example, an LED, a QLED, an organic EL element, or an inorganic EL element can be used.

In one embodiment of the present invention, in particular, the light-emitting element preferably has a top emission structure. The conductive material that transmits visible light is used for the electrode through which light is extracted. The conductive material that reflects visible light is preferably used for the electrode through which light is not extracted.

The EL layer includes at least a light-emitting layer. In addition to the light-emitting layer, the EL layer may further include one or more layers containing any of a substance with a high hole-injection property, a substance with a high hole-transport property, a hole-blocking material, a substance with a high electron-transport property, a substance with a high electron-injection property, a substance with a bipolar property (a substance with a high electron- and hole-transport property), and the like.

For the EL layer, either a low-molecular compound or a high-molecular compound can be used, and an inorganic compound may also be used. Each of the layers included in the EL layer can be formed by any of the following methods: an evaporation method (including a vacuum evaporation method), a transfer method, a printing method, an inkjet method, a coating method, and the like.

When a voltage higher than the threshold voltage of the light-emitting element is applied between a cathode and an anode, holes are injected to the EL layer from the anode side and electrons are injected to the EL layer from the cathode side. The injected electrons and holes are recombined in the EL layer and a light-emitting substance contained in the EL layer emits light.

In the case where a light-emitting element emitting white light is used as the light-emitting element, the EL layer preferably contains two or more kinds of light-emitting substances. For example, the two or more kinds of light-emitting substances are selected so as to emit light of complementary colors to obtain white light emission. Specifically, it is preferable to contain two or more selected from light-emitting substances that emit light of red (R), green (G), blue (B), yellow (Y), orange (O), and the like and light-emitting substances that emit light containing two or more of spectral components of R, G, and B. The light-emitting element preferably emits light with a spectrum having two or more peaks in the wavelength range of a visible light region (e.g., greater than or equal to 350 nm and less than or equal to 750 nm). An emission spectrum of a material that emits light having a peak in a yellow wavelength range preferably includes spectral components also in green and red wavelength ranges.

A light-emitting layer containing a light-emitting material that emits light of one color and a light-emitting layer containing a light-emitting material that emits light of another color are preferably stacked in the EL layer. For example, the plurality of light-emitting layers in the EL layer may be stacked in contact with each other or may be stacked with a region not including any light-emitting material therebetween. For example, between a fluorescent layer and a phosphorescent layer, a region containing the same material as one in the fluorescent layer or the phosphorescent layer (for example, a host material or an assist material) and no light-emitting material may be provided. This facilitates the manufacture of the light-emitting element and reduces the drive voltage.

The light-emitting element may be a single element including one EL layer or a tandem element in which a plurality of EL layers are stacked with a charge generation layer therebetween.

Note that the aforementioned light-emitting layer and layers containing a substance with a high hole-injection property, a substance with a high hole-transport property, a substance with a high electron-transport property, a substance with a high electron-injection property, a substance with a bipolar property, and the like may include an inorganic compound such as a quantum dot or a high molecular compound (e.g., an oligomer, a dendrimer, and a polymer). For example, when used for the light-emitting layer, the quantum dot can function as a light-emitting material.

The quantum dot may be a colloidal quantum dot, an alloyed quantum dot, a core-shell quantum dot, a core quantum dot, or the like. A quantum dot containing elements belonging to Groups 12 and 16, elements belonging to Groups 13 and 15, or elements belonging to Groups 14 and 16 may be used. Alternatively, a quantum dot containing an element such as cadmium, selenium, zinc, sulfur, phosphorus, indium, tellurium, lead, gallium, arsenic, or aluminum may be used.

The above-described materials can be used as the conductive material that transmits visible light and the conductive material that reflects visible light, which can be used for the electrodes of the light-emitting element.

[Adhesive Layer]

As the adhesive layer, any of a variety of curable adhesives, e.g., a photo-curable adhesive such as an ultraviolet curable adhesive, a reactive curable adhesive, a thermosetting curable adhesive, and an anaerobic adhesive can be used. Examples of these adhesives include an epoxy resin, an acrylic resin, a silicone resin, a phenol resin, a polyimide resin, an imide resin, a polyvinyl chloride (PVC) resin, a polyvinyl butyral (PVB) resin, and an ethylene vinyl acetate (EVA) resin. In particular, a material with low moisture permeability, such as an epoxy resin, is preferred. Alternatively, a two-component-mixture-type resin may be used. Still alternatively, an adhesive sheet or the like may be used.

Furthermore, the resin may include a drying agent. For example, a substance that adsorbs moisture by chemical adsorption, such as oxide of an alkaline earth metal (e.g., calcium oxide or barium oxide), can be used. Alternatively, a substance that adsorbs moisture by physical adsorption, such as zeolite or silica gel, may be used. The drying agent is preferably included because it can inhibit entry of impurities such as moisture into an element, leading to an improvement in the reliability of the display panel.

In addition, a filler with a high refractive index or a light-scattering member may be mixed into the resin, in which case light extraction efficiency can be improved. For example, titanium oxide, barium oxide, zeolite, or zirconium can be used.

[Connection Layer]

As a connection layer, an anisotropic conductive film (ACF), an anisotropic conductive paste (ACP), or the like can be used.

[Coloring Layer]

Examples of materials that can be used for the coloring layer include a metal material, a resin material, and a resin material containing a pigment or dye.

[Light-Blocking Layer]

Examples of a material that can be used for the light-blocking layer include carbon black, titanium black, a metal, a metal oxide, and a composite oxide containing a solid solution of a plurality of metal oxides. The light-blocking layer may be a film containing a resin material or a thin film of an inorganic material such as a metal. Stacked films containing the material of the coloring layer can also be used for the light-blocking layer. For example, a stacked-layer structure of a film containing a material of a coloring layer which transmits light of a certain color and a film containing a material of a coloring layer which transmits light of another color can be employed. It is preferred that the coloring layer and the light-blocking layer be formed using the same material because the same manufacturing apparatus can be used and the process can be simplified.

The above is the description of each of the components.

Modification Example

Structure examples which partly differ from the display device described in the above cross-sectional structure example will be described below. Note that the description of the portions already described above is omitted and only different portions are described.

Modification Example 1 of Cross-Sectional Structure Example

Figure 22:
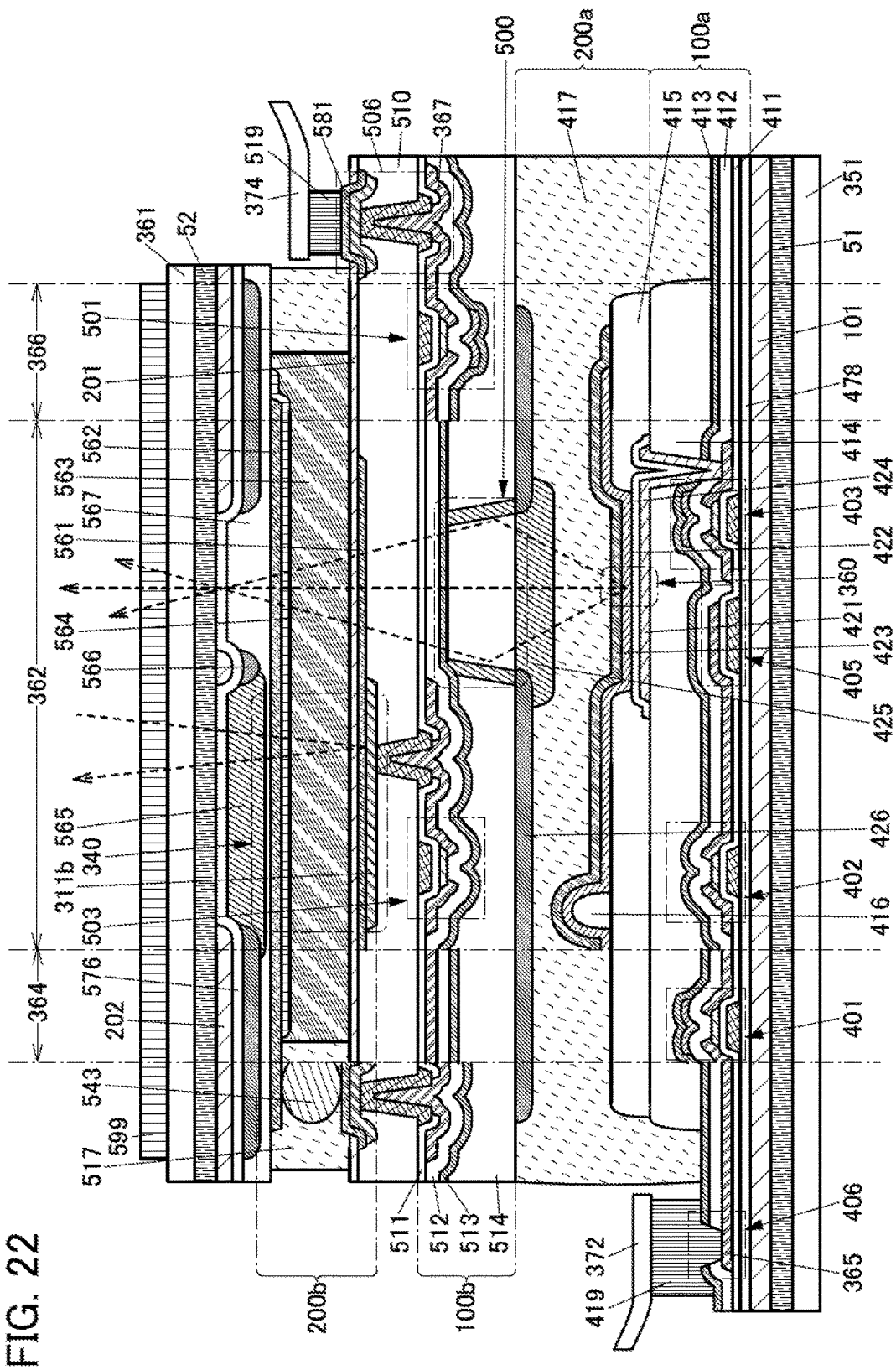
FIG. 22 illustrates a structure example of a display device of Embodiment.

FIG. 22 is different from FIG. 21 in the structures of transistors and the resin layer 202 and in that a coloring layer 565, a light-blocking layer 566, and an insulating layer 567 are provided.

The transistors 401, 403, and 501 illustrated in FIG. 22 each include a second gate electrode. In this manner, a transistor including a pair of gates is preferably used as each of the transistors provided in the circuit portion 364 and the circuit portion 366, the transistor that controls current flowing to the light-emitting element 360, and the like.

In the resin layer 202, an opening overlapping with the liquid crystal element 340 and an opening overlapping with the light-emitting element 360 are separately formed, whereby the reflectance of the liquid crystal element 340 can be increased.

The light-blocking layer 566 and the coloring layer 565 are provided on a surface of the insulating layer 576 on the liquid crystal element 340 side. The coloring layer 565 is provided so as to overlap with the liquid crystal element 340. Thus, the element layer 200b can perform color display. The light-blocking layer 566 has an opening overlapping with the liquid crystal element 340 and an opening overlapping with the light-emitting element 360. This allows fabrication of a display device that suppresses mixing of colors between adjacent pixels and thus has high color reproducibility.

Modification Example 2 of Cross-Sectional Structure Example

Figure 23:
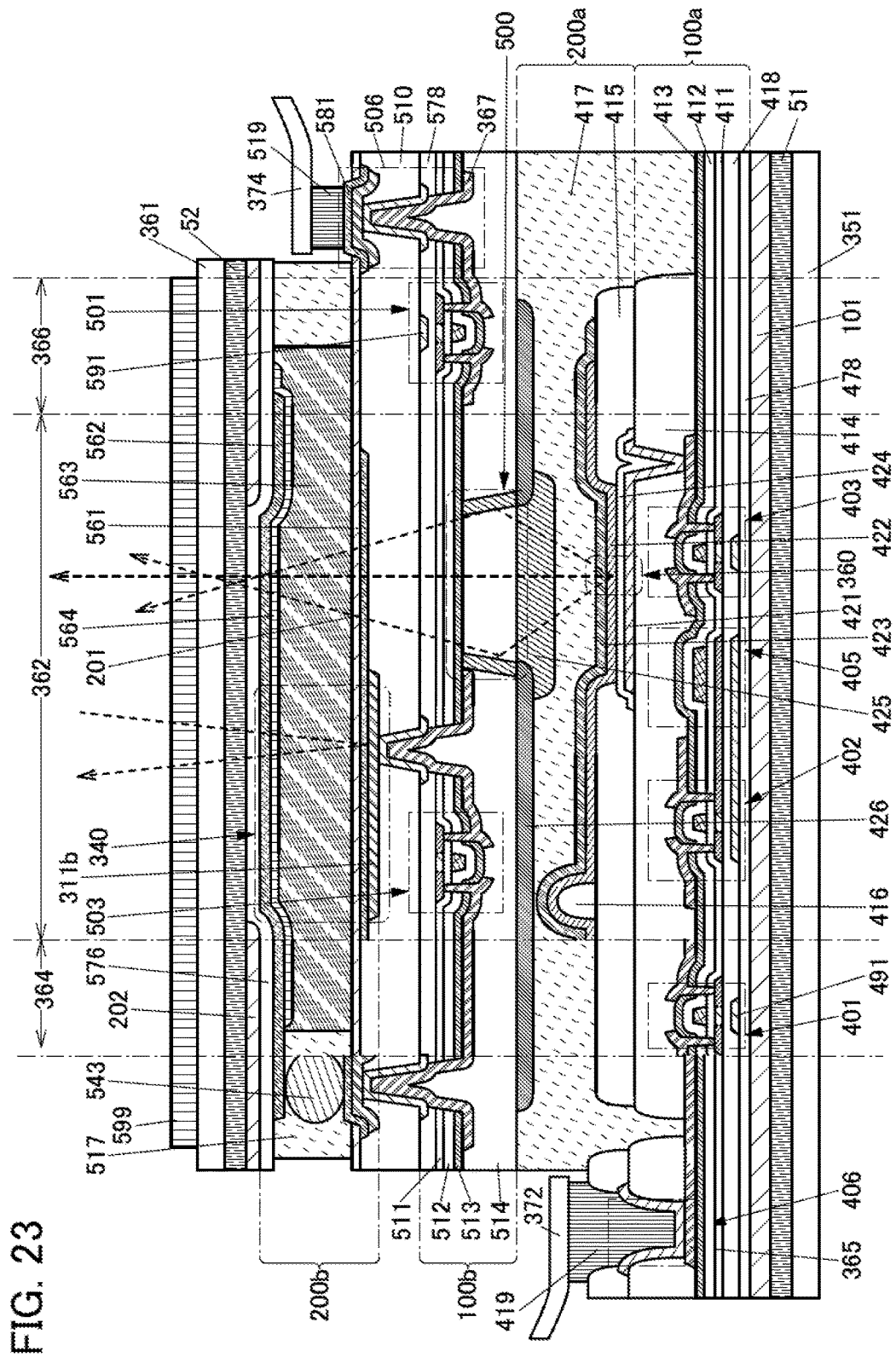
FIG. 23 illustrates a structure example of a display device of Embodiment.

FIG. 23 illustrates an example in which a top-gate transistor is used as each transistor. The use of a top-gate transistor can reduce parasitic capacitance, leading to an increase in the frame frequency of display. Furthermore, a top-gate transistor can favorably be used for a large display panel with a size of 8 inches or more, for example.

FIG. 23 shows an example where a top-gate transistor including a second gate electrode is used as the transistors 401, 402, 403, and 501.

The transistors on the element layer 100a side include a conductive layer 491 over the insulating layer 478. An insulating layer 418 is provided to cover the conductive layer 491. The transistors on the element layer 100b side include a conductive layer 591 over the insulating layer 510. An insulating layer 578 is provided to cover the conductive layer 591.

The above is the description of the modification examples.

At least part of this embodiment can be implemented in appropriate combination with any of the other embodiments described in this specification.

Embodiment 5

In this embodiment, a display module that can be fabricated using one embodiment of the present invention will be described.

Figure 24:
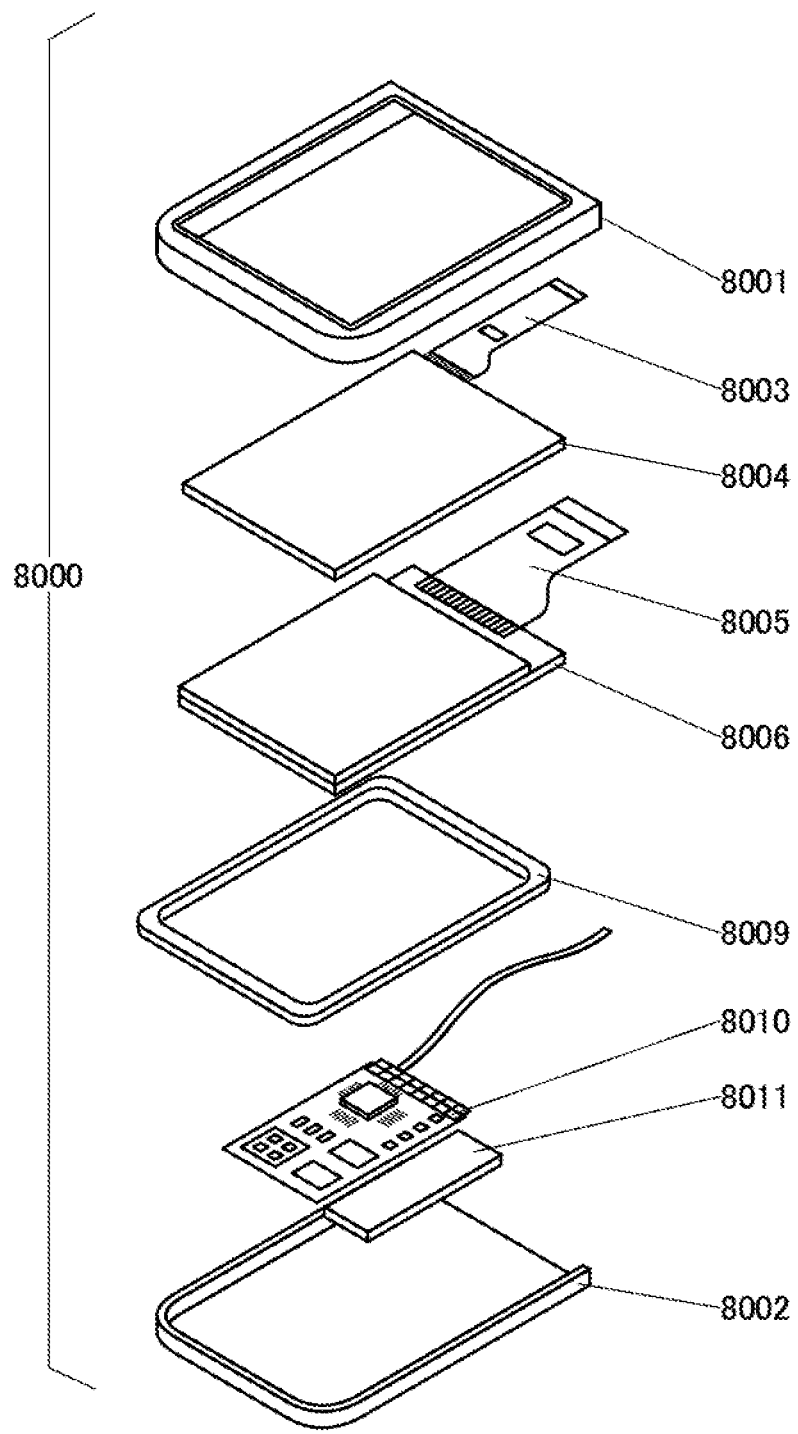
FIG. 24 illustrates a structure example of a display module of Embodiment.

In a display module 8000 in FIG. 24, a touch panel 8004 connected to an FPC 8003, a display panel 8006 connected to an FPC 8005, a frame 8009, a printed circuit board 8010, and a battery 8011 are provided between an upper cover 8001 and a lower cover 8002.

The display device fabricated using one embodiment of the present invention can be used for, for example, the display panel 8006.

The shapes and sizes of the upper cover 8001 and the lower cover 8002 can be changed as appropriate in accordance with the sizes of the touch panel 8004 and the display panel 8006.

The touch panel 8004 can be a resistive touch panel or a capacitive touch panel and may be formed to overlap with the display panel 8006. Instead of providing the touch panel 8004, the display panel 8006 can have a touch panel function.

The frame 8009 protects the display panel 8006 and functions as an electromagnetic shield for blocking electromagnetic waves generated by the operation of the printed circuit board 8010. The frame 8009 may also function as a radiator plate.

The printed circuit board 8010 has a power supply circuit and a signal processing circuit for outputting a video signal and a clock signal. As a power source for supplying power to the power supply circuit, an external commercial power source or a power source using the battery 8011 provided separately may be used. The battery 8011 can be omitted in the case of using a commercial power source.

The display module 8000 may be additionally provided with a member such as a polarizing plate, a retardation plate, or a prism sheet.

At least part of this embodiment can be implemented in appropriate combination with any of the other embodiments described in this specification.

Embodiment 6

In this embodiment, electronic devices to which the display device of one embodiment of the present invention can be applied will be described.

The display device of one embodiment of the present invention can achieve high visibility regardless of the intensity of external light. For this reason, the display device can be used for portable electronic devices, wearable electronic devices (wearable devices), e-book readers, and the like.

Figure 25A:
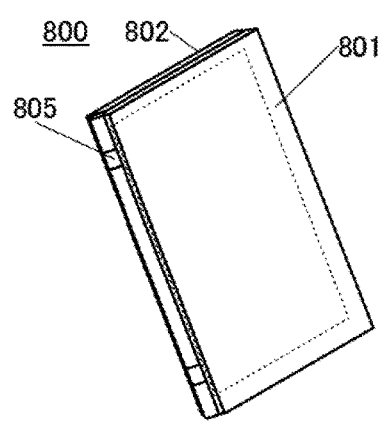
FIGS. 25A to 25D illustrate electronic devices of Embodiment.
Figure 25B:
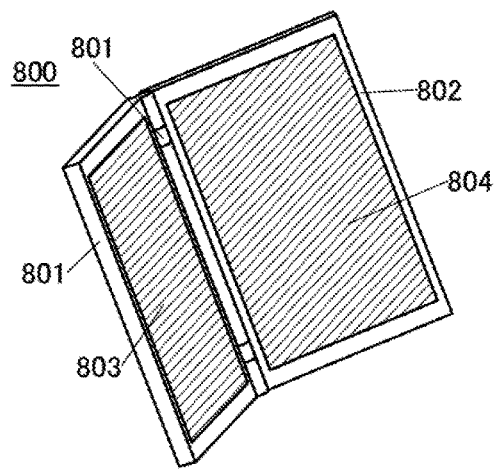

FIGS. 25A and 25B illustrate an example of a portable information terminal 800. The portable information terminal 800 includes a housing 801, a housing 802, a display portion 803, a display portion 804, and a hinge 805, for example.

The housing 801 and the housing 802 are joined together with the hinge 805. The portable information terminal 800 can be changed from a folded state illustrated in FIG. 25A to an opened state illustrated in FIG. 25B.

For example, text information can be displayed on the display portions 803 and 804; thus, the portable information terminal can be used as an e-book reader. Furthermore, still images and moving images can be displayed on the display portions 803 and 804.

The portable information terminal 800 can be folded when being carried, and thus has general versatility.

Note that the housings 801 and 802 may have a power button, an operation button, an external connection port, a speaker, a microphone, and the like.

Figure 25C:
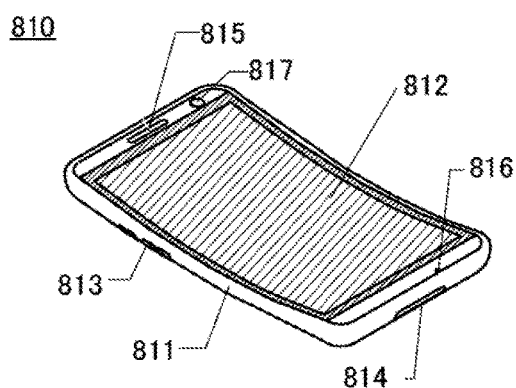

FIG. 25C illustrates an example of a portable information terminal. A portable information terminal 810 illustrated in FIG. 25C includes a housing 811, a display portion 812, operation buttons 813, an external connection port 814, a speaker 815, a microphone 816, a camera 817, and the like.

The display portion 812 is provided with the display device of one embodiment of the present invention.

The portable information terminal 810 includes a touch sensor in the display portion 812. Operations such as making a call and inputting a letter can be performed by touch on the display portion 812 with a finger, a stylus, or the like.

With the operation buttons 813, power on/off can be switched and types of images displayed on the display portion 812 can be switched. For example, images can be switched from a mail creation screen to a main menu screen.

When a detection device such as a gyroscope sensor or an acceleration sensor is provided inside the portable information terminal 810, the direction of display on the screen of the display portion 812 can be automatically changed by determining the orientation of the portable information terminal 810 (whether the portable information terminal 810 is placed horizontally or vertically for a landscape mode or a portrait mode). The direction of display on the screen can also be changed by touch on the display portion 812, operation with the operation buttons 813, sound input using the microphone 816, or the like.

The portable information terminal 810 has one or more of a telephone function, a notebook function, an information browsing function, and the like. Specifically, the portable information terminal 810 can be used as a smartphone. The portable information terminal 810 is capable of executing a variety of applications such as mobile phone calls, e-mailing, viewing and editing texts, music reproduction, video replay, Internet communication, and games.

Figure 25D:
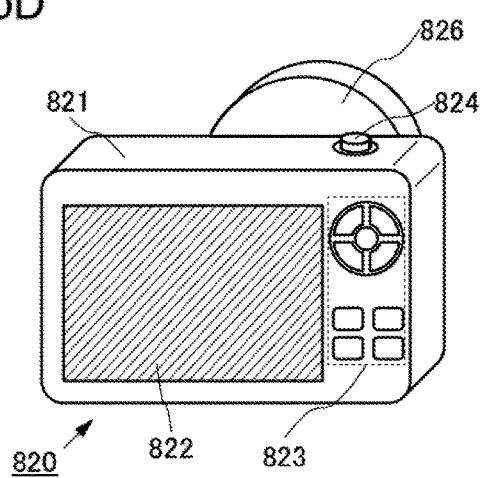

FIG. 25D illustrates an example of a camera. A camera 820 includes a housing 821, a display portion 822, operation buttons 823, a shutter button 824, and the like. The camera 820 is provided with an attachable lens 826.

The display portion 822 is provided with the display device of one embodiment of the present invention.

Although the lens 826 of the camera 820 here is detachable from the housing 821 for replacement, the lens 826 may be integrated with the housing 821.

Still images or moving images can be taken with the camera 820 by pushing the shutter button 824. In addition, images can be taken by a touch on the display portion 822 that serves as a touch panel.

Note that a stroboscope, a viewfinder, or the like can be additionally provided in the camera 820. Alternatively, these can be incorporated in the housing 821.

At least part of this embodiment can be implemented in appropriate combination with any of the other embodiments described in this specification.

This application is based on Japanese Patent Application Serial No. 2016-154189 filed with Japan Patent Office on Aug. 5, 2016, the entire contents of which are hereby incorporated by reference.

What is claimed is:

1. A display device comprising:
   a first substrate;
   a first transistor comprising an oxide semiconductor layer, a source electrode, and a drain electrode over the first substrate;
   a light-emitting element comprising a first conductive layer electrically connected to one of the source electrode and the drain electrode, an EL layer over the first conductive layer, and a second conductive layer over the EL layer;
   a light-condensing means over the second conductive layer;
   a light-blocking layer over the second conductive layer;
   a third conductive layer over the light-blocking layer;
   a fourth conductive layer over and in contact with the third conductive layer; and
   a second substrate over the fourth conductive layer,
   wherein the third conductive layer is configured to reflect visible light,
   wherein the fourth conductive layer is configured to transmit visible light,
   wherein light from the light-emitting element is extracted to a second substrate side, and
   wherein the light from the light-emitting element is condensed by the light-condensing means.

2. The display device according to claim 1, wherein the light-condensing means comprises a first insulating layer and a second insulating layer covering a side surface of the first insulating layer.

3. The display device according to claim 2,
   wherein the first insulating layer comprises SiC, $TiO_2$, ZnS, $CeO_2$, or an indium tin oxide, and
   wherein the second insulating layer comprises silicon oxide, $CaF_2$, $MgF_2$, acrylic, or a fluorine resin.

4. The display device according to claim 1, wherein the light-condensing means includes an insulating layer and a metal film covering a side surface of the insulating layer.

5. The display device according to claim 1, further comprising a coloring layer in contact with a bottom surface of the light-condensing means.

6. The display device according to claim 1, wherein the light-condensing means has a tapered shape.

7. The display device according to claim 1, further comprising:
   a second transistor electrically connected to the third conductive layer;
   a liquid crystal over the fourth conductive layer; and
   a fifth conductive layer over the liquid crystal.

8. A display device comprising:
   a first substrate;
   a first transistor comprising a semiconductor layer, a source electrode, and a drain electrode over the first substrate;
   a light-emitting element comprising a first conductive layer electrically connected to one of the source electrode and the drain electrode, an EL layer over the first conductive layer, and a second conductive layer over the EL layer;
   a first insulating layer over the second conductive layer;

a second insulating layer over the second conductive layer, the second insulating layer covering a side surface of the first insulating layer;

a light-blocking layer over the second conductive layer;

a third conductive layer over the light-blocking layer;

a fourth conductive layer over and in contact with the third conductive layer; and a second substrate over the fourth conductive layer, wherein the third conductive layer is configured to reflect visible light, wherein the fourth conductive layer is configured to transmit visible light, wherein light from the light-emitting element is extracted to a second substrate side, and wherein the first insulating layer and the second insulating layer are configured to condense the light from the light-emitting element.

9. The display device according to claim 8, further comprising:

a second transistor electrically connected to the third conductive layer;

a liquid crystal over the fourth conductive layer; and a fifth conductive layer over the liquid crystal.

* * * * *